United States Patent [19]
Yamamoto et al.

[11] Patent Number: 5,627,345
[45] Date of Patent: May 6, 1997

[54] MULTILEVEL INTERCONNECT STRUCTURE

[75] Inventors: Hiroshi Yamamoto; Tomohiro Ohta; Nobuyuki Takeyasu, all of Chiba, Japan

[73] Assignee: Kawasaki Steel Corporation, Kobe, Japan

[21] Appl. No.: 198,788

[22] Filed: Feb. 18, 1994

Related U.S. Application Data

[63] Continuation-in-part of Ser. No. 965,780, Oct. 23, 1992, Pat. No. 5,305,519.

[30] Foreign Application Priority Data

Oct. 24, 1991 [JP] Japan ................................. 3-277803
Oct. 20, 1992 [JP] Japan ................................. 4-281802

[51] Int. Cl.⁶ ...................... H05K 1/09; H05K 1/14
[52] U.S. Cl. ................ 174/265; 174/264; 174/262; 174/257
[58] Field of Search ..................... 174/262, 264, 174/265, 266, 250, 261, 267, 256

[56] References Cited

U.S. PATENT DOCUMENTS

| | | | |
|---|---|---|---|
| 3,335,489 | 8/1967 | Grant | 174/265 |
| 4,121,241 | 10/1978 | Drake et al. | |
| 4,172,004 | 10/1979 | Alcorn et al. | |
| 4,410,622 | 10/1983 | Dalal et al. | |
| 4,566,897 | 1/1986 | Yorikane et al. | 357/71 |
| 4,614,021 | 9/1986 | Hulseweh | |
| 4,721,689 | 1/1988 | Chaloux, Jr. et al. | |
| 4,824,802 | 4/1989 | Brown et al. | |
| 4,944,836 | 7/1990 | Beyer et al. | 156/645 |
| 4,956,313 | 9/1990 | Cote et al. | 437/203 |
| 5,151,305 | 9/1992 | Matsumoto et al. | 427/252 |
| 5,154,949 | 10/1992 | Shindo et al. | 427/257 |
| 5,155,576 | 10/1992 | Mizushima | |
| 5,179,042 | 1/1993 | Mikoshiba et al. | 437/187 |
| 5,209,816 | 5/1993 | Yu et al. | 156/636 |
| 5,219,639 | 6/1993 | Sugawara et al. | 428/209 |
| 5,229,257 | 7/1993 | Cronin et al. | |
| 5,229,549 | 7/1993 | Yamakawa et al. | 174/262 |
| 5,414,222 | 5/1995 | Sen et al. | 174/262 |
| 5,418,187 | 5/1995 | Miyanaga et al. | |
| 5,429,995 | 7/1995 | Nishiyama et al. | |
| 5,436,412 | 7/1995 | Ahmad et al. | 174/265 |
| 5,440,075 | 8/1995 | Kawakita et al. | 174/265 |
| 5,478,972 | 12/1995 | Mizutani et al. | 174/250 |
| 5,486,492 | 1/1996 | Yamamoto et al. | |

FOREIGN PATENT DOCUMENTS

| | | |
|---|---|---|
| 1216964 | 1/1967 | Canada . |
| 0420594 | 4/1991 | European Pat. Off. . |
| 434645 | 6/1991 | European Pat. Off. . |
| 61-85844 | 5/1986 | Japan . |
| 61-237452 | 10/1986 | Japan . |
| 62-105422 | 5/1987 | Japan . |
| 2-12859 | 1/1990 | Japan . |
| 4-25157 | 1/1992 | Japan . |
| 5-251566 | 9/1993 | Japan . |

OTHER PUBLICATIONS

"A Highly Reliable Sub–Half–Micron Via and Interconnect Technology Using Al Alloy High–Temperature Sputter Filling", Hiroshi Nishimura et al., 1992 Symposium on VLSI Technology Digest of Technical Papers, pp. 74–75, 1992 IEEE.

(List continued on next page.)

Primary Examiner—Laura Thomas
Attorney, Agent, or Firm—Oliff & Berridge

[57] ABSTRACT

A multilevel interconnect structure for use in a semiconductor device includes a lower metal wiring having an aluminum or aluminum alloy film and a high melting point metal or high melting point metal alloy film. An interlayer insulating film is deposited on the lower metal wiring and a via hole is formed in the interlayer insulating film. A plug made of aluminum or aluminum alloy is formed in the via hole. An upper metal wiring has an aluminum or aluminum alloy film and a high melting point metal or high melting point metal alloy film. The plug directly contacts the aluminum or aluminum alloy film of at least one of the lower and upper metal wirings to decrease the via resistance without reducing the electromigration reliability.

92 Claims, 31 Drawing Sheets

OTHER PUBLICATIONS

"Reliable Submicron Vias Using Aluminum Alloy High Temperature Sputter Filling" Hiroshi Nishimura et al., Jun. 11–12, 1991 VMIC Conference, pp. 170–176, 1991 IEEE.

Proceedings of ECS Symposia, vol. 89–6 pp. 26–38, 1989 Stress Induced Migration of Aluminum–Silicon Films: Influencing Factors and Countermeasures.

Reprint from Proceedings of the IEDM—Dec. 6–9, 1987, pp. 205–208 Reliable Tungsten Encapsulated Al—Si Interconnects for Submicron Multilevel Interconnect.

VMIC Conference, Jun. 12–13, 1990, pp. 42–48 A High Performance Four Metal Layer Interconnect System for Bipolar and BiCMOS Circuits.

VMIC Conference, Jun. 12–13, 1990, pp. 21–27 An Advanced Four Level Interconnect Enhancement Module for 0.9 Micron CMOS.

VMIC Conference, Jun. 12–13, 1990, pp. 106–111 Electromigration in a Two–Level Al—Cu Interconnection with W Studs.

IEEE Transactions on Electron Devices, vol. 37, No. 3, Mar. 1990, pp. 562–567 Electromigration Reliability for a Tungsten–Filled Via Hole Structure.

Abstract of a Paper by J. Onoe and H. Yamamato in Proc. Workshop, 6th Meeting, 1969, pp. 325–32, Ed. by S. Wong & F. Furukawa, Mater. Res. Sec., Pittsburgh, PA 1990.

IEEE Electronic Device Letters, vol. EDL–8 No. 2, Feb. 1987, pp. 76–78, by R. Mukai et al.

Enver et al., 1990 IEEE VLSI Multilevel Interconnection Conference, p. 149 (Jun. 12, 1990); Digital Equipment Corporation.

Katto et al., ECS Symposia, vol. 89–6 p. 26 (Oct. 9, 1988); Hitachi.

Kwok et al. 1990 IEEE VSLI Multilevel Interconnection Conference, p. 106 (Jun. 12, 1990); IBM.

Yamamoto et al. 1987 International Electron Device Meeting, p. 205 (Dec. 6, 1987); Matsushita.

Wilson et al., 1990 Symposium on VLSI Technology, p. 3 (Jun. 4, 1990); NEC.

Mtsuoka et al., IEEE Transaction on Electron Devices, vol. 37(3), p. 562, 1990 (Mar. 90); Toshiba.

Bollinger et al., 1990 IEEE VLSI Multilevel Interconnection Conference, p. 21 (Jun. 12, 1990); AT & T.

Homma et al., 1990 Symposium on VLSI Technology, p. 3 (Jun. 4, 1990); NEC.

Joshi et al., 1993 International Conference on Solid Waster Devices and Materials, p. 164 (Aug. 29, 1993); IBM.

Nishimura et al., 1993 International Electron Device Meeting, p. 281 (Dec. 5, 1993); Matsushita.

Amazawa et al., 1991 International Electron Device Meeting, p. 265 (Dec. 9, 1991); NTT.

Chen et al., 1990 International Electron Device Meeting, pp. 90–51 to 90–54.

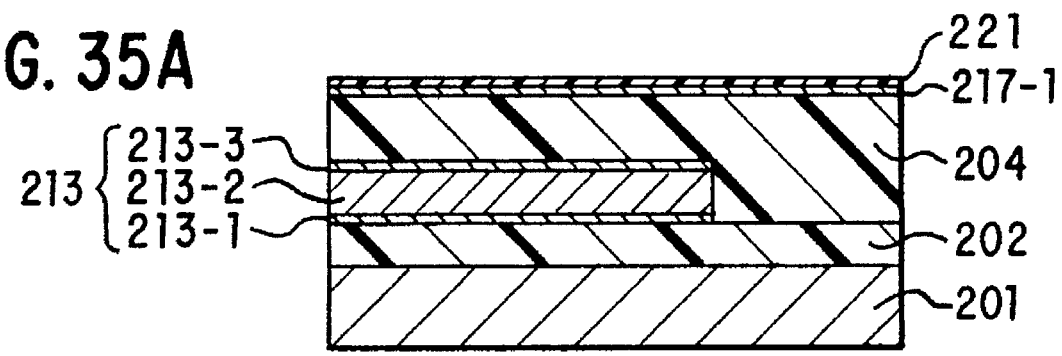
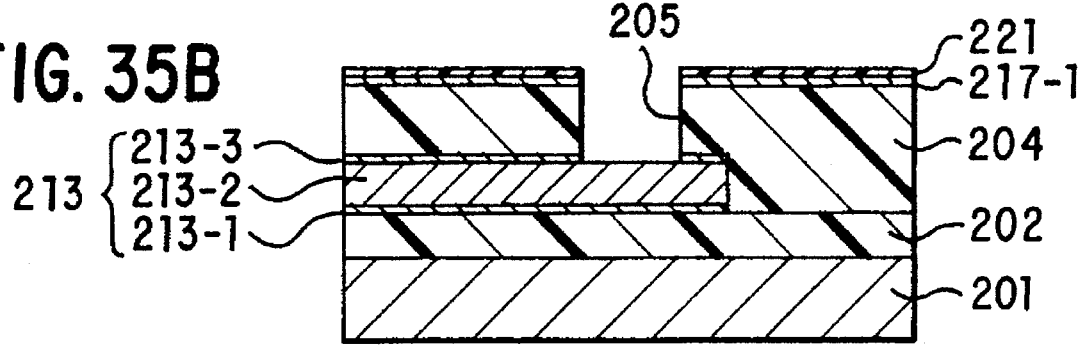
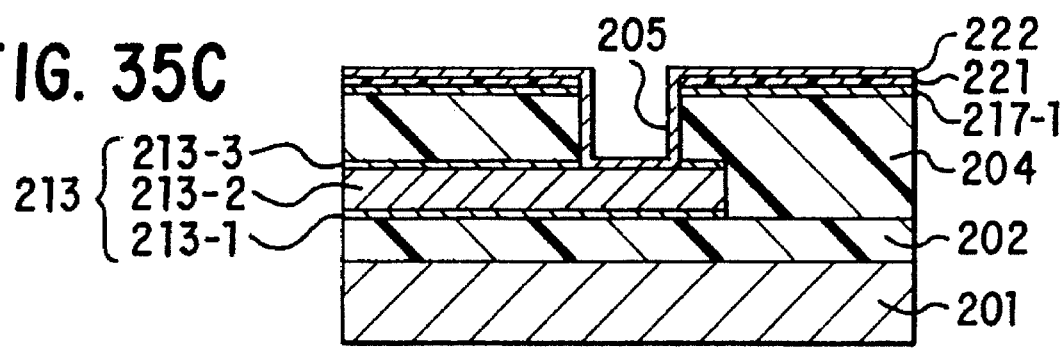

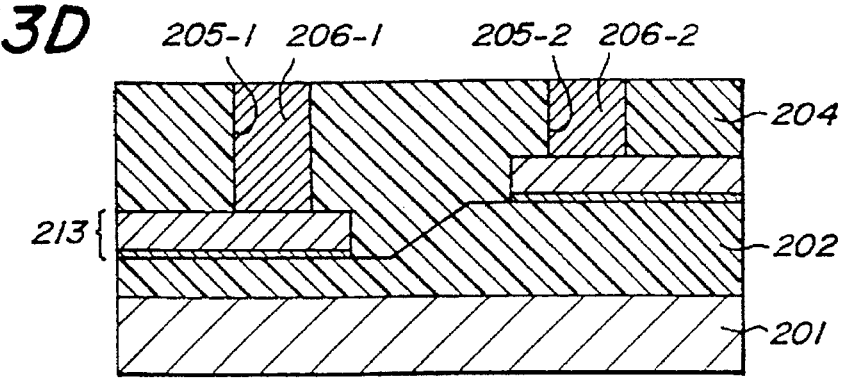
FIG_43D
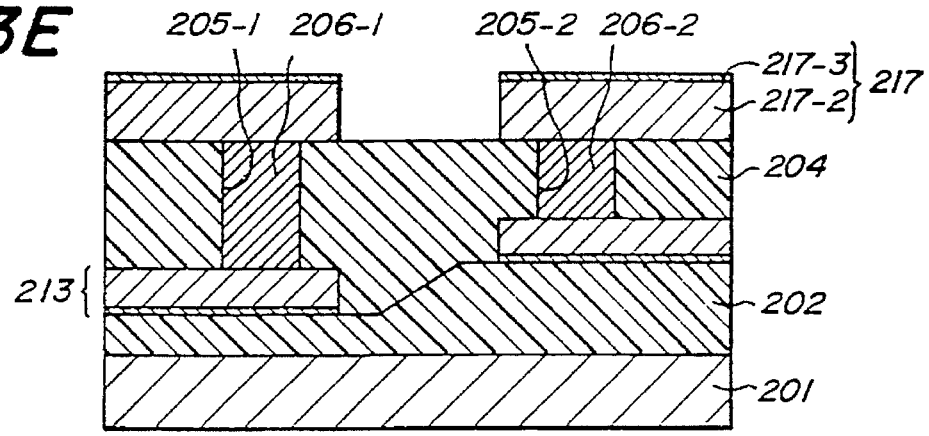
FIG_43E

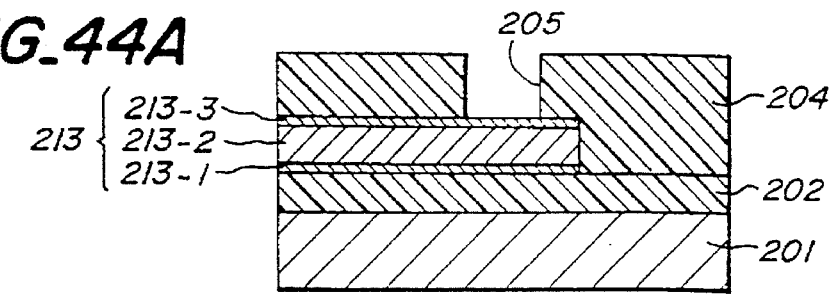
FIG._44A
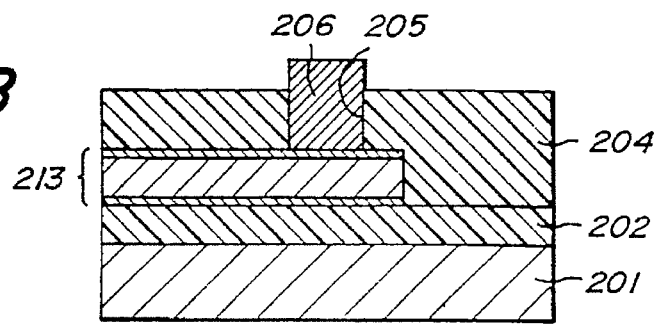
FIG._44B
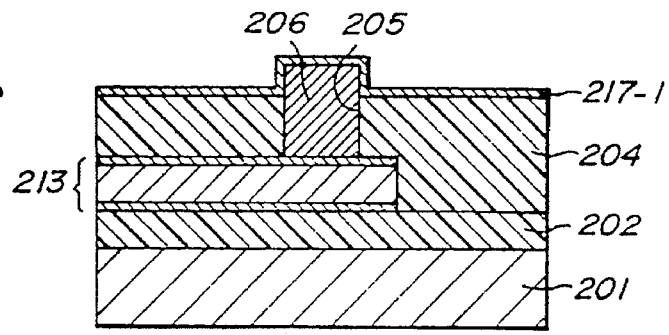
FIG._44C
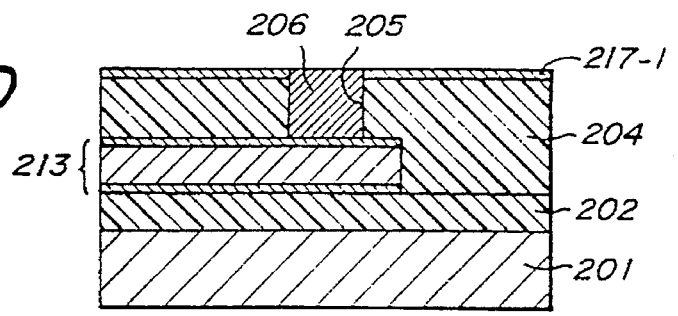
FIG._44D
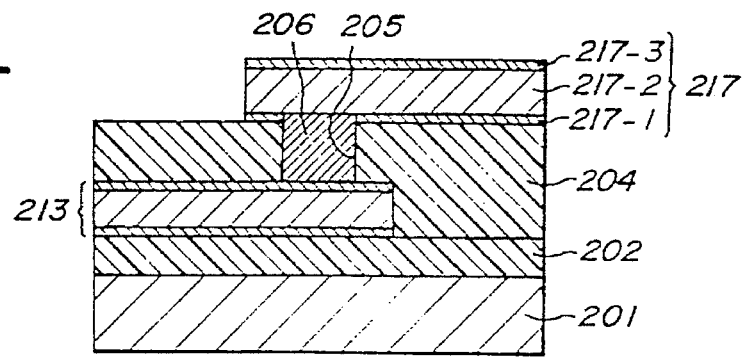
FIG._44E

MULTILEVEL INTERCONNECT STRUCTURE

This application is a continuation-in-part of the application Ser. No. 07/965,780 filed Oct. 23, 1992, now U.S. Pat. No. 5,305,519.

BACKGROUND OF THE INVENTION

1. Field of the Invention

The present invention relates to a multilevel interconnect structure for use in a semiconductor device and more particularly relates to a multilevel interconnect structure in which upper and lower level metal wirings are interconnected by means of a plug provided in a via hole formed in an interlayer insulating layer arranged between the upper and lower metal wirings, said plug forming a current path from which an undesired interface between different kinds of metals are removed so that a reliability of the semiconductor device is improved.

The present invention also relates to a method of manufacturing the above mentioned multilevel interconnect structure for use in a semiconductor device.

2. Related Art Statements

Heretofore, in an LSI having a design rule larger than about 1 µm, a metal wiring pattern of a multilevel interconnect structure has been formed by selectively etching a single aluminum or aluminum alloy film into a desired pattern. Further, in order to form an interconnection between lower and upper metal wirings, an interlayer insulating film is formed on the lower metal wiring, a via hole is formed in the interlayer insulating film, and then a metal film is deposited in the via hole as well as on the interlayer insulating film. After that the metal film is selectively etched into a desired pattern to form the upper metal wiring.

In accordance with the progress in the miniaturization of the semiconductor device, the design rule of LSI has been made smaller than 1 µm. Then, in the known multilevel interconnect structure metal formed in the manner mentioned above, the reliability of the device might be decreased due to the stressmigration. In order remove such a problem, there have been proposed several techniques. For instance, in K. Kato and S. Shimizu, Proceedings of ECS Symposia, Vol. 89-6, p. 26, 1989 (reference 1), there is described a method of manufacturing the multilevel interconnect structure, in which a metal wiring pattern is formed by selectively etching a stack of at least one aluminum alloy film and at least one high melting point metal alloy film such as TiW, TiN and MoSix. Further, H. Yamamoto, S. Fujii, T. Kakiuchi, K. Yano and T. Fujita reported in Technical Digest of International Electron Device Meeting, Washington D.C., December 6–9, p. 205, 1987 (reference 2) has proposed another known method of manufacturing the multilevel interconnect structure. In this known method, after an aluminum alloy film is shaped into a desired pattern, upper surface and side wall of the aluminum alloy film pattern are covered with a high melting point metal film such as W film. The multilevel interconnect structure formed by this known method has been proved to have a high reliability, and thus this technique has been considered to be essential for realizing LSI having the design rule smaller than about 0.8 µm.

In the known methods which have been used for manufacturing multilevel interconnect structures for use in LSI having the design rule larger than about 1 µm, it is difficult to obtain a good interconnection between the lower and upper metal wirings and thus the yield and reliability of the semiconductor device might be decreased. That is to say, the upper metal wiring is generally formed by the sputtering which has a poor step coverage, and therefore the thickness of the metal film deposited on the inner wall of the via hole is liable to be thin and the interconnection might be broken at this point.

In S. R. Wilson et al, Proceeding of the Seventh International IEEE VLSI Multilevel Interconnection Conference, p. 42, 1990 (reference 3), there is disclosed another known method of forming the multilevel interconnection structure, in which the via hole is formed to have a trapezoidal cross sectional configuration and the step coverage of an aluminum alloy film constituting the upper metal wiring is improved by controlling the substrate temperature during the deposition of the aluminum alloy. However, such a technique could not be practically applied to LSI having the design rule smaller than about 0.6 µm.

In view of the above, for LSI having the design rule smaller than about 0.6 µm, a method in which at first the via hole is filled with the metal plug to form a flat surface and then the upper metal film is formed on this flat surface has been considered to be a major method. In the above mentioned reference 3, there is described a known method, in which a plug is formed by selectively depositing tungsten in the via hole by means of a selective CVD method. Further, in C. A. Bollinger et al, Proceeding of the Seventh International IEEE VLSI Multilevel Interconnection Conference, p. 21, 1990 (reference 4), there is proposed another known method of forming the plug in the via hole. In this known method, a barrier metal film such as TiW film is deposited in the via hole as well as on the interlayer insulating film, a W film is formed on the whole surface of the TiW film, and then a portion of the W film on the interlayer insulating film is selectively removed.

FIG. 1 is a cross sectional view showing the known multilevel interconnect structure for use in LSI having the design rule smaller than about 0.6 µm. On a silicon substrate 101 there is deposited an underlaying insulating film 102. A lower metal wiring 103 is consisting of an aluminum alloy film 103-2 and a TiW film 103-3 and an upper metal wiring 107 is consisting of an aluminum alloy film 107-1 and a TiW film 107-2. Such a multilevel interconnect structure has a sufficient reliability for use in LSI having the design rule smaller than 0.6 µm. The lower and upper metal wirings 103 and 107 are physically and electrically isolated by an interlayer insulating film 104 and a via hole 105 is formed in the insulating film 104. In the via hole 105 there is formed a plug 108 made of tungsten. In this manner, the multilevel interconnection structure which could be effectively used for LSI having the design rule smaller than 0.6 µm can be obtained.

FIGS. 2A to 2E are cross sectional views illustrating successive steps of a known method for manufacturing the known multilevel interconnection structure shown in FIG. 1.

As shown in FIG. 2A, on a silicon substrate 101 there has been formed an underlaying insulating film 102. On the insulating film 102 there is formed an aluminum alloy film 103-2 having a thickness of 300 to 800 nm by means of sputtering. On the aluminum alloy film 103-2 there is further formed a TiW film 103-3 having a thickness of 20 to 100 nm also by means of sputtering.

Next, as illustrated in FIG. 2B, a stack of the aluminum alloy film 103-2 and TiW film 103-3 is shaped into a desired pattern to form a lower metal wiring 103. Then, an interlayer insulating film 104 is formed on the lower metal wiring 103 as well as on the exposed underlaying insulating film 102.

The interlayer insulating film 104 may be formed by a combination of a SiO$_2$ film deposited by, for instance plasma CVD method and a spin-on-glass film (SOG film). Next, in the interlayer insulating film 104 there is formed a via hole 105 as depicted in FIG. 2C, and then CVD process is carried out in an atmosphere including, for instance WF6 and SiH4 to deposit a tungsten selectively in the via hole to form a tungsten plug 108 in the via hole 105. This condition is shown in FIG. 2D.

Finally an aluminum alloy film 107-1 having a thickness of 400 to 1000 nm is formed by, for instance sputtering and then a TiW film 107-2 having a thickness of 20 to 100 nm is formed also by sputtering. Then, a stack of the aluminum alloy film 107-1 and TiW film 107-2 is selectively etched in accordance with a given pattern to form an upper metal wiring 107 as shown in FIG. 2E.

In the known multilevel interconnect structure shown in FIG. 1, two interfaces between different kinds of metals are provided in a current path between the lower metal wiring 103 and the plug 108. That is to say, there are formed a first interface between the aluminum alloy film 103-2 and the TiW film 103-2, a second interface between the TiW film 103-3 and the tungsten plug 108, and a third interface between the tungsten plug 108 and the aluminum alloy film 107-1. The existence of these interfaces between different kinds of metals results in the deterioration in the electrical property of the multilevel interconnection. For example, the via contact resistance becomes higher than the case in which the interconnection is performed by the contacts between the same kinds of metal such as aluminum alloy-aluminum alloy. This has been described in the above mentioned reference 3.

The reliability of the via interconnection in the above explained known multilevel interconnect structure can be really improved due to the fact that the upper metal wiring 107 is formed by depositing the metal film on the flat surface which is realized by filling the via hole 105 with the metal of the plug 108, and therefore the breakage of the interconnection due to the decrease in the thickness of the upper wiring metal film on the side wall of the via hole can be prevented as compared with the case in which the plug is not used. This has been described in F. Matsuoka et al, IEEE Transactions on Electron Devices, Vol. 37, No. 3, p. 562, 1990 (reference 5). However, as described in T. Kwok et al, Proceeding of the Seventh International IEEE VLSI Multi-level Interconnection Conference, p. 106, 1990 (reference 6), when the interface between different kinds of metals is provided in the current path, there is produced a discontinuity in the movement of carrier substances in the metal wiring, so that the electromigration reliability might be decreased to a large extent as compared with the metal wiring formed on a flat substrate. That is to say, when it is assumed that a current flows from the lower metal wiring to the upper metal wiring, the movement of aluminum atoms which is caused by an electron flow passing through the aluminum alloy film 107-1 in the upper metal wiring 107 is prevented by the interface between the aluminum alloy film 107-1 and the tungsten plug 108. Therefore, the aluminum atoms are stored in the upper metal wiring 107, so that a hillock 109 is formed in the upper metal wiring near the via hole 105. The hillock might produce a breakage of the TiW film 107-2 of the upper metal wiring 107. At the same time, a void 110 might be formed in the lower metal wiring 103 in the vicinity of the via hole 105 as shown in FIG. 3. This is due to the fact that aluminum atoms in the aluminum alloy film 103-2 in the lower metal wiring 103 are moved by the electron flow although the supply of aluminum atoms from the upper metal wiring 107 is prevented by the interface between the aluminum alloy film 107-1 and the W plug 108. These hillock 109 and void 110 might cause the shortcircuit and breakage of the interconnection between the lower and upper metal wirings 103 and 107 and might increase the resistance of the interconnection.

Similarly the interface between metals of different kinds produces the discontinuity in the movement of impurities such as Si and Cu added in the aluminum alloy film and the concentration of the impurity becomes non-uniform. For instance, in the above mentioned reference 5 there is described that the resistance of the via contact is increased by the discontinuity in the movement of Si atoms. Further in the reference 6, there is explained that when the concentration of Cu atoms is locally decreased at a portion near the via connection, the electromigration reliability might be decreased at such a portion.

As explained above, in LSI having the design rule smaller than about 0.5 μm, the known multilevel interconnect structure shown in FIG. 1 could not be utilized, because the operation speed of the semiconductor device is limited due to the increase in the via contact resistance and the reliability of the device is decreased by the electromigration.

In U.S. Pat. No. 5,154,949 issued on Oct. 13, 1992 (reference 7) and corresponding EP Application 0 420 594 A2 published on Apr. 3, 1991 (reference 8), there is disclosed a method of depositing an aluminum film by CVD using alkyl aluminum hydrides. In FIGS. 4A to 4E of this reference, there are shown a process for forming source and drain electrodes for a field effect transistor. In U.S. Pat. No. 5,151,305 issued on Sep. 29, 1992 (reference 9), there is described another method, in which a first aluminum film is selectively formed by a selective Al-CVD using alkyl aluminum hydrides, and then a second aluminum film is formed on the first aluminum film by sputtering or CVD. However, these references do not state or suggest the formation of plugs in the multilevel interconnect structure.

Furthermore, in LSI a thickness of the interlayer insulating film is not uniform, but fluctuates over the whole surface. Then, a depth of via holes formed in such an interlayer insulating film varies in accordance with positions of the via holes. For instance, when a via hole is formed in a thick portion of the interlayer insulating film, a depth of this via hole becomes large. In this manner, there are formed a number of via holes having different thicknesses. Then, it would be difficult to form plugs such that the via holes are sufficiently filled with the plugs. That is to say, when the plugs are formed such that the deepest via hole is embedded with a plug, top portions of remaining plugs protrude the surface of the interlayer insulating film, and when the plugs are formed such that the most shallow via hole is just embedded with a plug, remaining via holes could not be fully filled with plugs. When the via holes are not sufficiently filled with the plugs, the via contact resistance is increased and the property of the semiconductor device is greatly decreased.

SUMMARY OF THE INVENTION

The present invention has for its object to provide a useful and novel multilevel interconnect structure which can be advantageously used for a fine semiconductor device having a design rule smaller than about 0.5 μm without causing the undesired decrease in the operation speed and electromigration reliability.

According to the invention, a multilevel interconnect structure for use in a semiconductor device comprises:

a lower metal wiring including at least one aluminum or aluminum alloy film;

an upper metal wiring including at least one aluminum or aluminum alloy film;

an interlayer insulating film formed between said lower and upper metal wirings such that the lower and upper metal wirings are electrically isolated from each other by said interlayer insulating film;

at least one via hole formed in said interlayer insulating film such that the lower and upper metal wirings are communicated with each other by means of said via hole; and a plug made of aluminum or aluminum alloy and formed in said via hole such that the plug is brought into contact with the lower and upper metal wirings;

wherein at least one of said lower and upper metal wirings comprises at least one high melting point metal or high melting point metal alloy film, and said plug is connected to at least one of the lower and upper metal wirings by means of interfaces of aluminum-aluminum, aluminum-aluminum alloy, or aluminum alloy-aluminum alloy.

In a preferable embodiment of the multilevel interconnect structure according to the invention, the plug is connected to both the lower and upper metal wirings by means of interfaces of aluminum-aluminum, aluminum-aluminum alloy or aluminum alloy-aluminum alloy.

In a preferable embodiment of the multilevel interconnect structure according to the invention, the lower metal wiring is formed by an aluminum or aluminum alloy film and a high melting point metal or high melting point metal alloy film such as TiW film and TiN film applied on said aluminum or aluminum alloy film and a lower end of said plug is directly contacted with the aluminum or aluminum alloy film of the lower metal wiring.

In another preferable embodiment of the multilevel interconnect structure according to the invention, the upper metal wiring is formed by a high melting point metal or high melting point metal alloy film and an aluminum or aluminum alloy film formed on said high melting point metal or high melting point metal alloy film and an upper end of said plug is directly contacted with the aluminum or aluminum alloy film of the lower metal wiring.

In another preferable embodiment of the multilevel interconnect structure according to the invention, the lower metal wiring is formed by an aluminum or aluminum alloy film and a high melting point metal or high melting point metal alloy film applied on said aluminum or aluminum alloy film and a lower end of said plug is directly contacted with the aluminum or aluminum alloy film of the lower metal wiring, while the upper metal wiring is formed by a high melting point metal or high melting point metal alloy film and an aluminum or aluminum alloy film formed on said high melting point metal or high melting point metal alloy film and an upper end of said plug is directly contacted with the aluminum or aluminum alloy film of the lower metal wiring.

In further preferable embodiment of the multilevel interconnect structure according to the invention, an inner wall of the via hole is also covered with the high melting point film.

In the multilevel interconnect structure according to the invention, at least one of the lower and upper metal wirings includes at least one aluminum or aluminum alloy film and at least one high melting point metal or high melting point metal alloy film, and thus the stressmigration reliability is improved. Further the plug is made of aluminum or aluminum alloy and is brought into contact with at least one of the upper and lower metal wirings via the aluminum-aluminum contact or aluminum-aluminum alloy contact or aluminum alloy-aluminum alloy contact, so that the number of the undesired interfaces between metals of different kinds can be made zero or reduced. Therefore, the increase in the via resistance can be avoided and the decrease in the electromigration reliability can be also prevented.

The present invention also relates to a method of manufacturing the multilevel interconnect structure reliably at a high yield.

According to the invention, a method of manufacturing a multilevel interconnect structure for use in a semiconductor device comprises the steps of:

forming a lower metal wiring having a given pattern on a semiconductor substrate, said lower metal wiring comprising at least one aluminum or aluminum alloy film;

forming a plug made of aluminum or aluminum alloy;

forming an interlayer insulating film on said lower metal wiring prior to or after the formation of said plug; and forming an upper metal wiring comprising a high melting point metal or high melting point metal alloy film and an aluminum or aluminum alloy film formed on said high melting point metal or high melting point metal alloy film such that an upper end of said plug is directly brought into contact with said aluminum or aluminum alloy film of the upper metal wiring.

According to another aspect of the invention, a method of manufacturing a multilevel interconnect structure for use in a semiconductor device comprises the steps of:

forming a lower metal wiring having a given pattern on a semiconductor substrate, said lower metal wiring comprising at least one aluminum or aluminum alloy film and at least one high melting point metal or high melting point metal alloy film formed on said aluminum or aluminum alloy film;

forming a plug made of aluminum or aluminum alloy such that a lower end of the plug is directly brought into contact with said aluminum or aluminum alloy film of the lower metal wiring;

forming an interlayer insulating film on said lower metal wiring prior to or after the formation of said plug; and forming an upper metal wiring comprising a high melting metal or high melting metal alloy film and an aluminum or aluminum alloy film formed on said high melting point metal or high melting point metal alloy film such that an upper end of said plug is brought into contact with said high melting point metal or high melting point metal alloy film of the upper metal wiring.

According to further aspect of the invention, a method of manufacturing a multilevel interconnect structure comprises the steps of:

forming a lower metal wiring having a given pattern on a semiconductor substrate;

forming at least two plugs whose upper level are different from each other;

forming an interlayer insulating film on said lower metal wiring prior to or after the formation of said plug;

removing a top portion of at least one plug; and forming an upper metal wiring on the interlayer insulating film such that said lower and upper metal wirings are electrically connected with each other by means of said plugs.

According to further aspect of the invention, a method of of manufacturing a multilevel interconnect structure for use in a semiconductor device comprises the steps of:

(a) forming a lower metal wiring on a wafer;

(b) forming an interlayer insulating film on the lower metal wiring;

(c) forming at least one via hole in the interlayer insulating film;

(d) cleaning the surface of the wafer;

(e) forming a plug within said via hole; and (f) forming an upper metal wiring on the plug as well as on the interlayer insulating film;

wherein said steps (d), (e) and (f) are carried out while the wafer is not exposed to the atmosphere.

BRIEF DESCRIPTION OF THE DRAWINGS

FIGS. 35A to 35F are cross sectional views showing successive steps of another embodiment of the method according to the invention for manufacturing the structure of FIG. 30;

FIGS. 43A to 43E are cross sectional views depicting successive steps of another embodiment of the method according to the invention for manufacturing the structure of FIG. 4; and FIGS. 44A to 44E are cross sectional views showing successive steps of another embodiment of the method according to the invention for forming the structure illustrated in FIG. 32.

DESCRIPTION OF THE PREFERRED EMBODIMENTS

Figure 4:
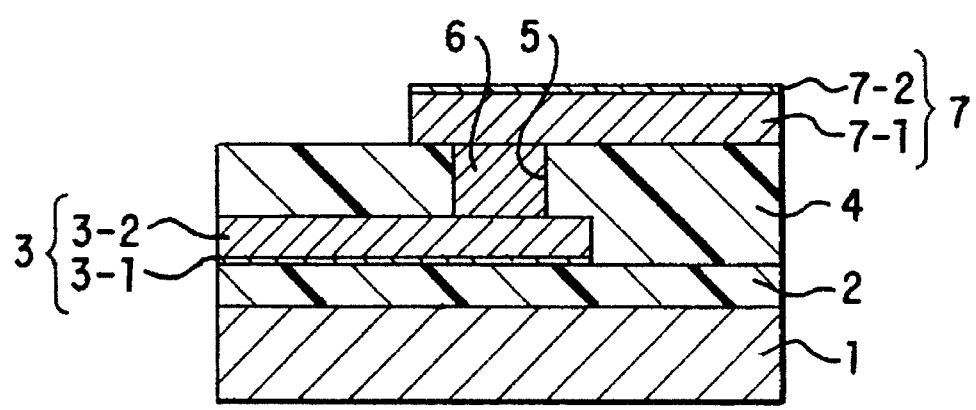
FIG. 4 is a cross sectional view illustrating an embodiment of the multilevel interconnect structure according to the invention.

FIG. 4 is a cross sectional view showing an embodiment of the multilevel interconnect structure according to the invention. On a silicon substrate 1 there has been formed an underlaying insulating film 2 and a lower metal wiring 3 is first formed on the insulating film 2. The lower metal wiring 3 includes a TiW film 3-1 applied on the insulating film 2 and an aluminum alloy film 3-2 formed on the TiW film. An upper metal wiring 7 comprises an aluminum alloy film 7-1 formed on an interlayer insulating film 4 and a TiW film 7-2 formed on the aluminum alloy film 7-1. In the interlayer insulating film 4 there is formed a via hole 5 and a plug 6 made of aluminum is formed in the via hole 5 such that the lower and upper metal wirings 3 and 7 are electrically interconnected by means of the plug 6. According to the invention, a lower end of the aluminum plug 6 is brought into direct contact with the aluminum alloy film 3-2 of the lower metal wiring 3 and an upper end of the plug is also brought into direct contact with the aluminum alloy film 7-1 of the upper metal wiring 7. That is to say, the lower and upper metal wirings 3 and 7 are electrically interconnected with each other via the aluminum alloy-aluminum contacts and there is not provided any undesired interface between metals of different kinds.

In and on a surface of the silicon substrate 1 there are formed various regions of a semiconductor device such as diffusion regions, channel regions and gate electrodes, but for the sake of simplicity these regions are not shown in FIG. 4. Further, in the underlaying insulating film 2 there are formed contact holes and contact structures are formed for electrically connecting the regions to the lower metal wiring 3. However, in FIG. 4 such a construction is not also shown. Moreover, in the embodiment illustrated in FIG. 4, the bilevel interconnect structure is shown, but according to the invention more than three-level inter connect structure can be realized. In such a case, one or more interconnect structure may be provided under lower metal wiring 3 and/or above the upper metal wiring 7.

In the embodiment shown in FIG. 4, both the lower and upper metal wirings 3 and 7 are formed by the stack of the aluminum alloy film and TiW film, but if a minimum line width of the upper metal wiring is larger than that of the lower metal wiring, the upper metal wiring may be formed by a single aluminum or aluminum alloy film. Practically, if the minimum line width of the upper metal wiring 7 is about 1.0 μm, the upper metal wiring may be formed by a single aluminum or aluminum alloy film. However, the design rule of the upper metal wiring 7 is smaller than about 0.6 μm, it is preferable to form the upper metal wiring by the stack of the aluminum or aluminum alloy film and high melting point metal or high melting point metal alloy film as shown in FIG. 4.

The TiW film 3-1 of the lower metal wiring 3 may be formed by sputtering. This TiW film 3-1 serves as a barrier metal for preventing any undesired reaction at a contact interface between the lower metal wiring 3 and a diffusion region. Of course, the TiW film 3-1 has its specific function for improving the reliability of the lower metal wiring. The high melting point metal alloy film such as TiN, WN and TiON film may be used instead of TiW film 3-1 and further a high melting point metal film such as W and Ta film may be also used. Moreover, the lower metal wiring 3 may be formed by a stack of a Ti film, a TiW film and a WN film for preventing the reaction between the TiW film and the aluminum alloy film 3-2. The TiW film 7-2 of the upper metal wiring 7 may be also formed by sputtering. This TiW film 7-2 serves as an anti-reflection film which decreases the reflective coefficient for the exposing light for patterning the upper metal wiring 7 in order to increase the precision of the pattern of the upper metal wiring 7. The TiW film 7-2 also serves to improve the reliability of the upper metal wiring 7. It should be noted that the high melting point metal film of the upper metal wiring 7 may be also formed by a single high melting point metal or high melting point metal alloy film or a stack of a plurality of high melting point metal or high melting point metal alloy films.

The aluminum alloy film 3-2 of the lower metal wiring 3 may be formed by, for instance the sputtering. Further Cu may be added to the aluminum alloy film 3-2 in order to improve the reliability of the lower metal wiring 3. In this case, Cu may be added by about 0.1 to 5 weight %. In view of the reliability improving effect and processability, it is preferable to add Cu by about 0.5 weight %. Moreover, Ti, Pd, Hf and B may be added to the aluminum alloy film 3-2 for improving the reliability of the lower metal wiring 3. Further Si may be added to the aluminum alloy film 3-2 by about 0.5 to 2 weight %. According to the invention, an aluminum film containing no impurity may be used instead of the aluminum alloy film 3-2. However, in this case a method and conditions for depositing the aluminum film have to be considered in order to obtain the aluminum film having a good property. The aluminum or aluminum alloy film may be deposited by CVD method. The aluminum alloy film 7-2 of the upper metal wiring 7 may be also formed by a usual process such as sputtering and CVD. It should be noted that the aluminum or aluminum alloy film 3-2 of the lower metal wiring 3 and the aluminum alloy film 7-1 of the upper metal wiring 7 may be made of the same or different materials.

The aluminum plug 6 may be formed by CVD method using dimethylaluminum hydride (refer to DMAH hereinafter) as raw material. Instead of DMAH, triisobutylaluminum, trimethylamine alane, dimethylethylamine alane and intermolecular compound between trimethylaluminum and dimethylaluminum hydride may be used for forming the aluminum plug 6. When the aluminum alloy films 3-2 and 7-1 and plug are made of the same aluminum alloy containing the same impurity and having the same crystal structure, the reliability of the multilevel interconnect structure would be optimum, so that it is preferable to add Cu to the plug 6. However, in the presently available CVD method for depositing the aluminum, it is difficult to add Cu impurity. Since Cu can be easily diffused in the aluminum film, after depositing the aluminum alloy films 3-2 and 7-1 having Cu impurity added thereto, the assembly is heated at a temperature such as 400° C. and Cu impurity is diffused from the aluminum alloy films into the aluminum plug 6. In this case, in order to make the concentration of Cu impurity in the plug 6 uniform, Cu impurity has to be added to the aluminum alloy films 3-2 and 7-1 at substantially the same concentration.

In the future, if it is possible to deposit an aluminum alloy having the reliability improving impurity added thereto, the aluminum alloy plug may be formed directly by CVD method.

The interlayer insulating film 4 may be formed by, for instance a combination of CVD-$SiO_2$ and SOG (spin-on-glass).

FIGS. 5A to 5E are cross sectional views showing successive steps of an embodiment of the method of manufacturing the multilevel interconnect structure shown in FIG. 4 according to the invention.

Figure 5A:
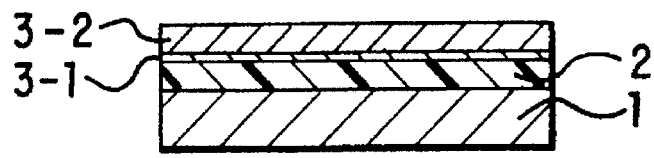
FIGS. 5A, 5B, 5C, 5D and 5E are cross sectional views showing successive steps of an embodiment of the method of manufacturing the multilevel interconnect structure depicted in FIG. 4.

At first, as illustrated in FIG. 5A, on a silicon substrate 1 there is formed an underlaying insulating film 2 and then a TiW film 3-1 having a thickness of 50 to 300 nm and an aluminum alloy film 3-2 having a thickness of 300 to 800 nm are successively formed on the insulating film 2 by the sputtering.

Figure 5B:
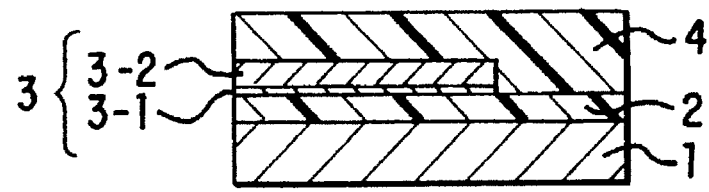

Then, a metal film consisting of a stack of the TiW film 3-1 and aluminum alloy film 3-2 is selectively etched in accordance with a desired pattern to form a lower metal wiring 3. Then, an interlayer insulating film 4 is formed on the lower metal wiring 3 as depicted in FIG. 5B. The lower metal wiring 3 may be formed by providing a resist pattern by means of an pattern exposure apparatus, removing a portion of the aluminum alloy film 3-2 which is not covered with the resist by the reactive ion etching (RIE) using a chlorine containing gas, removing an exposed portion of the TiW film 3-1 by RIE using a fluorine containing gas, and removing the resist.

Next, an interlayer insulating film 4 is formed on the lower metal wiring 3 as well as on the exposed underlaying insulating film 2. This interlayer insulating film 4 may be formed by depositing CVD-SiO$_2$ film having a thickness of 300 nm, depositing a SOG film such that a thickness at a flat portion amounts to 300 nm, effecting a thermal processing and depositing CVD-SiO$_2$ film having a thickness of 200 nm. In an alternative method of forming the interlayer insulating film 4, a SiO$_2$ film having a thickness of 100 nm is formed by plasma CVD using a mixture gas of tetraethylorthosilicate (TEOS) and oxygen, a SiO$_2$ film having a thickness of 1.0 μm is formed by atmospheric pressure CVD using a mixture gas of TEOS and ozone, and the later SiO$_2$ film is etched back such that a thickness at a flat portion becomes 300 nm and finally a SiO$_2$ film having a thickness of 500 nm is formed by plasma CVD.

Figure 5C:
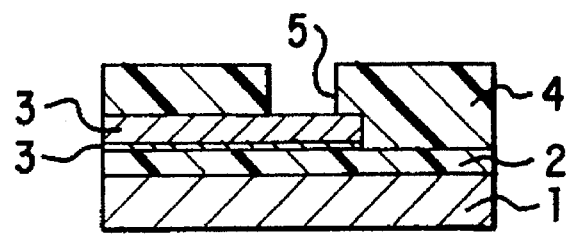

Next, as shown in FIG. 5C, a via hole 5 is formed in the interlayer insulating film 4. This process may be carried out by forming a resist with the aid of the exposing apparatus, removing a portion of the insulating film which is not covered with the resist by RIE, and removing the resist pattern. In this case, in order to manufacture the fine metal wiring it is preferable that the inner wall of the via hole 5 is substantially at right angles with respect to the surface of the silicon substrate.

Figure 5D:
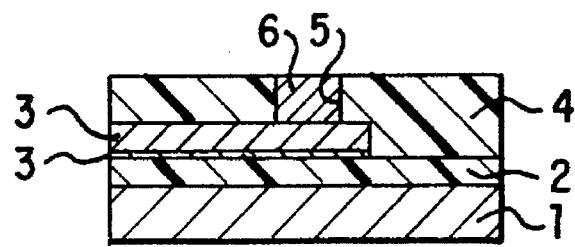

Next, an aluminum plug 6 is formed in the via hole 5 as shown in FIG. 5D by selectively depositing aluminum in the via hole by means of CVD using the starting material of DMAH. The aluminum plug 6 may be formed by depositing an aluminum film all over the surface and then the aluminum film other than in the via hole is removed. However, the above mentioned selective deposition is preferable, because in this case it is not necessary to remove the aluminum film and further even if the inner wall of via hole 5 is inclined at an angle larger than 90 degrees with respect to the surface of the silicon substrate 1, the aluminum can be effectively deposited in the via hole without forming any void. However, in the selective deposition method, the surface of the wafer has to be extremely cleaned. Particularly, the inner wall of the via hole 5 is liable to be converted into oxide or fluoride due to the fact that the surface of aluminum alloy film 3-2 is exposed to charged particles during the overetching process which is performed for compensating the fluctuation in the thickness of the interlayer insulating film 4 and in the RIE speed for forming the via hole. Further sputtered aluminum atoms might be applied onto the side wall of the via hole as well as on the exposed surface of the aluminum alloy film 3-2 in the form of oxide or fluoride. In case of forming the aluminum plug 6 by the selective deposition by CVD using the organic aluminum compound such as DMAH, the above mentioned problem should be removed.

Figure 6:
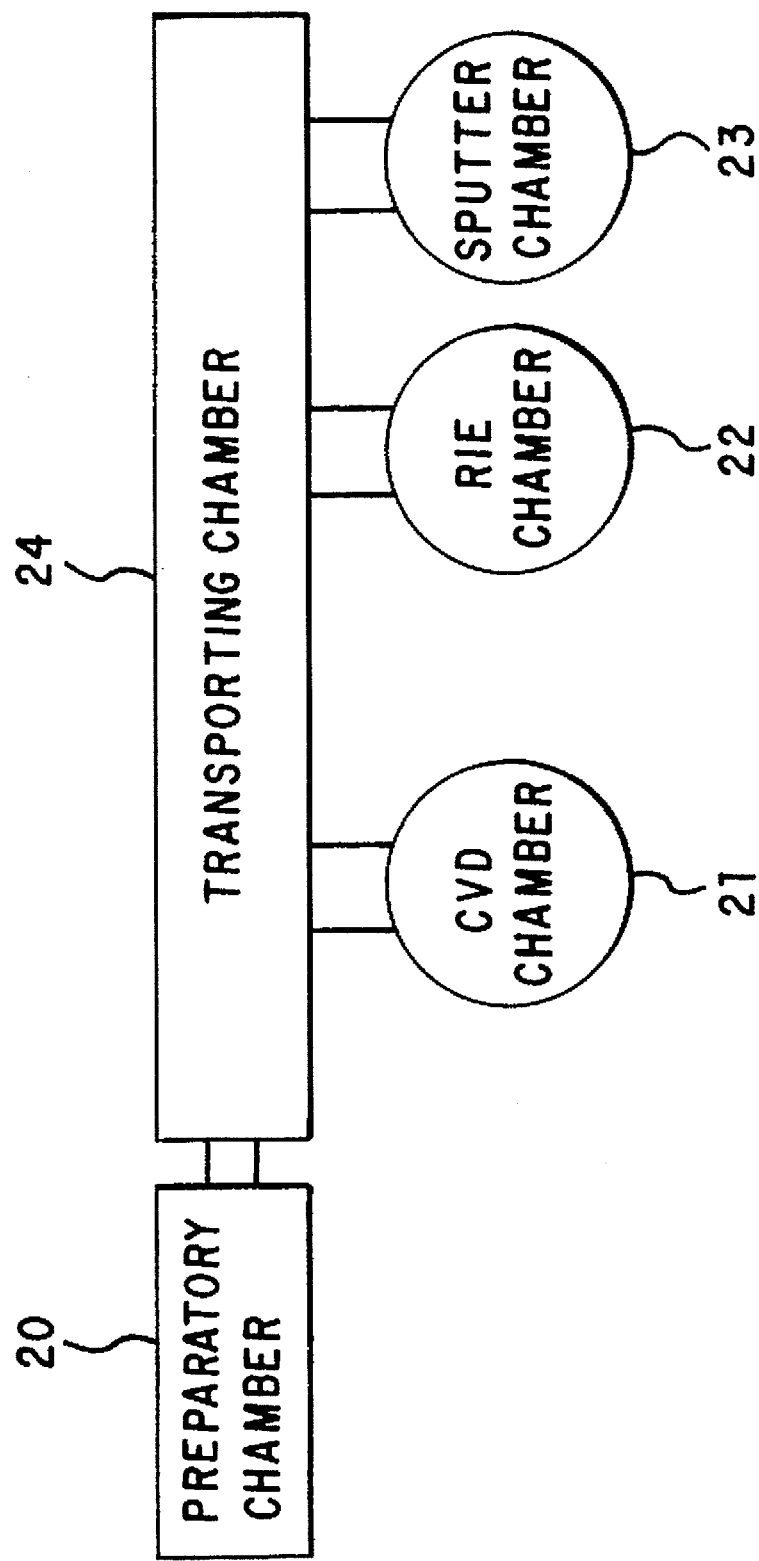
FIG. 6 is a schematic view showing a processing apparatus for carrying out the method according to the invention.

In order to avoid the deterioration of the exposed surface of the aluminum alloy film 3-2, it is preferable to perform the cleaning process for removing the aluminum oxide or fluoride and the formation of the plug 6 continuously without exposing the wafer to the atmosphere. FIG. 6 is a schematic view showing an apparatus for processing the wafer in the above mentioned manner. The apparatus comprises preparatory chamber 20, CVD chamber 21, RIE chamber 22 and sputter chamber 23, these chambers being communicated with each other by means of a transporting chamber 24, so that the silicon wafer can be moved between the processing chambers 21, 22 ad 23 without exposing it to the atmosphere. By using the above explained processing apparatus, after effecting the cleaning process by using chlorine containing gas in the RIE chamber 22, the silicon wafer may be transported into the CVD chamber 21 for depositing the aluminum in the via hole 5 to form the plug 6. It should be noted that the RIE is a kind of the plasma etching, and the etching chamber 22 may be constructed to perform other plasma etching such as ECR (Electro Cyclotron Resonance) etching and TCP (Transformer Coupled Plasma) etching.

Figure 5E:
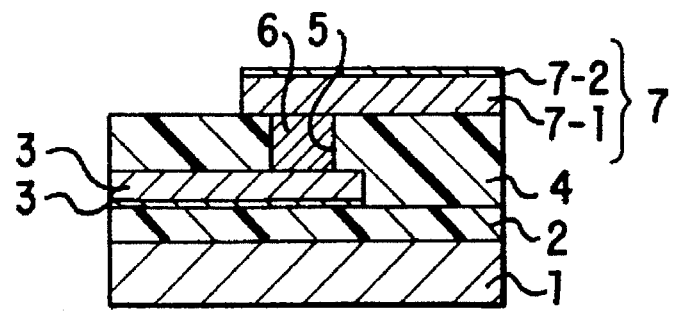

Next, an aluminum alloy film 7-1 having a thickness of 400 to 1000 nm is deposited by the sputtering and then a TiW film 7-2 having a thickness of 20 to 100 nm is deposited on the film 7-1 also by the sputtering. Finally a metal film consisting of a stack of the aluminum alloy film 7-1 and TiW film 7-2 is selectively etched in accordance with a given pattern to form an upper metal wiring 7 as shown in FIG. 5E. In this manner, the multilevel interconnect structure illustrated in FIG. 4 can be manufactured.

If the aluminum alloy film 7-1 of the upper metal wiring 7 is formed by a separate apparatus from an apparatus for forming the aluminum plug 6, prior to the deposition of the aluminum alloy, an aluminum oxide film formed on the upper surface of the aluminum plug is preferably removed by the sputter etching using Ar ions. Then, the electrical property of the interconnect can be further improved. If the apparatus shown in FIG. 6 is used to form the aluminum alloy film 7-1, after the aluminum plug 6 has been formed in the CVD chamber 21, the silicon wafer is transported into the sputter chamber 23 and the aluminum alloy film 7-1 is deposited. Then the aluminum oxide film is hardly formed on the upper surface of the aluminum plug 6, and thus the much superior electrical property can be obtained.

Figure 7:
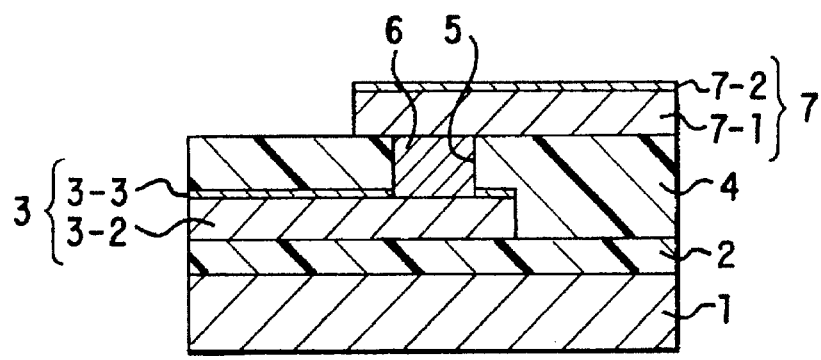
FIG. 7 is a cross sectional view showing another embodiment of the multilevel interconnect structure according to the invention.

FIG. 7 is a cross sectional view showing another embodiment of the multilevel interconnect structure according to the invention. In the embodiment illustrated in FIG. 4, the lower metal wiring 3 is formed by depositing the aluminum alloy film 3-2 on the TiW film 3-1. In the present embodiment, the lower metal wiring 3 is composed of an aluminum alloy film 3-2 deposited on the underlaying insulating film 2 and a TiW film 3-3 deposited on the aluminum alloy film 3-2. At a bottom of a via hole 5 formed in an interlayer insulating film 4, a portion of the TiW film 3-3 is removed such that an aluminum plug 6 is directly brought into contact with the aluminum alloy film 3-2. The remaining construction of the present embodiment is same as that of the embodiment shown in FIG. 4.

Also in the present embodiment, the TiW film 3-3 serves as the antireflection film for decreasing the reflective coefficient of the lower metal wiring 3 for forming precisely patterning the lower metal wiring and also serves to improve the reliability of the lower metal wiring 3. Further, the TiW film 3-3 of the present embodiment may be formed by other high melting point metal or its alloy similar to the TiW film 3-1 of the embodiment illustrated in FIG. 4. Moreover, in the present embodiment, another high melting point metal or high melting point metal alloy film may be formed under the aluminum alloy film 3-2.

Similar to the embodiment shown in FIG. 4, the upper metal wiring 7 may be formed by a single aluminum alloy film, if the minimum line width of the upper metal wiring 7 is larger than that of the lower metal wiring 3 and the problem of decreasing the reliability of the upper metal wiring is not significant.

FIGS. 8A to 8E are cross sectional views showing successive steps of an embodiment of the method of manufacturing the multilevel interconnect structure depicted in FIG. 7 according to the invention.

Figure 8A:
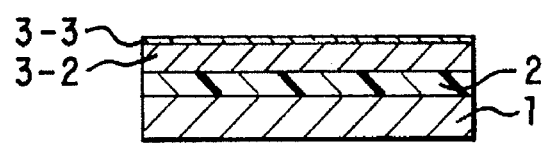
FIGS. 8A, 8B, 8C, 8D and 8E are cross sectional views representing successive steps of an embodiment of the method of manufacturing the multilevel interconnect structure shown in FIG. 7.

At first, as shown in FIG. 8A, on an underlaying insulating film 2 formed on a silicon substrate 1, an aluminum alloy film 3-2 having a thickness of 300 to 800 nm is formed by sputtering. Then, a TiW film 3-3 having a thickness of 50 to 300 nm is formed on the aluminum alloy film 3-2 also by sputtering.

Figure 8B:
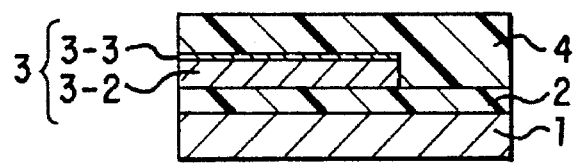

Next, a metal film consisting of a stack of the aluminum alloy film 3-2 and TiW film 3-3 is selectively processed in accordance with a desired pattern to form a lower metal wiring 3. Then, an interlayer insulating film 4 is formed on the lower metal wiring 3 as depicted in FIG. 8B. The lower metal wiring 3 may be formed by providing a resist pattern by means of an pattern exposure apparatus, removing a portion of the TiW film 3-3 which is not covered with the resist by the RIE using a fluorine containing gas, removing an exposed portion of the aluminum alloy film 3-2 by RIE using a chlorine containing gas, and removing the resist. It should be noted that the interlayer insulating film 4 may be formed in the manner explained above with reference to the embodiment shown in FIGS. 5A to 5E.

Figure 8C:
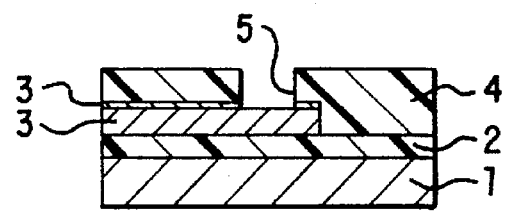

Next, as shown in FIG. 8C, a via hole 5 is formed in the interlayer insulating film 4. This process may be carried out by forming a resist mask with the aid of the exposing apparatus, removing a portion of the insulating film which is not covered with the resist by RIE using a fluorine containing gas to expose the TiW film 3-3, removing the exposed TiW film and removing the resist mask. In this case, in order to increase the wiring density it is preferable that the inner wall of the via hole 5 is substantially at right angles with respect to a surface of the silicon substrate 1.

In the present embodiment, the deterioration of the upper surface of the aluminum alloy film 3-2 and inner wall of the via hole 5 can be suppressed as compared with the previous embodiment shown in FIGS. 5A to 5E. In the present embodiment, during the etching process for forming the via hole 5 in the interlayer insulating film 4, the aluminum alloy film 3-3 is not exposed to charged particles, although the TiW film 3-3 is subject to the charged particles, but TiW film is hardly etched as compared with the aluminum alloy film. It is true that during the removal of the exposed TiW film 3-3 by the overetching RIE, the aluminum alloy film 3-2 is exposed to charged particles, but the thickness of the TiW film 3-3 is quite smaller than that of the interlayer insulating film 4, so that a time period during which the aluminum alloy film is subjected to charged particles becomes shorter than that of the embodiment shown in FIGS. 5A to 5E. Further, when the interlayer insulating film 4 is etched to form a tapered hole or a large dimensional error is introduced in this etching process, the wiring density is affected to a great extent, but these defects in the etching of the TiW film 3-3 do not affect, so that the etching condition for removing the deterioration of the etched surface can be selected at will.

Figure 8D:
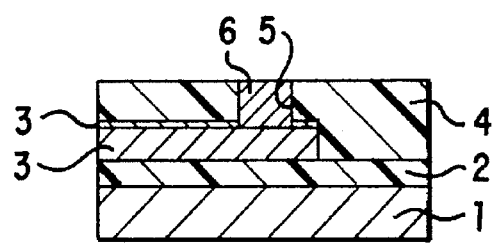

Next, an aluminum plug 6 is formed in the via hole 5 as shown in FIG. 8D by selectively depositing aluminum in the via hole by means of CVD using DMAH as the starting material.

Figure 8E:
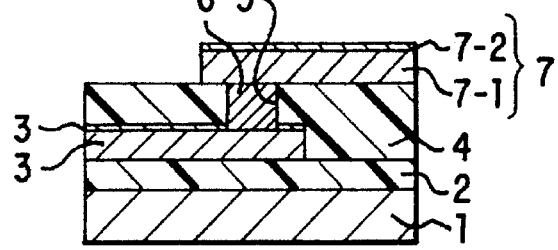

Next, an aluminum alloy film 7-1 having a thickness of 400 to 1000 nm is deposited by sputtering and then a TiW film 7-2 having a thickness of 20 to 200 nm is deposited on the film 7-1 also by sputtering. Finally, a metal film consisting of a stack of the aluminum alloy film 7-1 and TiW film 7-2 is selectively etched in accordance with a given pattern to form an upper metal wiring 7 as shown in FIG. 8E. In this manner, the bilevel interconnect structure illustrated in FIG. 7 can be manufactured.

FIGS. 9A to 9E are cross sectional views illustrating successive steps of another embodiment of the method of manufacturing the multilevel interconnect structure shown in FIG. 7.

Figure 9A:
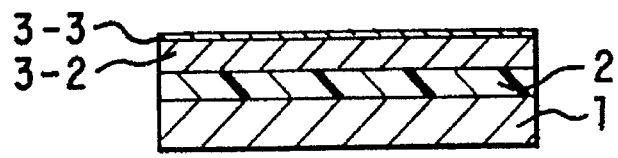
FIGS. 9A, 9B, 9C, 9D and 9E are cross sectional views illustrating successive steps of another embodiment of the method of manufacturing the multilevel interconnect structure depicted in FIG. 7.
Figure 9B:
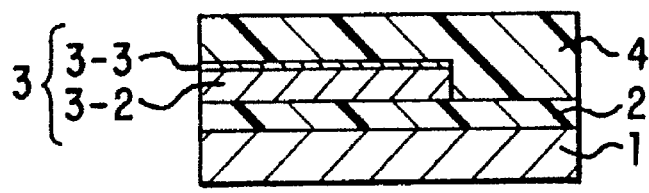

The steps depicted in FIGS. 9A and 9B are same as those shown in FIGS. 8A and 8B, respectively. That is to say, on an underlaying insulating film 2 formed on a silicon substrate 1, aluminum alloy film 3-2 and TiW film 3-3 are successively formed by sputtering. These films 3-2 and 3-3 are selectively etched in accordance with a given pattern to form a lower metal wiring 3. Then, an interlayer insulating film 4 is formed on the lower metal wiring 3.

Figure 9C:
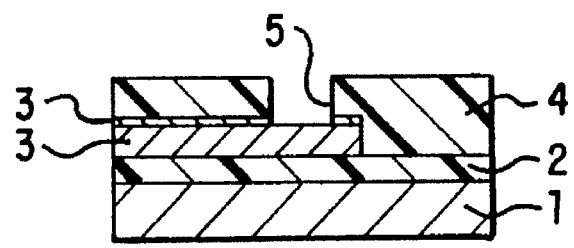
Figure 9D:
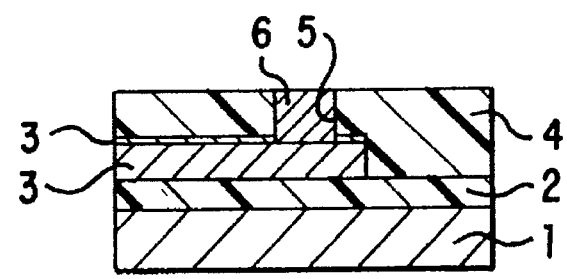
Figure 9E:
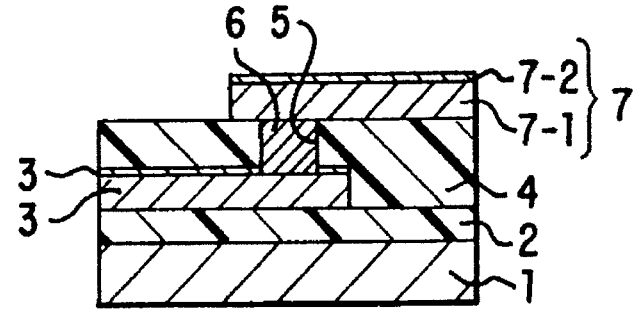

Next, a portion of the interlayer insulating film 4 at which a via hole is to be formed is selectively removed to expose a surface of the TiW film 3-3. In the present embodiment, the exposed TiW film 3-3 is not removed, but only the resist is removed as shown in FIG. 9C.

Then, the silicon wafer is introduced into the apparatus shown in FIG. 6 and is fed into the RIE chamber 22. In the RIE chamber 22, the exposed TiW film 3-3 is selectively removed. Then, the silicon wafer is transported into the CVD chamber 21 and an aluminum plug 6 is selectively deposited in the via hole 5. In this manner, in the present embodiment, the removal of the exposed TiW film 3-3 and the deposition of the aluminum plug 6 are continuously performed without exposing the silicon wafer to the atmosphere. Therefore, it is no more necessary to effect a special cleaning process and the via contact having excellent property can be attained.

Next aluminum alloy film 7-1 and TiW film 7-2 are deposited and a stack of these films is etched in accordance with a given pattern to form an upper metal wiring 7. In this manner, the bilevel interconnect structure shown in FIG. 7 can be obtained.

Figure 10:
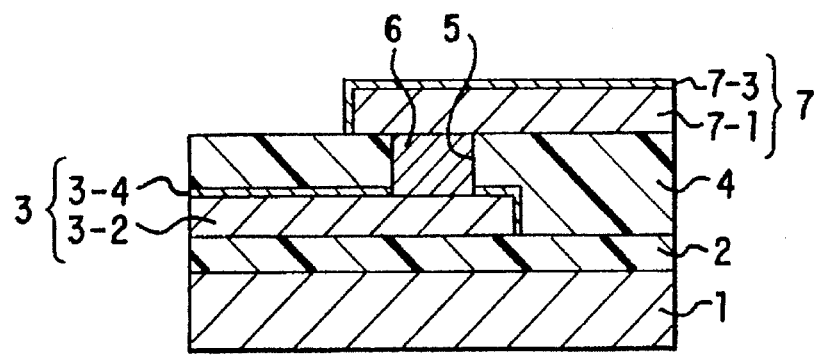
FIG. 10 is a cross sectional view showing still another embodiment of the multilevel interconnect structure according to the invention.

FIG. 10 is a cross sectional view depicting still another embodiment of the multilevel interconnect structure according to the invention.

In the embodiment shown in FIG. 7, the lower metal wiring 3 is formed by patterning the metal film stack consisting of the aluminum alloy film 3-2 and TiW film 3-3. In the present embodiment, at first the aluminum alloy film 3-2 is etched in accordance with a given pattern and then upper surface and side wall of the aluminum film 3-2 are covered with a W film 3-4. The upper metal wiring 7 is also has the same construction as that of the lower metal wiring 3. The remaining construction of the present embodiment is same as the embodiment shown in FIG. 7.

By covering upper surface and side wall of the aluminum alloy film 3-2 with the W film 3-4, the reliability of the lower metal wiring 3 can be further improved. In a modification of the embodiment illustrated in FIG. 10, after the stack of the aluminum alloy film and TiW film has been etched in accordance with a desired pattern, the upper surface and side wall of the stack may be covered with a W film to form the lower metal wiring. In this case, the TiW film serves to improve the anti-reflection property as well as to improve the property of the interface between the W film and the aluminum alloy film.

Moreover, in the embodiment illustrated in FIG. 10, the upper metal wiring 7 may be formed by a single aluminum or aluminum alloy film, when the minimum line width of the upper metal wiring is larger than that of the lower metal wiring.

FIGS. 11A to 11E are cross sectional views showing successive steps of an embodiment of the method of manufacturing a modification of the multilevel interconnect structure shown in FIG. 10.

Figure 11A:
FIGS. 11A, 11B, 11C, 11D and 11E are cross sectional views representing successive steps of an embodiment of the method of manufacturing the multilevel interconnect structure shown in FIG. 10.

As depicted in FIG. 11A, on a silicon substrate 1 is formed an underlaying insulating film 2 and then an aluminum alloy film 3-2 having a thickness of 300 to 800 nm is deposited by sputtering.

Figure 11B:
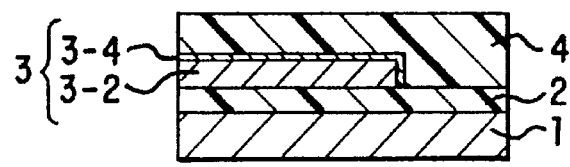
Figure 11C:
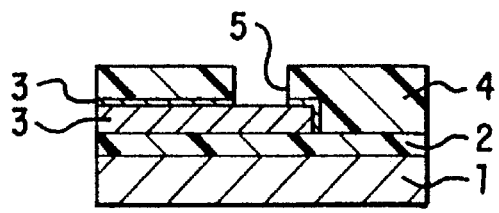

Next, the aluminum alloy film 3-2 is etched in accordance with a given pattern by using a resist and then the resist is removed. Now a W film 3-4 having a thickness of 25 to 150 nm is selectively deposited on the upper surface and side wall of the aluminum alloy film 3-2 by CVD using a mixture of WF6 and silane. In this manner, a lower metal wiring 3 is formed. Then, an interlayer insulating film 4 is formed on the lower metal wiring 3 as shown in FIG. 11B. Before etching the aluminum alloy film 3-2, a Si film having a thickness of 20 to 80 nm may be deposited for decreasing the reflective coefficient of the aluminum alloy film 3-2 for the exposing light.

Figure 11D:
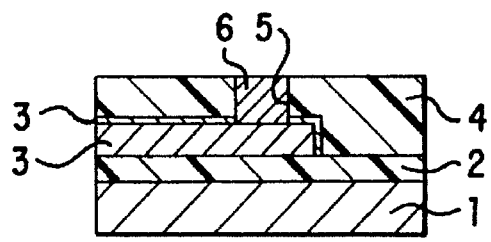

Next, in the interlayer insulating film 4 there is formed a via hole 5 such that the upper surface of the W film 3-4 is exposed in the via hole. Then, after removing the exposed W film 3-4 in the via hole, an aluminum plug 6 is formed in the via hole 5 as depicted in FIG. 11D.

Figure 11E:
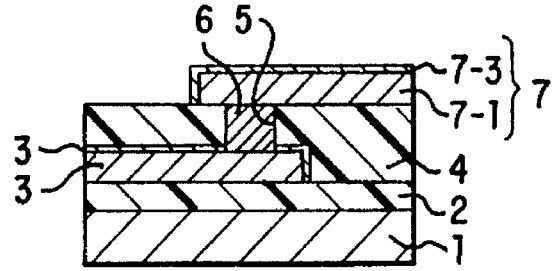

Then, an aluminum alloy film 7-1 having a thickness of 400 to 1000 nm is formed on the insulating film 4 by sputtering and this aluminum alloy film is shaped into a given pattern. Then, a W film 7-3 is selectively deposited on the upper surface and side wall of the aluminum alloy film 7-1 to form an upper metal wiring 7 as shown in FIG. 11E.

In the embodiment illustrated in FIGS. 11A to 11E, the W film 3-4 is removed while the via hole 5 is formed in the interlayer insulating film 4 to expose the aluminum alloy film 3-2. Similar to the embodiment shown in FIGS. 9A to 9E, it is also possible to introduce the silicon wafer into the processing apparatus illustrated in FIG. 6 after forming the via hole 5 in the interlayer insulating and to remove the exposed W film 3-4 in the via hole. Then, the aluminum plug 6 may be formed in the via hole 5 without exposing the silicon wafer to the atmosphere. In this manner, the via contact having an excellent property can be obtained.

FIGS. 12A to 12E are cross sectional views depicting successive steps of another embodiment of the method of manufacturing the multilevel interconnect structure shown in FIG. 7.

Figure 12A:
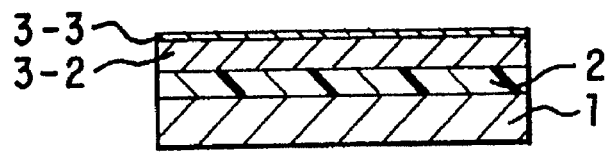
FIGS. 12A, 12B, 12C, 12D and 12E are cross sectional views representing successive steps of still another embodiment of the method of manufacturing the multilevel interconnect structure illustrated in FIG. 7.

At first, as shown in FIG. 12A, on an underlaying insulating film 2 formed on a surface of a silicon substrate 1, an aluminum alloy film 3-2 having a thickness of 300 to 800 nm is formed on the insulating film 2 by sputtering. Then, a TiW film 3-3 having a thickness of 50 to 300 nm is formed on the aluminum alloy film 3-2 also by sputtering.

Figure 12B:
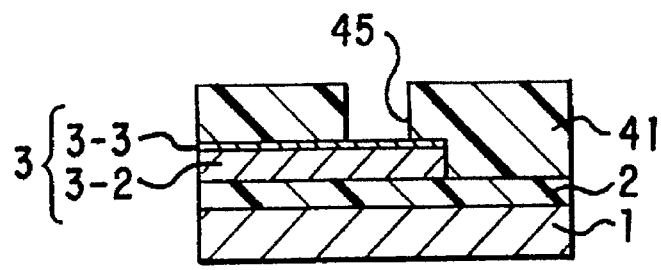

Next, a metal film consisting of a stack of the aluminum alloy film 3-2 and TiW film 3-3 is selectively etched in accordance with a desired pattern to form a lower metal wiring 3. Then, a resist 41 is formed on the TiW film 3-3 and the exposed interlayer insulating film 4 and then a hole 45 is formed in the resist at a portion at which a via hole is to be formed later. The TiW film 3-3 exposed in the hole 45 is removed to exposed the aluminum alloy film 3-2 as depicted in FIG. 12B.

Figure 12C:
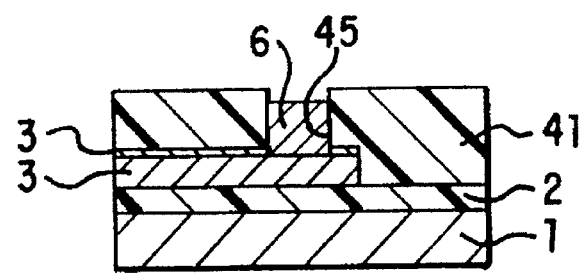

Next, an aluminum plug 6 is formed by selectively depositing aluminum in the hole 45 by CVD using DMAH as illustrated in FIG. 12C. During the formation of the plug 6, the silicon wafer is heated to a temperature of about 210°–260° C., so that the resist 41 must have such a property that gas is not discharged from the resist and the resist pattern is not deformed. To this end it is preferable that the resist is cured by irradiating ultraviolet rays in a highly pure nitrogen and then the resist is baked at a temperature which is higher than that at which Al-CVD is carried out for forming the plug 6.

Further, instead of the resist it is also possible to use organic insulating film such as polyimide film. In this case, after the polyimide film is applied on the silicon wafer, the silicon wafer is heated to effect the polymerization and then a plasma CVD-SiO$_2$ film is formed on the polyimide film. Next, a resist having a pattern corresponding to the via hole to be formed is formed and the CVD-SiO$_2$ film is selectively removed by RIE using a fluorine containing gas. Then, after removing the resist, the polyimide film is selectively removed by RIE using an oxygen gas to form the hole 45. This method has a heat resistance so that the gas discharge and deformation of the pattern during the formation of the Al-CVD plug 6 can be minimized although the number of steps is increased.

The selective removal of the TiW film 3-3 and the formation of the aluminum plug 6 may be carried out by separate apparatuses, but it is preferable to perform these processes continuously without exposing the silicon wafer to the atmosphere in order to obtain the via contact having excellent property.

Figure 12D:
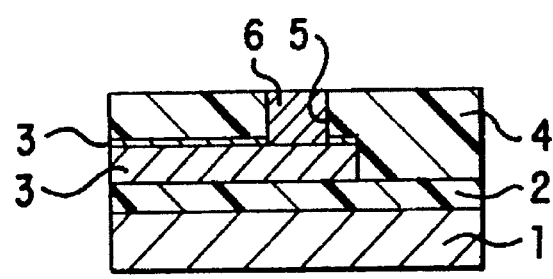

Next, the resist 41 is removed and an interlayer insulating film 4 is formed such that an upper surface of the plug 6 is exposed from the interlayer insulating film as shown in FIG. 12D. This may be carried out by various methods. For instance, after a polyimide film has been applied and polymerized by heating, the polyimide film is etched-back to such an extent that the upper surface of the plug 6 is exposed. Alternatively, a CVD-SiO$_2$ film is deposited by plasma CVD using a mixture of TEOS and oxygen, a CVD-SiO$_2$ film is deposited by atmospheric pressure CVD using a mixture of TEOS and ozone, and then the CVD-SiO$_2$ film is etched-back such that the upper surface of the plug 6 is exposed.

Figure 12E:
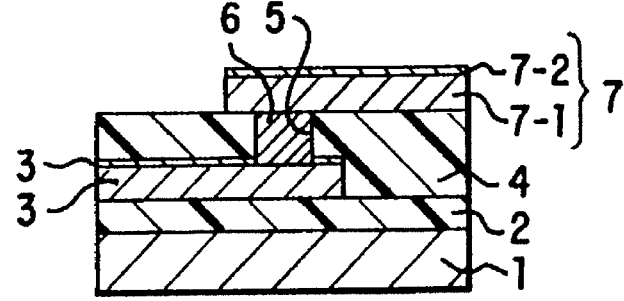

Next, an aluminum oxide film formed on the upper surface of the aluminum plug 6 is removed by the sputter etching using Ar ions. Then, an aluminum alloy film 7-1 having a thickness of 400 to 1000 nm is deposited by sputtering and then a TiW film 7-2 having a thickness of 20 to 200 nm is deposited on the film 7-1 also by sputtering. Finally, a metal film consisting of a stack of the aluminum alloy film 7-1 and TiW film 7-2 is selectively etched in accordance with a given pattern to form an upper metal wiring 7 as shown in FIG. 12E. In this manner, the multilevel interconnect structure depicted in FIG. 7 can be manufactured.

As compared with the embodiment shown in FIGS. 8A to 8E, the present embodiment has the following advantages. Since the interlayer insulating film 4 is formed after the plug 6 has been formed, it is no more necessary to apply a rather complicated process for forming the fine via hole in the insulating film. Further, as compared with a case in which the via hole is formed by RIE, the surface of the aluminum alloy film 3-2 and the inner wall of the via hole are not stained or damaged. When the interlayer insulating film 4 is made of polyimide, it is possible to form easily the insulating film having a superior flatness and residual stress in the film can be reduced. Moreover, the dielectric constant of the polyimide film is lower than that of the CVD-SiO$_2$ film, and thus the electrostatic capacitance between the metal wirings as well as between wiring lines can be decreased and the operating speed of the semiconductor device can be increased.

Figure 13:
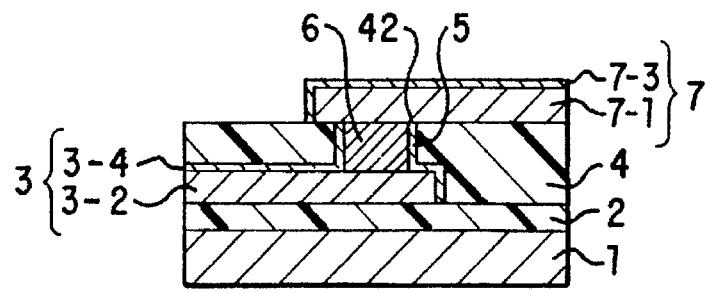
FIG. 13 is a cross sectional view showing still another embodiment of the multilevel interconnect structure according to the invention.

FIG. 13 is a cross sectional view showing still another embodiment of the multilevel interconnect structure according to the invention. In the present embodiment, an aluminum alloy film 3-2 is selectively etched and then a W film 3-4 is applied on the surface and side wall of the aluminum alloy film to form a lower metal wiring 3. Further, an inner wall of a via hole formed in an interlayer insulating film 4 is covered with a W film 42. Therefore, an aluminum plug 6 formed in the via hole 6 can be effectively prevented from being etched or corroded by water contained in the insulating film 4, so that the reliability of the device is improved.

FIGS. 14 to 19 are cross sectional views showing successive steps of an embodiment of the method of manufacturing the multilevel interconnect structure illustrated in FIG. 13.

Figure 14:
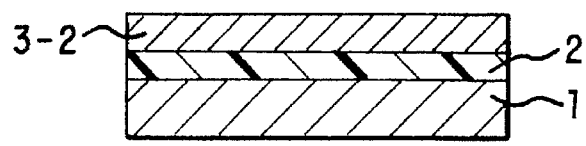
FIG. 14 is a cross sectional view showing a first step of an embodiment of the method of manufacturing the multilevel interconnect structure illustrated in FIG. 13.

At first, as shown in FIG. 14, on an underlaying insulating film 2 formed on a surface of a silicon substrate 1, an aluminum alloy film 3-2 having a thickness of 300 to 800 nm is formed by sputtering.

Figure 15:
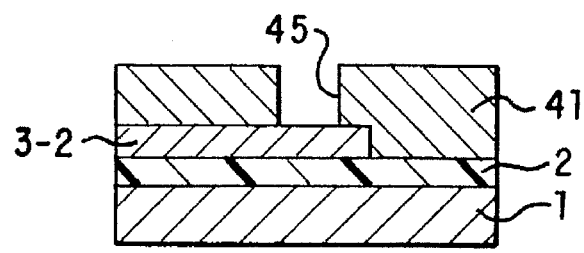
FIGS. 15, 16, 17, 18 and 19 are cross sectional views showing successive steps for manufacturing the multilevel interconnect structure shown in FIG. 13.

Next, the aluminum alloy film 3-2 is selectively etched in accordance with a desired pattern. After a resist 41 has been applied over the whole surface of the silicon wafer, a hole 45 is formed in the resist at a portion at which a via hole is to be formed as illustrated in FIG. 15. In this manner, the aluminum alloy film 3-2 is exposed in the hole 45.

Figure 16:
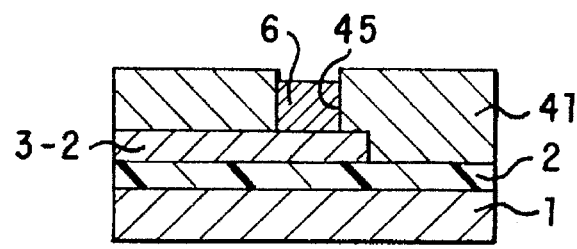

Next, an aluminum plug 6 is formed by selectively depositing aluminum in the hole 45 by CVD using DMAH as illustrated in FIG. 16. Also in the present embodiment, instead of the resist 41 it is possible to use an organic insulating film such as a polyimide film.

Figure 17:
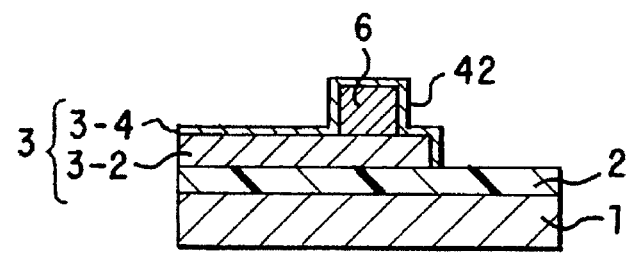

Then, after removing the resist, a W film 3-4 having a thickness of 25 to 150 nm is selectively formed only on the surface and side wall of the aluminum alloy film 3-2 to form a lower metal wiring 3 as shown in FIG. 17 by CVD using a mixture of WF6 and silane. At the same time, a W film 42 is formed on the aluminum plug 6.

Figure 18:
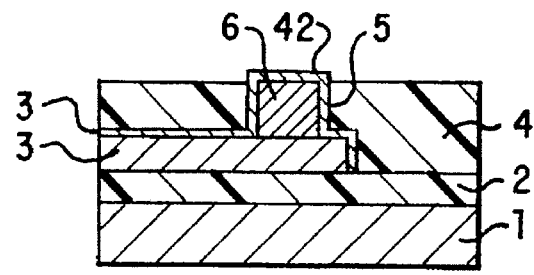

Next, an interlayer insulating film 4 is formed such that an upper surface of the W film 42 on the plug 6 is exposed as shown in FIG. 18. This may be carried out by various methods. For instance, after a polyimide film has been applied and polymerized by heating, the polyimide film is etched-back to such an extent that the W film 42 is exposed. Alternatively, a CVD-SiO$_2$ film is deposited by plasma CVD using a mixture of TEOS and oxygen, a CVD-SiO$_2$ film is deposited by atmospheric pressure CVD using a mixture of TEOS and ozone, and then the CVD-SiO$_2$ film is etched-back such that the W film 42 is exposed.

Figure 19:
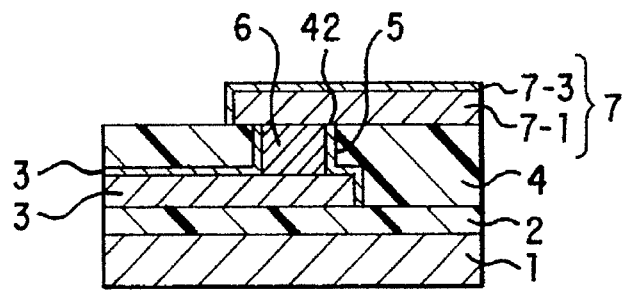

Next, the exposed W film 42 formed on the upper surface of the aluminum plug 6 is removed by RIE using a fluorine containing gas. Then, after removing an aluminum oxide film formed on the upper surface of the plug 6 by sputter-etching using Ar ions, an aluminum alloy film 7-1 having a thickness of 400 to 1000 nm is deposited by sputtering. Then, the aluminum alloy film 7-1 is selectively etched in accordance with a given pattern and then a W film 7-3 is selectively deposited on the surface and side wall of the aluminum alloy film 7-1 to form an upper metal wiring 7 as shown in FIG. 19. In this manner, the multilevel interconnect structure depicted in FIG. 13 can be obtained.

FIGS. 20A, 20B to 26A, 26B are cross sectional views showing successive steps of an embodiment of the method of manufacturing the multilevel interconnect structure according to the invention. It should be noted that a plane of FIGS. 20A, 21A . . . 26A and a plane of FIGS. 20B, 21B . . . 26B are perpendicular to each other.

Figure 20A:
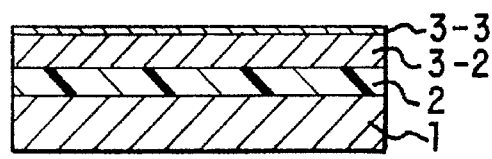
FIGS. 20A, 20B; 21A, 21B; 22A, 22B; 23A, 23B; 24A, 24B; 25A, 25B and 26A, 26B are cross sectional views illustrating successive steps of another embodiment of the method of manufacturing the multilevel interconnect structure according to the invention.
Figure 20B:
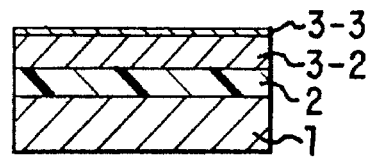

At first, as illustrated in FIGS. 20A and 20B, on an underlaying insulating film 2 formed on a silicon sub-strate 1, an aluminum alloy film 3-2 having a thickness of 300 to 800 nm and a TiW film 3-3 having a thickness of 20 to 100 nm are successively formed by sputtering.

Figure 21A:
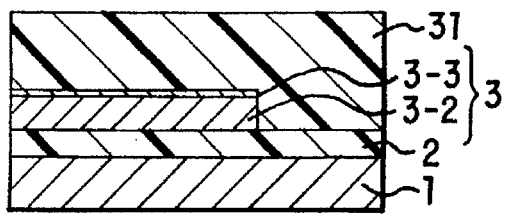
Figure 21B:
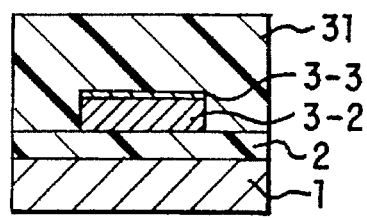

Then, a stack of these films 3-2 and 3-3 is selectively etched in accordance with a given pattern to form a lower metal wiring 3. Then, an interlayer insulating film 31 having a thickness of 1 to 2.5 μm is formed on the lower metal wiring 3 as shown in FIGS. 21A and 21B. The interlayer insulating film 31 may be formed by depositing a CVD-SiO$_2$ film having a thickness of 100 nm by plasma CVD using a mixture of TEOS and oxygen, depositing a CVD-SiO$_2$ film having a thickness of 2 μm by atmospheric pressure CVD using a mixture of TEOS and ozone, etching-back the CVD-SiO$_2$ film such that a thickness at a flat portion becomes equal to 1.2 μm, and depositing a CVD-SiO$_2$ film having a thickness of 500 nm by plasma CVD using TEOS and oxygen mixture gas.

Figure 22A:
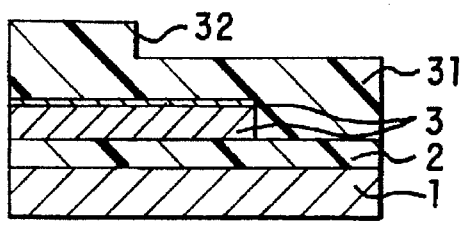
Figure 22B:
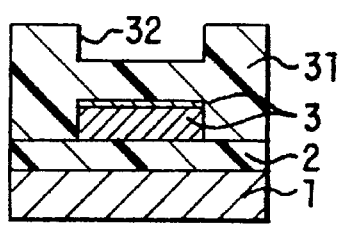
Figure 23A:
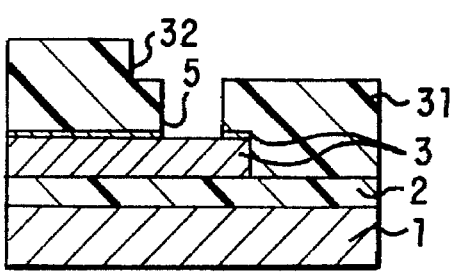
Figure 23B:
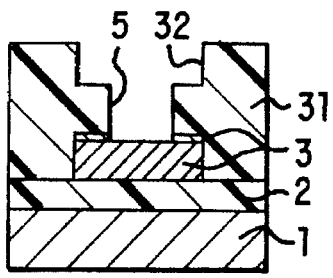

Next, a resist is applied on the silicon wafer and a portion of the resist corresponding to an upper metal wiring to be formed is selectively removed. Then, a wiring recess 32 having a depth of 0.5 to 1.2 μm is formed in a surface of the insulating film 31 by RIE using a fluorine containing gas, and the resist is removed as depicted in FIG. 22A and 22B. Next, a resist is formed and a portion of the resist corresponding to a portion at which a via hole is to be formed is selectively removed. Next, the insulating film 31 is selectively removed by RIE using a fluorine containing gas and a via hole 5 having a depth of 0.5 to 1.2 μm is formed to expose the TiW film 3-3. Then, the thus exposed TiW film is removed and the resist is removed as illustrated in FIGS. 23A and 23B.

Figure 24A:
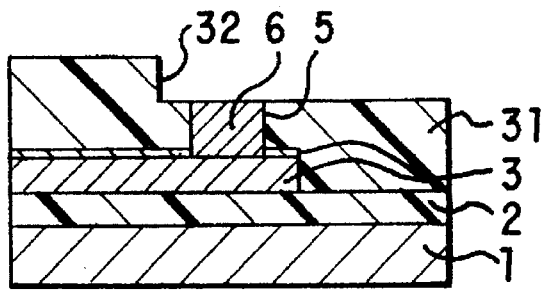
Figure 24B:
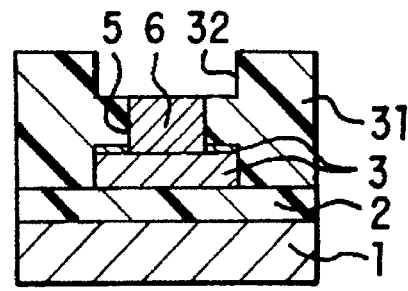

Then, as shown in FIGS. 24A and 24B, an aluminum plug 6 is formed in the via hole 5 by selectively depositing aluminum in the via hole 5 by means of CVD using organic aluminum compound such as DMAH. As explained before, the removal of the TiW film 3-3 and the formation of the aluminum plug 6 may be advantageously performed continuously without exposing the silicon wafer to the atmosphere. In this case, after the via hole has been formed, only the resist is removed.

Figure 25A:
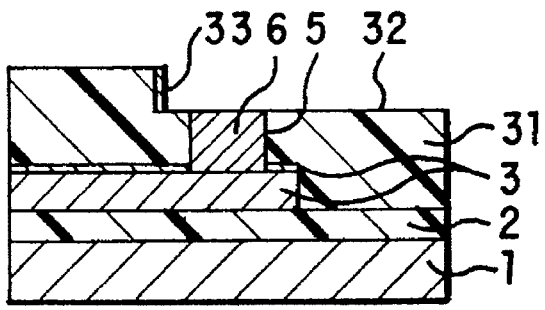
Figure 25B:
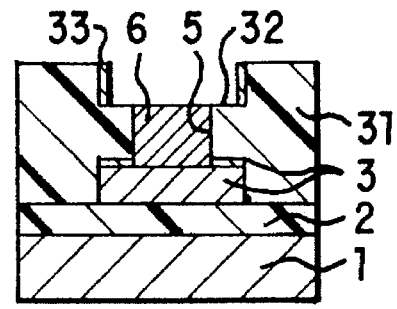

Next, a TiW film 33 having a thickness of 20 to 200 nm is deposited on the whole surface by sputtering and then the TiW film is etched-back to remain the TiW film 33 only on the side wall of the wiring recess 32 as shown in FIGS. 25A and 25B.

Figure 26A:
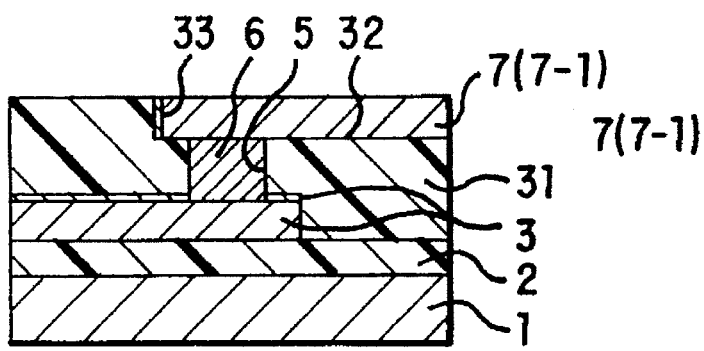
Figure 26B:
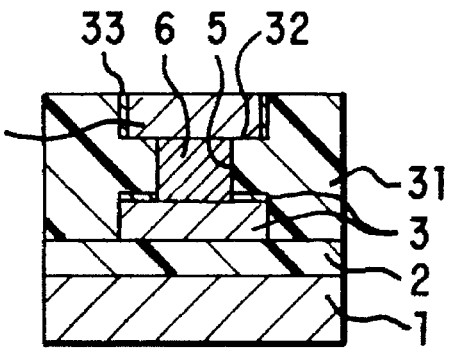

Then, an aluminum alloy film 7-1 is selectively formed in the wiring recess 32 to form an upper metal wiring 7 as illustrated in FIGS. 26A and 26B. The aluminum alloy film 7-1 may be formed by depositing an aluminum alloy film by sputtering in which the step coverage is improved by controlling the temperature of the silicon wafer during the sputtering and then the aluminum alloy film may be etched-back such that the aluminum alloy film is remained only in the wiring recess. In this method, the aluminum alloy film may be formed by depositing a first aluminum alloy film having a thickness of 20 to 100 nm by sputtering and then a second aluminum alloy film may be deposited on the first aluminum alloy film by CVD, while these first and second aluminum alloy films are successively formed without exposing the silicon wafer to the atmosphere. Alternatively, the aluminum film may be formed by first forming aluminum deposition seeds by irradiating hydrogen radicals produced by plasma discharge and then depositing an aluminum alloy film by CVD.

As compared with the method shown in FIGS. 8A to 8E, in the present embodiment, the wiring recess 32 is formed in the upper surface of the interlayer insulating film 31 and the upper metal wring 7 is formed by the aluminum alloy film 7-1 filled in the wiring recess, so that the upper surface of the upper metal wiring can be made flat without using a complicated process. Therefore, the multilevel metal wiring structure of the present embodiment is preferable to construct another metal wiring on the upper metal wiring.

In order to confirm the superiority of the multilevel interconnect structure according to the invention, the following experiment has been conducted. At first a multilevel interconnect structure shown in FIG. 27 was manufactured by a method similar to that shown in FIGS. 8A to 8E. This multilevel interconnect structure according to the invention is similar to that illustrated in FIG. 7 except for a point that the upper metal wiring 7 is formed by an aluminum film 7-4. An initial resistance of the via contact through the via hole having a diameter of 0.8 μm was about 0.2Ω. As a comparative sample, a multilevel interconnect structure shown in FIG. 28 was manufactured by a method disclosed in the above mentioned reference 4. In this known multilevel interconnect structure, on an underlaying insulating film 102 were formed Al-Cu alloy film 103-5 and TiN film 103-6 and then an interlayer insulating film 104 was formed on the TiN film 103-6. Next, a via hole 105 was formed in the interlayer insulating film 104 such that the Al-Cu alloy film 103-5 was exposed in the via hole. Then, on the interlayer insulating film 104 as well as on the inner wall of the via hole 105, Ti film 107-5 and TiN film 107-6 were successively deposited. A W-plug 108 was formed in the via hole 105 and further an Al-Cu film 107-7 was deposited on the TiN film 107-6 such that the Al-Cu film 107-7 was brought into contact with the upper end of the W plug-108. An initial resistance of the via contact through the via hole having a diameter of 0.8 μm was about 0.5Ω which is higher than that of the present invention.

Figure 27:
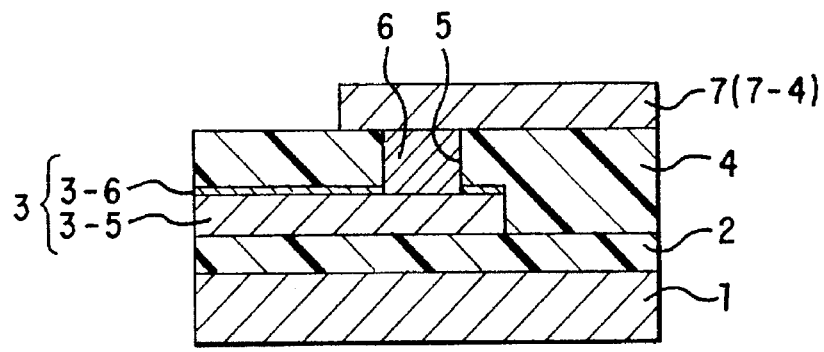
FIG. 27 is a cross sectional view showing an embodiment of the multilevel interconnect structure according to the invention which was used for the electromigration test.
Figure 28:
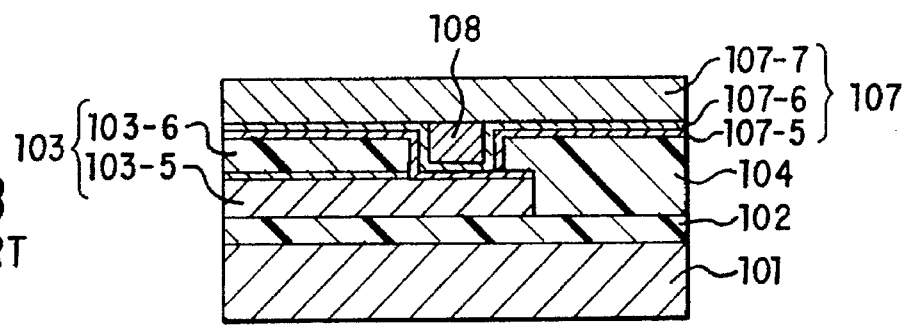
FIG. 28 is a cross sectional view showing a known multilevel interconnect structure which was also used as a comparative sample in the electromigration test.
Figure 29:
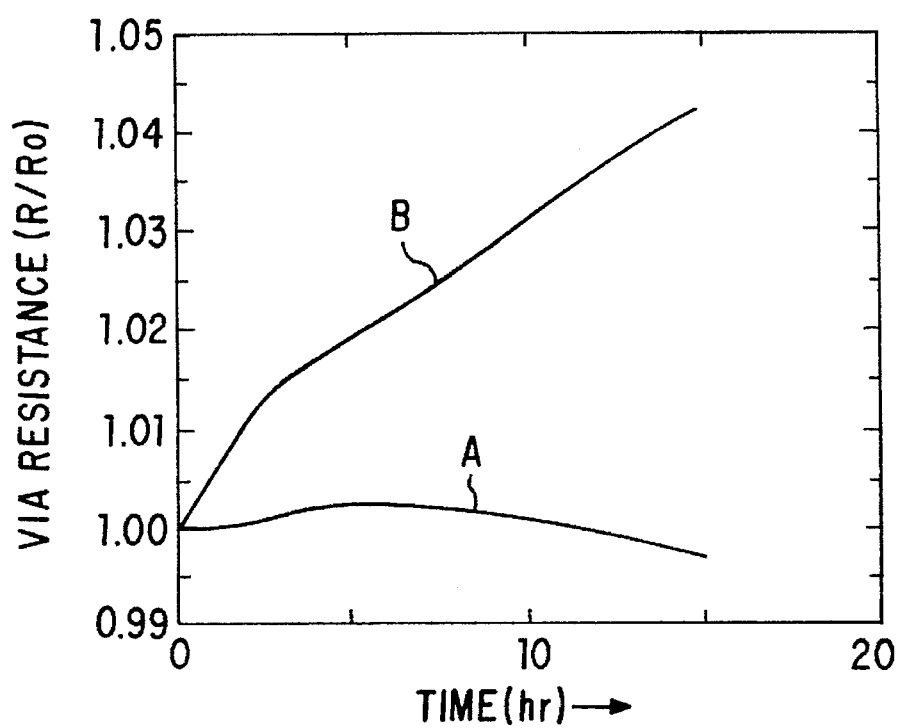
FIG. 29 is a graph representing a result of the electromigration test.

Next the electromigration test was carried out by passing currents through the via portions of the above mentioned multilevel interconnect structures shown in FIGS. 27 and 28. The result of this test is shown in FIG. 29. In FIG. 29 a horizontal axis denotes a time in hour and a vertical axis represents a variation in the via resistance, i.e. a ratio of a via resistance R to the initial via resistance $R_0$.

In the multilevel interconnect structure according to the invention, the via resistance is not substantially changed over fifteen hours as depicted by a curve A, but in the known multilevel interconnect structure, the via resistance increases abruptly from a start of the test as illustrated by a curve B. From the above experiment, it has been confirmed that the multilevel interconnect structure according to the invention has superior initial characteristic and reliability to those of the known multilevel interconnect structure.

Figure 30:
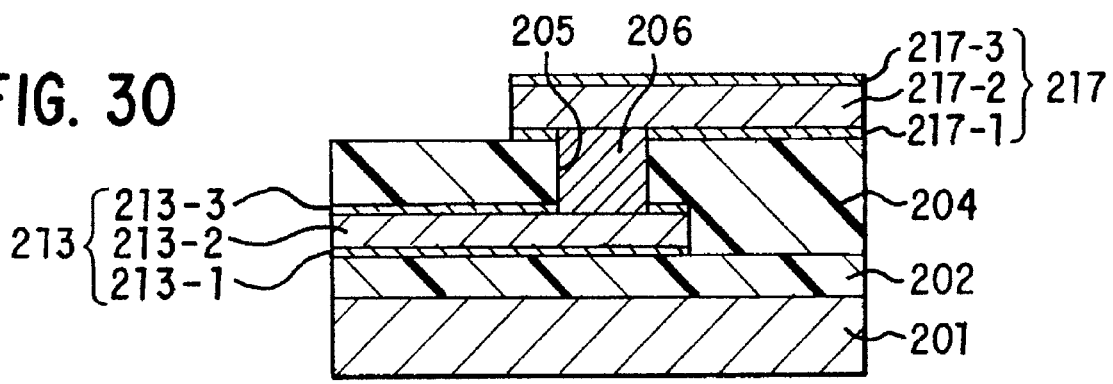
FIG. 30 is a cross sectional view showing an embodiment of the multilevel interconnect structure according to the invention.
Figure 31:
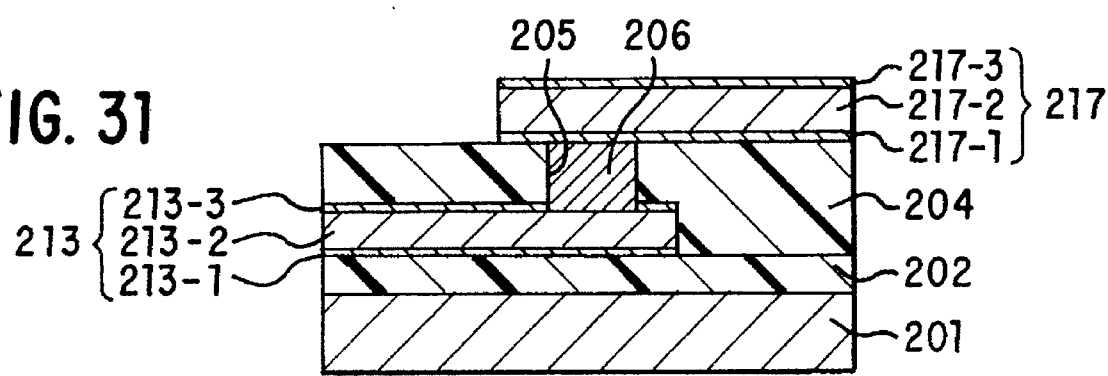
FIG. 31 is a cross sectional view depicting another embodiment of the multilevel interconnect structure according to the invention.
Figure 32:
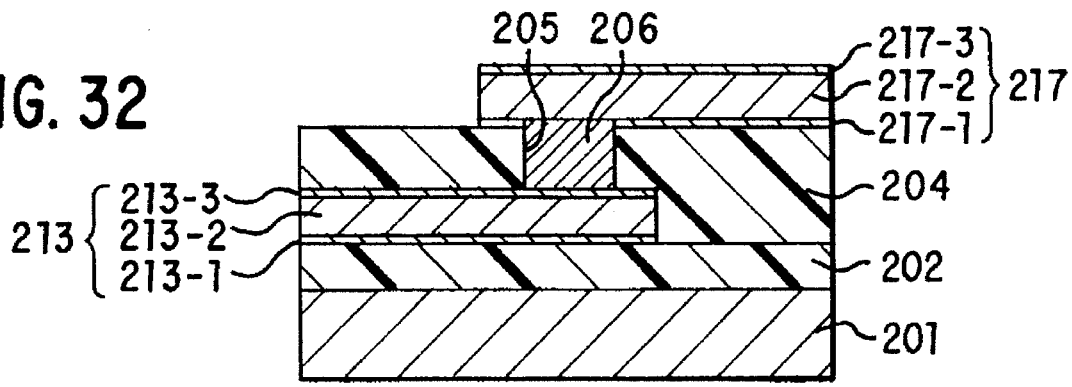
FIG. 32 is a cross sectional view illustrating another embodiment of the multilevel interconnect structure according to the invention.

FIGS. 30, 31 and 32 are cross sectional views showing another embodiments of the multilevel interconnect structure for use in a semiconductor device according to the invention. In the embodiment illustrated in FIG. 30, on a silicon substrate 201, there is formed an underlying insulating film 202, and lower metal wiring 213 and upper metal wiring 217 are formed on the underlying insulating film 202. An interlayer insulating film 204 is formed between the upper and lower metal wirings 213 and 217. The upper and lower metal wirings 213 and 217 have the same construction and TiN films 213-1, 213-3 and 217-1, 217-3 are applied on opposite surfaces of aluminum alloy films 213-2 and 217-2, respectively. The aluminum alloy film 213-2 of the lower metal wiring 213 and the aluminum alloy film 217-2 of the upper metal wiring 217 are interconnected with each other by means of an aluminum plug 206 formed in a via hole 205. That is to say, the aluminum plug 206 is directly brought into contact with the aluminum alloy films 213-2 and 217-2. Compared with the embodiment shown in FIG. 7, in the present embodiment there are provided the high melting point metal alloy films 213-1 and 217-1 on the lower surfaces of the aluminum alloy films 213-2 and 217-2, respectively, so that the reliability of the lower and upper metal wirings 213 and 217 is further improved. Particularly, the TiN film is used as the high melting point metal alloy film, the alignment of the crystal grain of the aluminum alloy films 213-2 and 217-2 is enhanced and thus the reliability for the electromigration can be increased. Furthermore, the TiN film serves as the anti-reflecting film, and therefore the reflectance of the film for the exposing light can be reduced as compared with the TiW film, so that a much finer pattern can be formed accurately.

Figure 1:
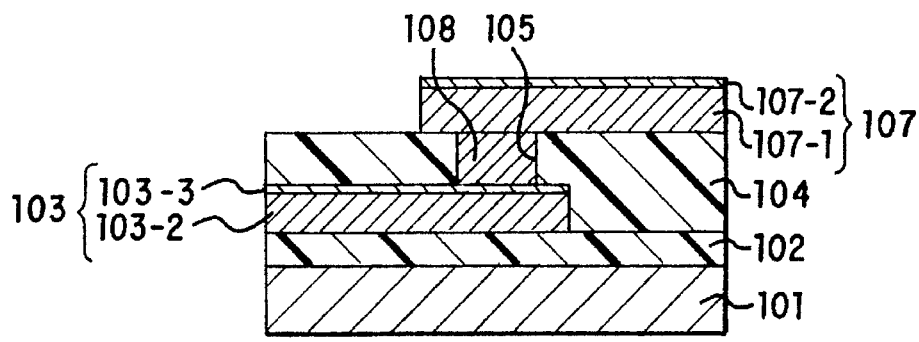
FIG. 1 is a cross sectional view showing a known multilevel interconnect structure for use in LSI having a design rule smaller than 0.6 μm.
Figure 2A:
FIGS. 2A, 2B, 2C, 2D and 2E are cross sectional views illustrating successive steps of a known method of manufacturing the known multilevel interconnect structure shown in FIG. 1.
Figure 2B:
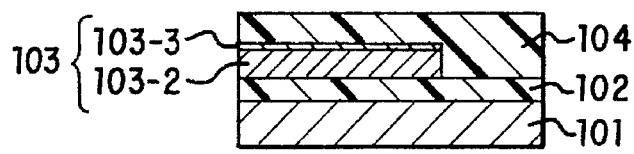
Figure 2C:
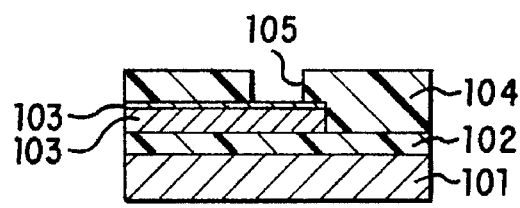
Figure 2D:
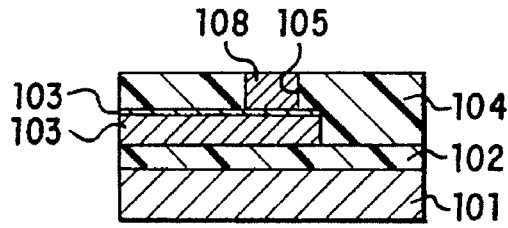
Figure 2E:
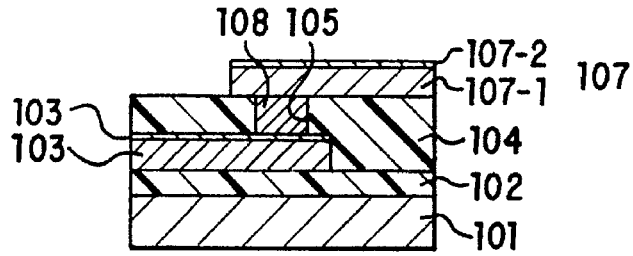
Figure 3:
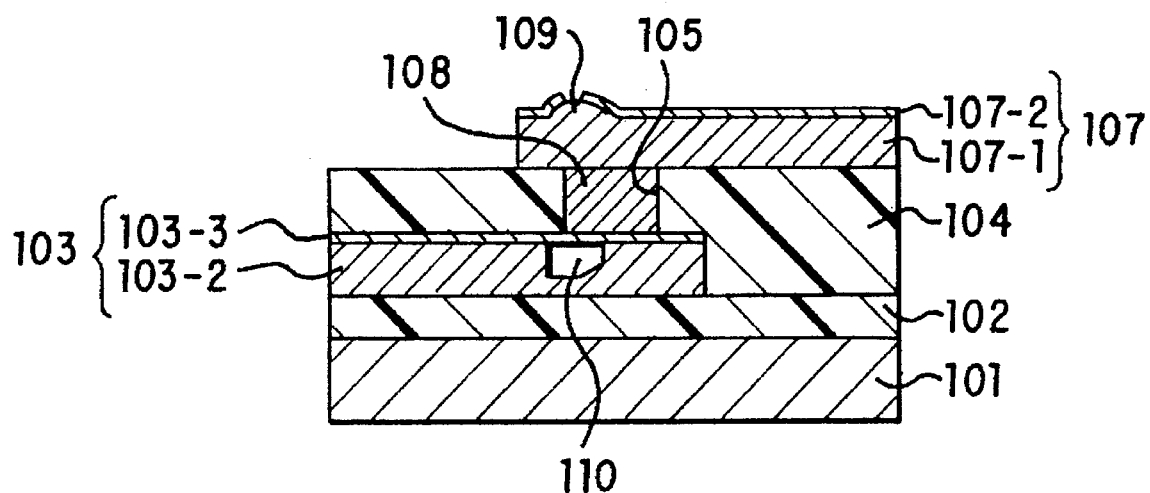
FIG. 3 is a cross sectional view depicting a known multilevel interconnect structure having defects.

In the embodiment shown in FIG. 31, the lower and upper metal wirings 213 and 217 have the same construction as that of the embodiment of FIG. 30 and a lower end surface of the aluminum plug 206 is directly brought into contact with the aluminum alloy film 213-2 of the lower metal wiring 213, but an upper end surface of the aluminum plug 206 is not directly brought into contact with the aluminum alloy film 217-2 of the upper metal wiring 217, but is brought into contact with the TiN film 217-1 of the upper metal wiring. Therefore, in this embodiment, there are formed interfaces between different kinds of metals, i.e. aluminum alloy film 217-2/TiN film 217-1/aluminum plug 206. Due to the existence of such interfaces between different kinds of metals, the contact resistance through the via hole 205 becomes higher and the reliability for the electromigration might be reduced as compared with the embodiment shown in FIG. 30. Therefore, this construction could not be advantageously used in a high speed logic device which requires an extremely low via-contact resistance and in which an electric current having an extremely high density flows through the via hole. However, the present embodiment shown in FIG. 31 is superior to the known device illustrated in FIG. 1 in which a plurality of interfaces between different kinds of metals are existent and the contact resistance is lower than that of the known device. In this manner, the present embodiment is still superior to the known device and its application is wide. For instance, the semiconductor device of the present embodiment may be advantageously applied to DRAM which requires a high integration rather than the high operating speed. As will be apparent later, the semiconductor device shown in FIG. 31 can be manufactured by a rather simple process as compared with the semiconductor device illustrated in FIG. 30. That is to say, the semiconductor device of FIG. 31 may be manufactured by a simple process by adding the formation of the TiN films 213-1 and 217-1 to the process shown in FIGS. 8A to 8E.

In the embodiment shown in FIG. 32, the lower and upper metal wirings 213 and 217 includes the TiN films 213-1 and 217-1 provided on the lower surfaces of the aluminum films 213-2 and 217-2, respectively and the upper end surface of the aluminum plug 206 is directly brought into contact with the aluminum alloy film 217-2 of the upper metal wiring 217. The lower end surface of the aluminum plug 206 is not directly brought into contact with the aluminum alloy film 213-2 of the lower metal wiring 213, but is brought into contact with the TiN film 213-3, so that there is formed the interface between different kinds of metals. This embodiment has the same advantages as those of the embodiment illustrated in FIG. 31. That is to say, the interface between different kinds of metals is limited to the interface between the lower metal wiring 213 and the plug 206 so that the contact resistance is lower than that of the known device, the device can be used for a wide application, the device can be manufactured simply. Particularly, the aluminum alloy film 213-2 is not exposed in the bottom of the via hole 205, the lower metal wiring 213 can be formed at a very high yield.

Figure 33A:
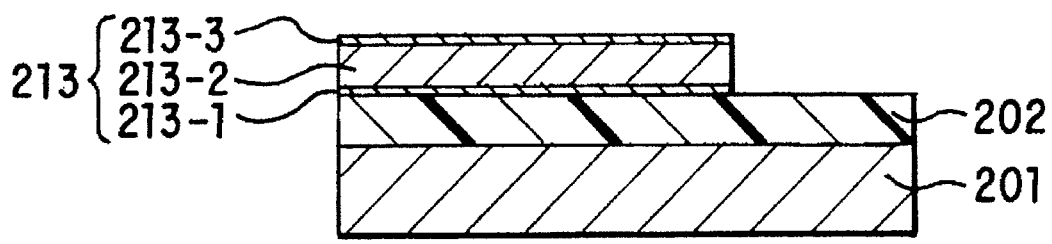
FIGS. 33A to 33F are cross sectional views representing successive steps of an embodiment of the method according to the invention for manufacturing the structure of FIG. 30.

FIGS. 33A to 33F show successive steps for manufacturing the multilevel interconnect structure shown in FIG. 30. On a silicon substrate 201, there is formed an underlaying insulating film 202 and then a TiN film 213-1 having a thickness of 30 to 200 nm is formed on the insulating film 202 by reactive sputtering. Next, an aluminum alloy film 213-2 having a thickness of 300 to 800 nm is formed on the TiN film 213-1 by sputtering and further a TiN film 213-3 having a thickness of 20 to 100 nm is formed on the aluminum alloy film 213-2 by reactive sputtering. Then, a multilayer film of the TiN film 213-1, aluminum alloy film 213-2 and TiN film 213-3 is selectively removed in accordance with a desired pattern to form a lower metal wiring 213 as shown in FIG. 33A. It should be noted that a Ti film having a thickness of 5 to 50 nm may be provided between the insulating film 202 and the TiN film 213-1. This thin Ti film serves to reduce the contact resistance between the lower metal wiring 213 and diffused regions formed in the surface of the silicon substrate 201.

Figure 33B:
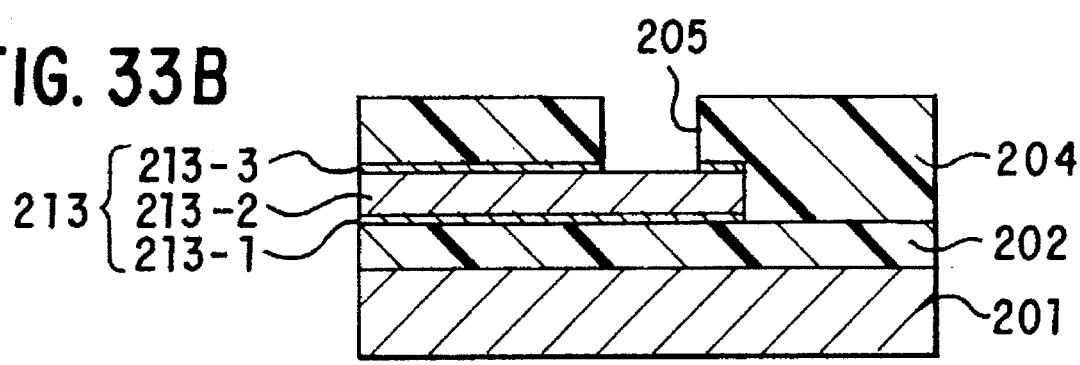

Next, an interlayer insulating film 204 is formed on the insulating film 202 as well as on the lower metal wiring 213, and then a via hole 205 is formed in the interlayer insulating film 204. The TiN film 213-3 exposed on a bottom of the via hole 205 is selectively removed to expose the aluminum alloy film 213-2 as illustrated in FIG. 33B.

Figure 33C:
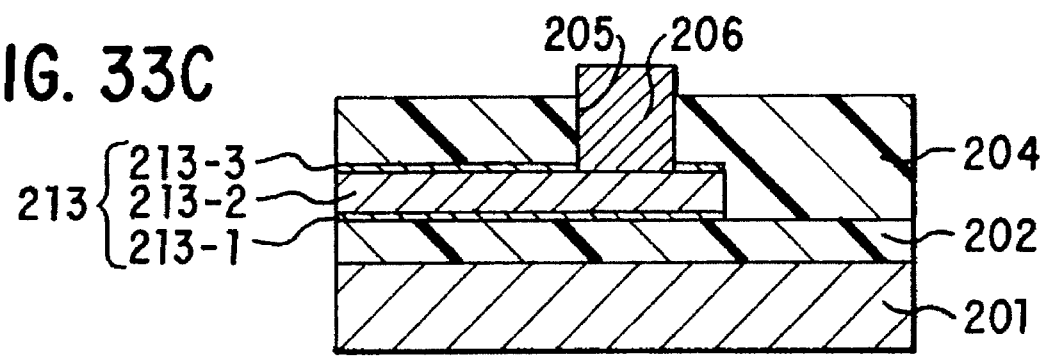
Figure 33D:
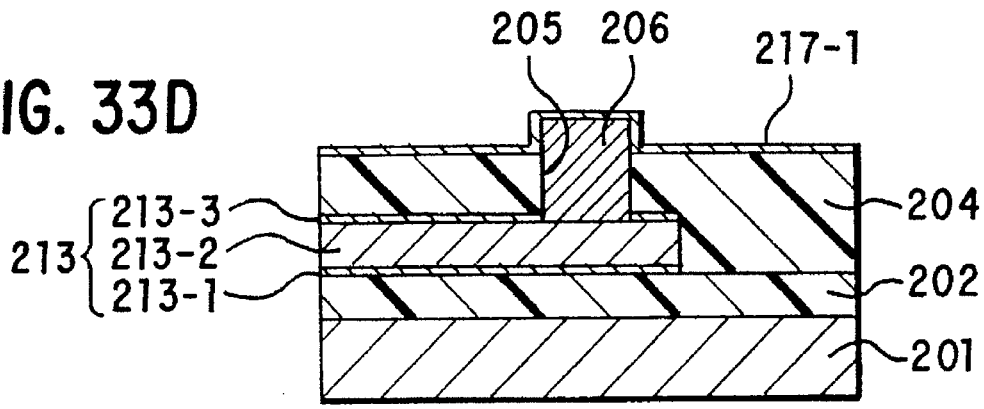
Figure 33E:
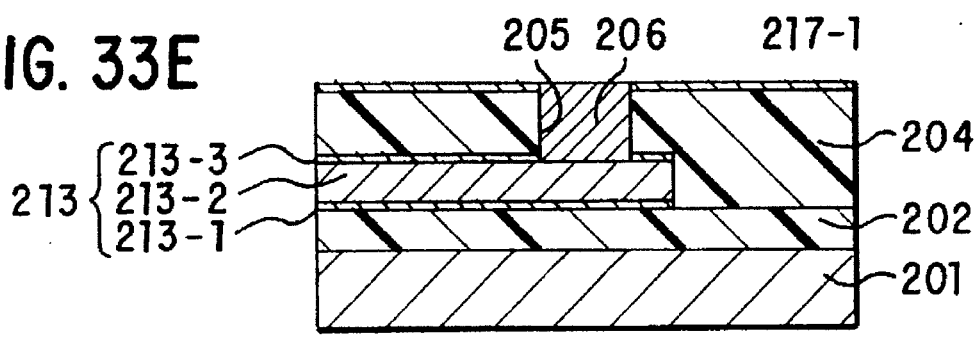

Then, after conducting a surface cleaning treatment, an aluminum plug 206 is selectively formed within the via hole 205 by means of the selective Al-CVD method using DMAH as shown in FIG. 33C. It should be noted that the aluminum plug 206 is formed such that a height of the plug is larger than a depth of the via hole 205 and the plug extrudes from the surface of the interlayer insulating film 204 by 0.2 to 1.0 μm. Then, a TiN film 217-1 is deposited by sputtering as shown in FIG. 33D. Next, a part of the TiN film 217-1 on top surface and side wall of the aluminum plug 206 and a protruding portion of the plug are removed by a chemical mechanical polishing method (CMP method) as illustrated in FIG. 33E. This CMP method may be carried out by using a slurry containing $H_2O_2$ and $H_3PO_4$ as described in U.S. Pat. No. 5,209,816. By using the CMP method, it is possible to selectively remove the TiN film 217-1 formed on the aluminum plug 206 as well as the protruding portion of the aluminum plug itself, so that an upper end surface of the aluminum plug 206 is made flush with the upper surface of the remaining TiN film 217-1 which is deposited on the interlayer insulating film 204.

Figure 33F:
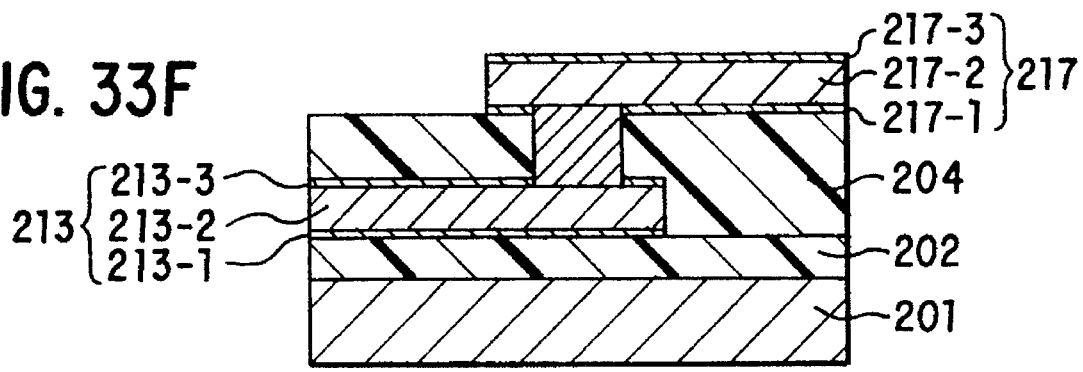

Next, an aluminum alloy film 217-2 having a thickness of 400 to 1000 nm is deposited on the TiN film 217-1 by sputtering and a TiN film 217-3 having a thickness of 20 to 100 nm is deposited on the aluminum alloy film 217-2 by reactive sputtering. Then, the TiN film 217-1, aluminum alloy film 217-2 and TiN film 217-3 are selectively etched in accordance with a desired pattern to form the upper metal wiring 217 as illustrated in FIG. 33F. In this manner, the multilevel interconnect structure shown in FIG. 30 can be manufactured.

In the present embodiment, a part of the aluminum plug 206 protruding from the via hole 205 is removed by the chemical mechanical polishing, so that the via hole can be fully or sufficiently embedded with the aluminum plug even if a depth of the via hole fluctuates. That is to say, the deposition of the aluminum plug 206 is performed such that even in the deepest via hole an aluminum plug protrudes from the via hole, and thus all via holes are fully embedded with the aluminum plugs. After that, the top surfaces of all the aluminum plugs are removed by the chemical mechanical polishing and can be made flush with the top surface of the TiN film 217-1.

It should be noted that the protruding portion of the aluminum plug 206 may be removed by other methods than the chemical mechanical polishing. For instance, at first resist is applied on a whole surface and then the resist is etched by the oxygen plasma such that the upper end of the aluminum plug is exposed. Next, a protruding portion of the aluminum plug and a part of the TiN film 217-1 deposited on the protruding portion of the aluminum plug are removed by the reactive ion etching (RIE) using a chlorine containing gas. However, in this process, if the depth of the via holes fluctuates, all the via holes could not be sufficiently embedded with the aluminum plugs.

It should be further noted that the above mentioned method of depositing the aluminum plug such that it protrudes from the via hole and then a protruding portion of the aluminum plug is removed may be used for manufacturing the semiconductor device which does not comprise the high melting point metal layer such as the TiN film 217-1. Also in this case, all the via holes having various depths can be sufficiently filled with the aluminum plugs or aluminum alloy plugs.

Further, the multilevel interconnect structure shown in FIG. 30 may be formed by the following method. At first, the aluminum plug 206 is formed such that the plug does not protrude from the via hole by controlling the selective Al-CVD time period, and then the TiN film 217-1 is deposited. Next, a resist pattern is formed such that the via hole is exposed, and further an exposed portion of the TiN film 217-1 is selectively removed by a reactive ion etching using $Cl_2$ and $SF_6$. After removing the resist pattern, there are deposited the aluminum alloy film 217-2 and TiN film 217-3 to form the upper metal wiring 217. However, this method has a drawback that the number of resist processes is increased, so that the manufacturing efficiency is reduced. In order to completely remove the TiN film 217-1 deposited on the aluminum plug 206 so that a whole upper end surface of the aluminum plug is brought into contact with the aluminum alloy film 217-2, a size of an aperture formed in the resist film has to be increased to a size of the via hole plus an alignment margin. However, in practice, it is not always necessary to have the whole upper end surface of the aluminum plug 206 brought into contact with the aluminum alloy film 217-2, because a current does not flow uniformly through a whole contact surface, but is locally constricted. This phenomenon has been described by A. Enver and J. J. Clement in "'91 VLSI Multilevel Interconnection Conference", pp. 149, 1990. It has been confirmed that when the mask for pattering the TiN film 217-1 of the upper metal wiring 217 is intentionally shifted in one direction, an area within which the electric current is locally constricted is formed always in the interface between the aluminum plug 206 and the aluminum alloy film 217-2. Therefore, it is possible to use a photomask having the same size as that of the via hole.

Now a manufacturing method utilizing such a phenomenon according to the invention will be explained hereinbelow.

Figure 34A:
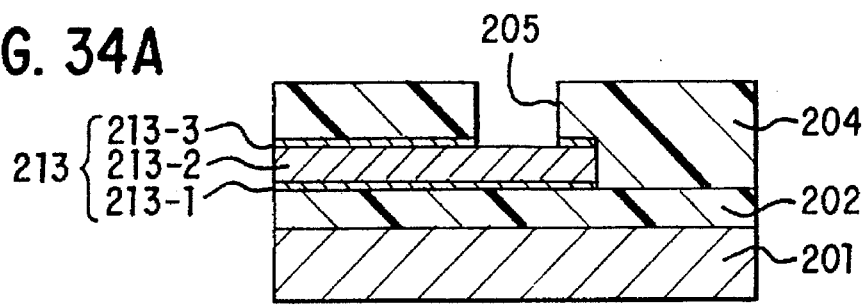
FIGS. 34A to 34E are cross sectional views illustrating successive steps of another embodiment of the method according to the invention for forming the structure shown in FIG. 30.
Figure 34B:
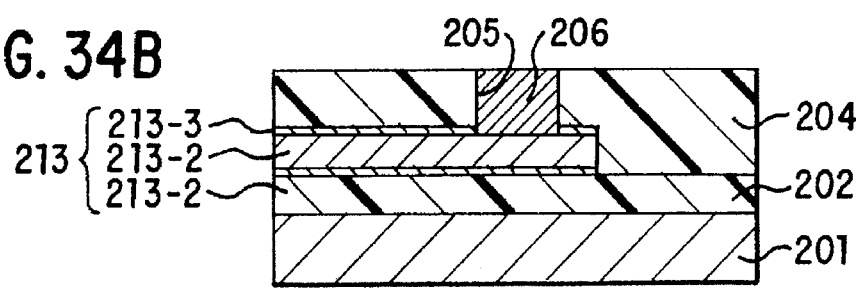
Figure 34C:
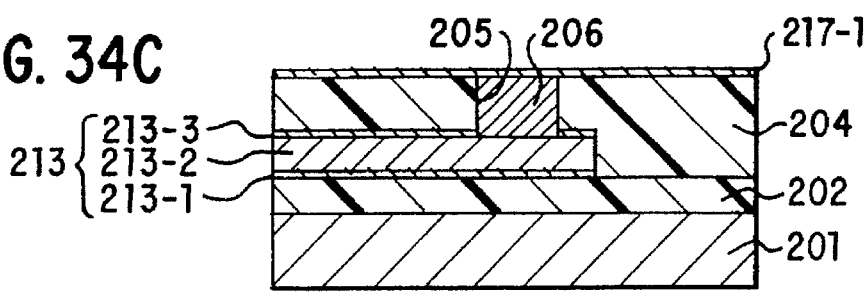
Figure 34D:
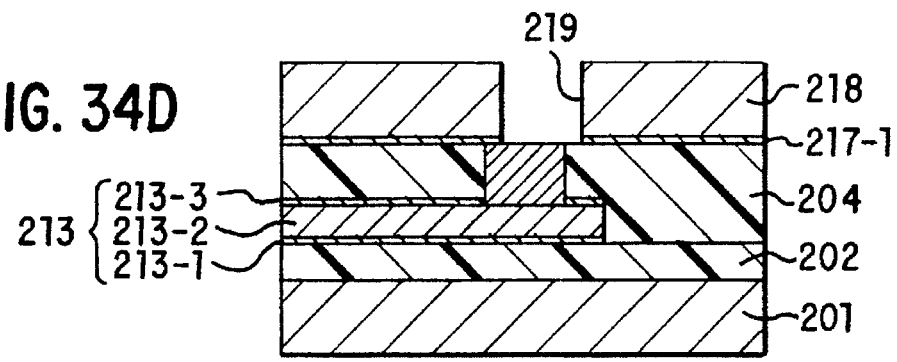
Figure 34E:
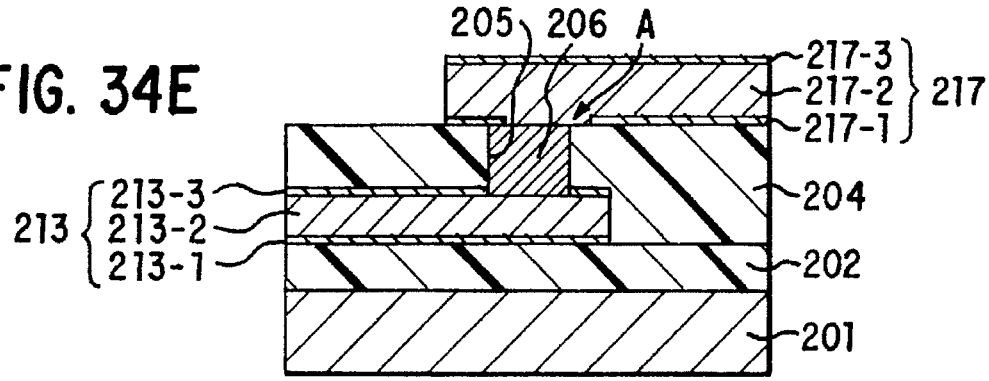

A step shown in FIG. 34A is the same as that illustrated in FIG. 33B. That is to say, a via hole 205 is formed in an interlayer insulating film 204 such that an aluminum alloy film 213-2 of a lower metal wiring 213 is exposed at the bottom of the via hole. Next, the via hole 205 is filled with an aluminum plug 206 as shown in FIG. 34B, and then a TiN film 217-1 is formed on the interlayer insulating film 204 as well as on the top surface of the aluminum plug 206 as depicted in FIG. 34C. Next, a resist 218 is deposited on the TiN film 217-1, and then an aperture 219 is formed in the resist 218 as shown in FIG. 34D. A size of the aperture 219 is identical with a size of the aluminum plug 206, but is shifted toward the right-hand direction with respect to the aluminum plug. Then, a portion of the TiN film 217-1 which is exposed within the bottom of the aperture 219 of the resist 218 is etched away to expose the aluminum plug 206. It should be noted that a left-hand portion of the top surface of the aluminum plug 206 is covered with the TiN film 217-1, but a right-hand portion is completely free from the TiN film 217-1. Then, after removing the resist 218, aluminum alloy film 217-2 and TiN film 217-3 are successively deposited and patterned as depicted in FIG. 34E. In this structure, the electric current is constricted within the right-hand portion of the aluminum plug 206 shown by A and this portion is effectively brought into contact with the aluminum alloy film 217-2, so that the low contact resistance can be realized even by using the photomask having an aperture pattern of the same as that of the via hole.

Figure 35D:
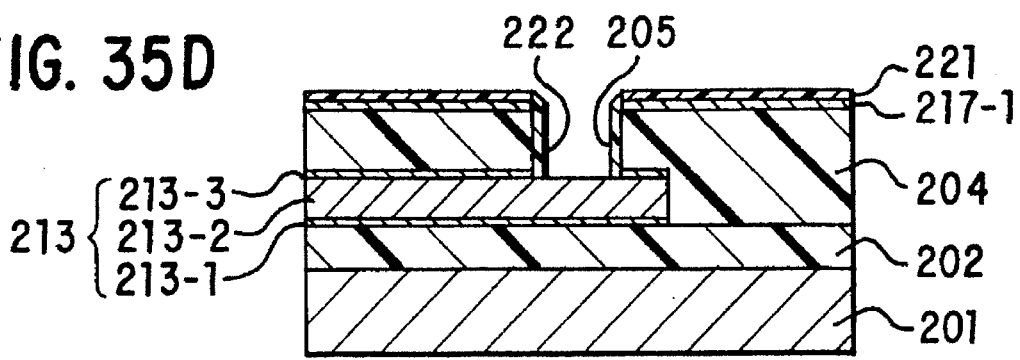

FIGS. 35A to 35F show another embodiment of the method of manufacturing the multilevel interconnect structure illustrated in FIG. 30. As depicted in FIG. 35A, a lower metal wiring 213 is formed on an underlying insulating film 202, an interlayer insulating film 204 is deposited on the lower metal wiring 213 as well as on the underlying insulating film 202, a TiN film 217-1 is formed on the interlayer insulating film 204, and then a p-SiN film 221 having a thickness of 50 to 100 nm is formed on the TiN film 217-1 by a plasma CVD. It should be noted that the films 202, 213, 204 and 217-1 have the same thickness as those of the embodiment shown in FIG. 33.

Next, a via hole 205 is formed in the interlayer insulating film 204 and a TiN film 213-3 exposed in the bottom of the via hole is selectively removed to expose an aluminum alloy film 213-2 of the lower metal wiring 213. The interlayer insulating film 204, TiN film 217-1 and p-SiN film 221 may be etched by a RIE using a fluorine containing gas. For instance, the interlayer insulating film may be removed by the RIE using a mixture of $CHF_3$ gas and $CF_4$ gas and the TiN film and p-SiN film may be etched by RIE using a mixture of $CHF_3$ gas, $CF_4$ gas and $SF_6$ gas.

Next, p-$SiO_2$ film 222 having a thickness of 50 to 200 nm is deposited on a whole surface by the plasma CVD using TEOS and $O_2$ as illustrated in FIG. 35C. Then, the p-$SiO_2$ film 222 deposited on a p-SiN film 221 and on the bottom of the via hole by the RIE using a mixture of $CHF_3$ gas and $CF_4$ gas. By this reactive ion etching process, aluminum alloy film 213-2 of the lower metal wiring 213 is exposed in the bottom of the via hole 205. The p-$SiO_2$ film 222 is remained on the side wall of the via hole 205. Further, the p-SiN film 221 on the TiN film 217-1 is remained, so that the TiN film is not exposed as shown in FIG. 35D.

Figure 35E:
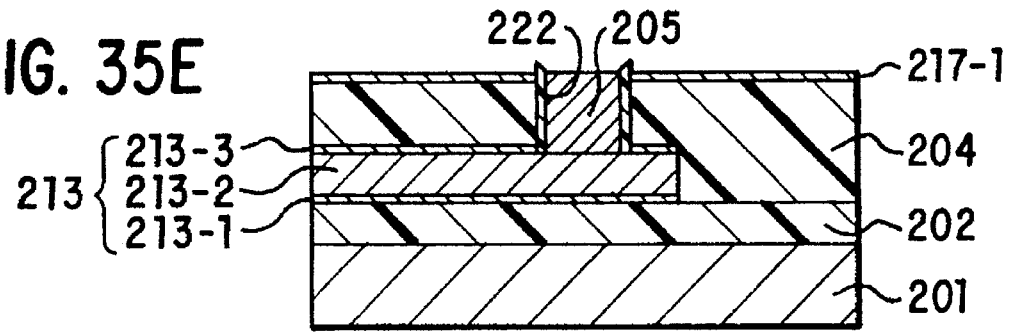
Figure 35F:
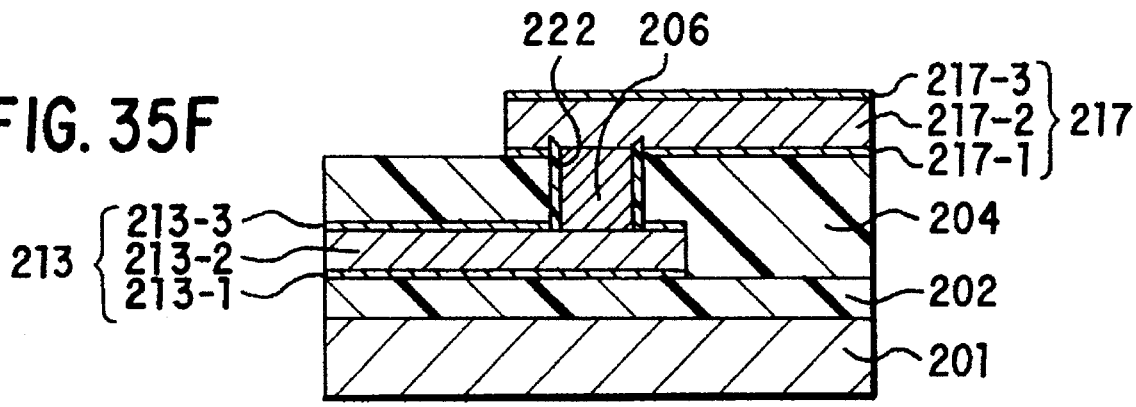

Then, after conducting a surface cleaning process in a usual manner, an aluminum plug 206 is formed by selective Al-CVD process using DMAH, and then the p-SiN film 221 is removed by RIE using a $SF_6$ containing gas for a suitable time period to expose the TiN film 217-1 as shown in FIG. 35E. Then, an aluminum alloy film 217-2 having a thickness of 400 to 1000 nm is deposited by sputtering and the TiN film 217-3 having a thickness of 20 to 100 nm is deposited by reactive sputtering. Finally the films 217-1, 217-2 and 217-3 are etched in accordance with a desired pattern to form the upper metal wiring 217 as shown in FIG. 35F. As compared with the method illustrated in FIGS. 33A to 33F, the manufacturing efficiency of this embodiment is low due to the deposition and etching process of the p-SiN film 221 and p-$SiO_2$ are required, but this method can be performed by the well established techniques without using the chemical mechanical polishing method which has not been widely utilized in actual mass production site.

Figure 36A:
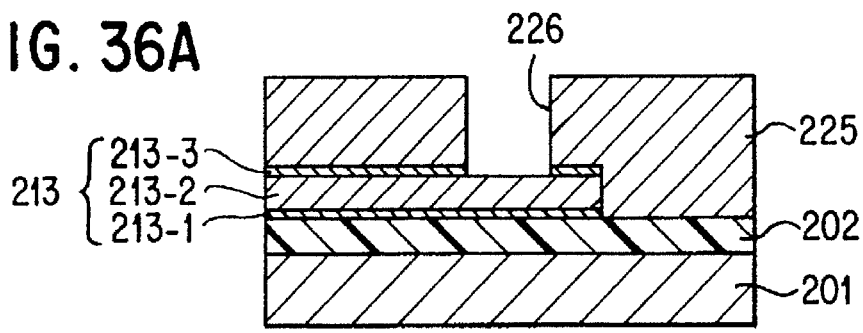
FIGS. 36A to 36E are cross sectional views depicting successive steps of another embodiment of the method according to the invention for manufacturing the structure of FIG. 30.
Figure 36B:
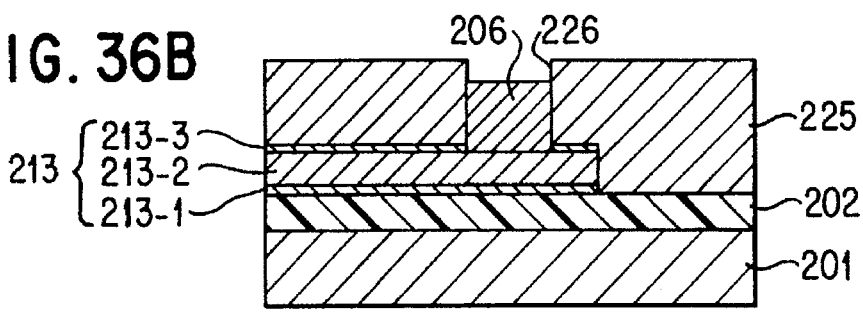
Figure 36C:
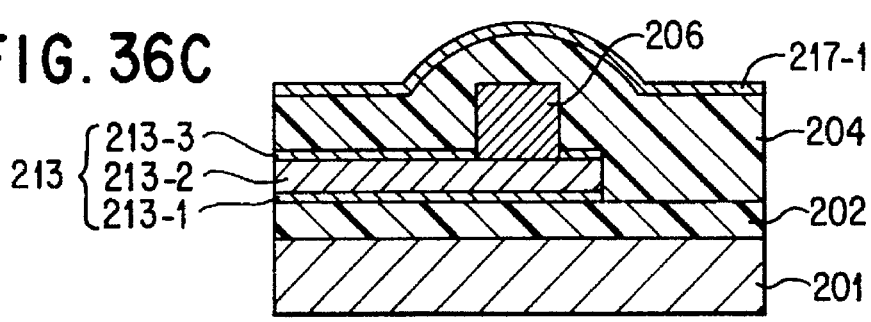

FIGS. 36A to 36E show successive steps of another embodiment of the method of manufacturing the multilevel interconnect structure shown in FIG. 30. As illustrated in FIG. 36A, after forming a lower metal wiring 213 on an underlying insulating film 202, a resist 225 is formed thereon and a hole 226 is formed in the resist. A TiN film 213-3 of the lower metal wiring 213 exposed in the bottom of the hole 226 is removed and the aluminum alloy film 213-2 is exposed. Then, the aluminum plug 206 is formed in the hole 226 by selective Al-CVD as illustrated in FIG. 36B. After removing the resist 225, an interlayer insulating film 204 is deposited as depicted in FIG. 36C. The interlayer insulating film 204 may be formed by the following process. A $SiO_2$ film having a thickness of 100 nm is first formed by the plasma CVD using TEOS and $O_2$, and then a $SiO_2$ film having a thickness of 900 nm is deposited by the atmospheric pressure CVD using TEOS and ozone. Finally, a TiN film 217-1 is deposited by reactive sputtering.

Figure 36D:
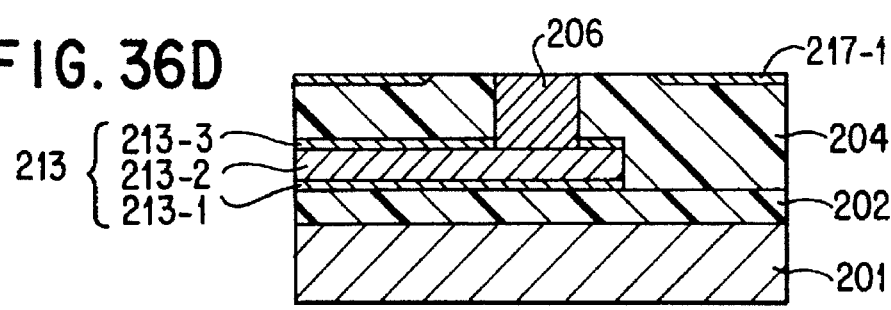

Next, the interlayer insulating film 204 and TiN film 217-1 on the aluminum plug 206 are selectively removed by the chemical mechanical polishing as shown in FIG. 36D. At first, the TiN film 217-1 above the plug 206 is removed by means of a slurry containing $H_2O_2$ and $H_3PO_4$ and then the interlayer insulating film 204 on the plug is removed by using a slurry which contains KOH. In this manner, the top surface of the aluminum plug 206 is exposed, the TiN film 217-1 can be remained at a portion except for the via hole 205 and the interlayer insulating film 204 can be planarized.

Figure 36E:
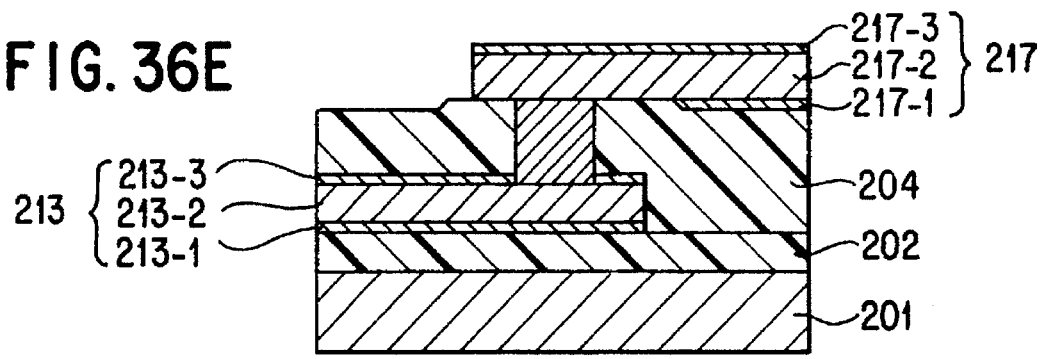

Next, an aluminum alloy film 217-2 having a thickness of 400 to 1000 nm is deposited by sputtering and a TiN film 217-3 having a thickness of 20 to 100 nm is deposited by the reactive sputtering. Finally, the TiN film 217-1, aluminum alloy film 217-2 and TiN film 217-3 are etched in accordance with a desired pattern to form the upper metal wiring 217 as illustrated in FIG. 36E.

In the present embodiment, the TiN film 217-1 surrounding the aluminum plug 206 is removed, but there is not generated a serious problem in the electrical property. Similar to the processes shown in FIG. 12, the interlayer insulating film 204 can be formed by a simple process and the reactive ion etching for forming the via hole is not required.

FIGS. 37A to 37D show successive steps for manufacturing the semiconductor device having the structure shown in FIG. 30, in which the aluminum plug is directly brought into contact with the lower and upper metal wirings. This method is similar to that illustrated in FIGS. 20 to 26 in which the upper metal wiring is formed in a recess provided in an insulating film formed on the interlayer insulating film.

Figure 37A:
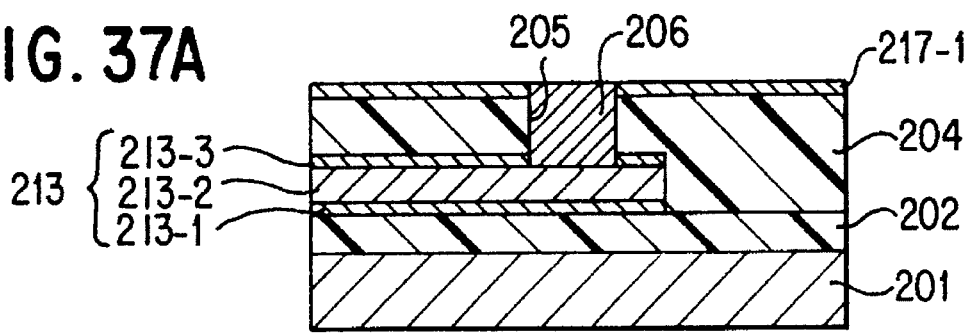
FIGS. 37A to 37D are cross sectional views showing successive steps of another embodiment of the method according to the invention for manufacturing the structure of FIG. 30.
Figure 37B:
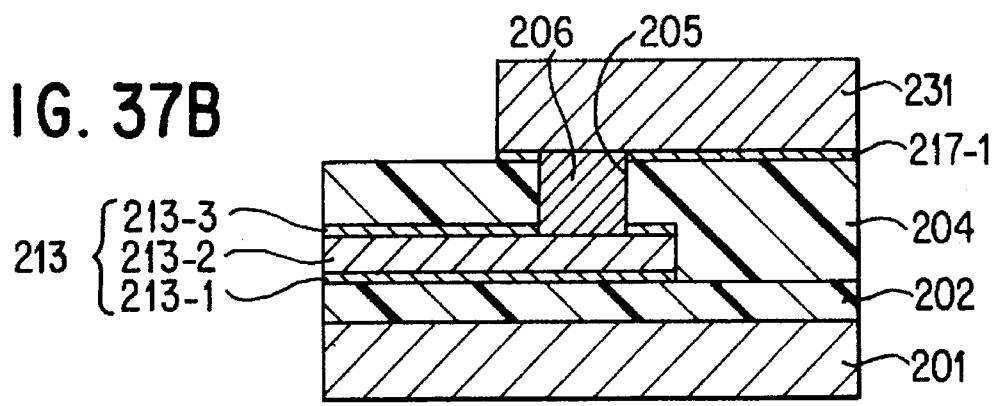

The structure shown in FIG. 37A is obtained by the same processes as those illustrated in FIGS. 33A to 33E. Next, a resist 231 is formed on a TiN film 217-1 as well as on an exposed surface of an aluminum plug 206 as shown in FIG. 37B at such a position that the upper metal wiring is to be formed later. A portion of the TiN film 217-1 which is not covered with the resist 231 is removed by the RIE. In this manner, the TiN film 217-1 is selectively formed in a region at which the upper metal wiring is to be formed later.

Figure 37C:
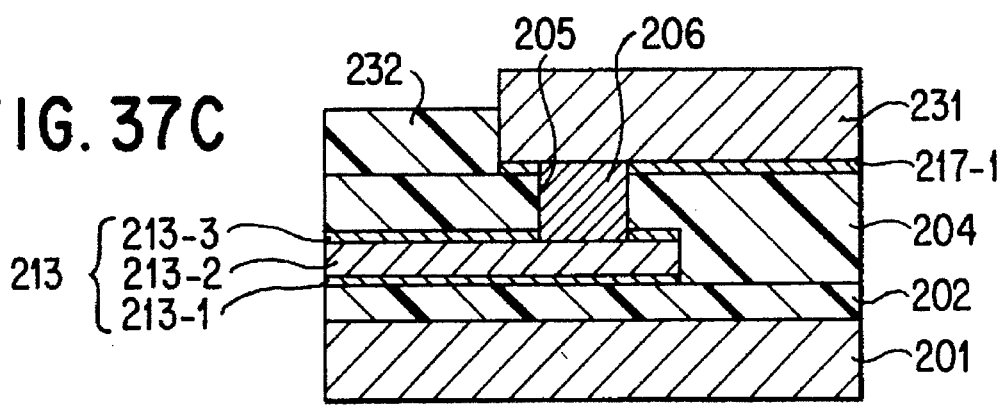

Then, a $SiO_2$ film 232 having a thickness of 0.8 μm is deposited on the exposed TiN film 217-1 by the liquid phase deposition method as shown in FIG. 37C. The deposition of the $SiO_2$ film by the liquid phase deposition method has been described by H. Homma et al in "90 Symposium on VLSI Technology", pp. 3–4, 1990. By this method, it is possible to deposit the $SiO_2$ film selectively on the $SiO_2$ film from a $H_2SiF_6$ solution having saturated $SiO_2$.

Figure 37D:
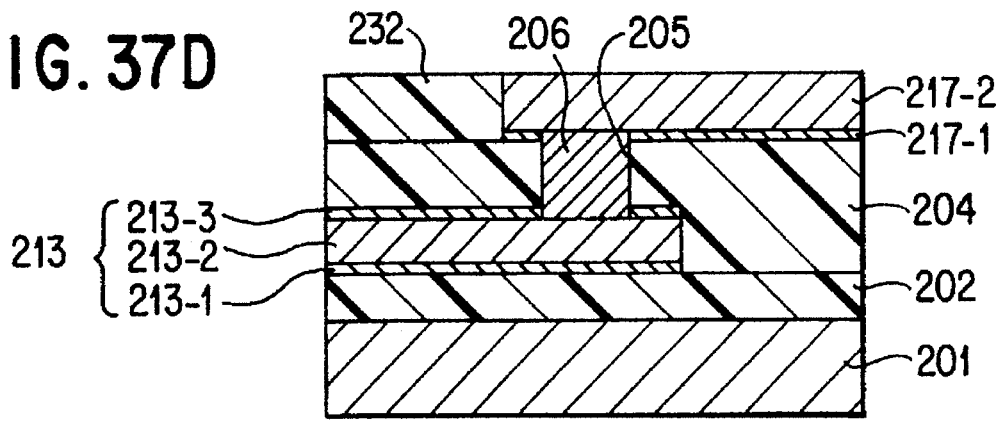

After removing the resist 231, an aluminum alloy film 217-2 is deposited by the selective Al-CVD method as illustrated in FIG. 37D. The aluminum alloy film 217-2 is deposited only on the TiN film 217-1 and exposed upper surface of the aluminum plug 206, so that it is no more necessary to carry out the RIE for patterning the aluminum alloy film. Further, the aluminum alloy film 217-2 is formed to be made flush with the $SiO_2$ film 232, and thus it is not necessary to perform a rather complicated planarizing treatment.

The construction shown in FIG. 37D is different from that illustrated in FIG. 30 in a point that the TiN film 217-3 is not provided in the upper metal wiring 217. The main purpose of this TiN film 217-3 is to reduce the reflectance of the upper metal wiring for the exposing light for patterning the upper metal wiring, and in the present embodiment, this patterning is not required. Therefore, the lack of the uppermost TiN film 217-3 in the upper metal wiring 217 does not cause any problem. Furthermore, if it is required to provided a high melting point metal or metal alloy film in order to improve the reliability of the upper metal wiring, a tungsten film may be deposited on the aluminum alloy film 217-2 by the selective W-CVD method.

It should be further noted that the structure shown in FIG. 37A may be formed by the processes illustrated in FIGS. 35 and 36. Moreover, after the plug 206 has been formed, the TiN film may be deposited on the interlayer insulating film 204 as well as on the plug and then the processes shown in FIGS. 37B–37D may be carried out. Then, it is possible to obtain the semiconductor device having the structure illustrated in FIG. 31, in which only the lower end of the plug is directly brought into contact with the aluminum or aluminum alloy film of the lower metal wiring.

Now another embodiments of the method for manufacturing the multilevel interconnect structure, in which the insulating film is formed on the interlayer insulating film in the area outside the upper metal wiring will be explained.

FIGS. 38A to 38G are cross sectional views showing successive steps of an embodiment of the method according to the invention, in which the insulating film is formed in the area outside the upper metal wiring. At first, lower metal wiring 213, interlayer insulating film 204, via hole 205 and aluminum plug 206 are formed by the same processes as those shown in FIGS. 33A to 33C. Then, a TiN film 217-1 is deposited and a part of the TiN film 217-1 and plug 206 are removed to obtain the structure depicted in FIG. 38A.

Figure 38A:
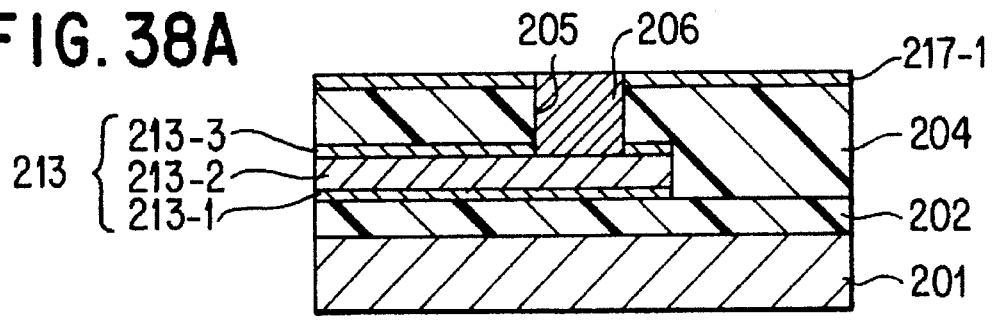
FIGS. 38A to 38G are cross sectional views representing successive steps of an embodiment of the method according to the invention for manufacturing the structure illustrated in FIG. 30.
Figure 38B:
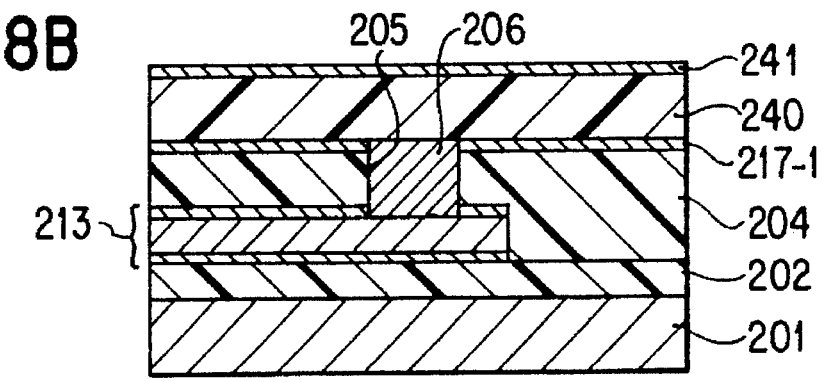
Figure 38C:
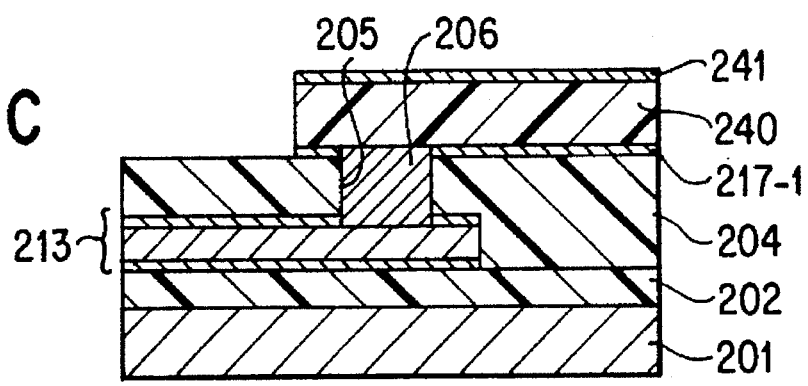

Next, a polyimide film 240 having a thickness of 0.5–1.2 μm is applied on the surface and is polymerized by heating, and then a SiN film 241 having a thickness of 50–200 nm is deposited on the polyimide film 240 as illustrated in FIG. 38B. Next a resist is applied on the SiN film 241 and is shaped such that the resist is remained in an area in which the upper metal wiring is to be formed later and a portion of the SiN film 241 which is not covered with the resist is removed by the reactive ion etching using a fluorine containing gas. After that, a portion of the polyimide film 240 is etched by the reactive ion etching using an oxygen gas. Next, a portion of the TiN film 217-1 which is not covered with the polyimide film is removed by the plasma etching using a gas atmosphere containing $SF_6$ and $BCl_3$. In this manner, a structure shown in FIG. 38C can be obtained.

Figure 38D:
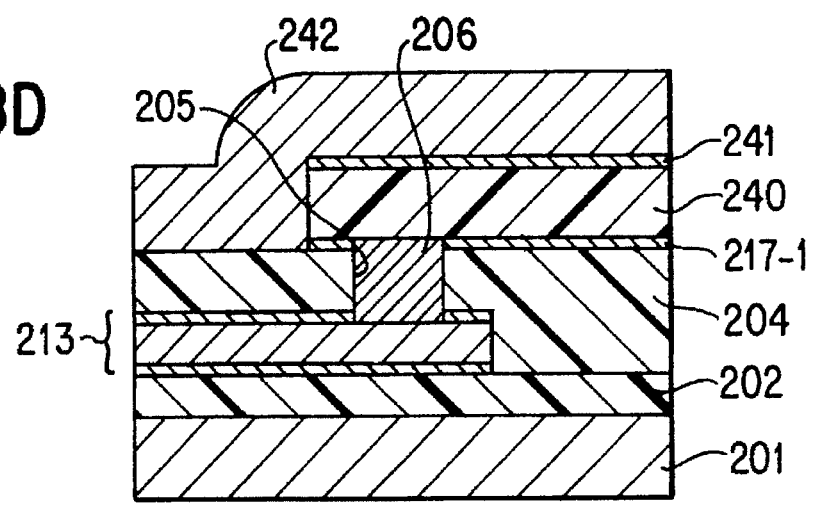
Figure 38E:
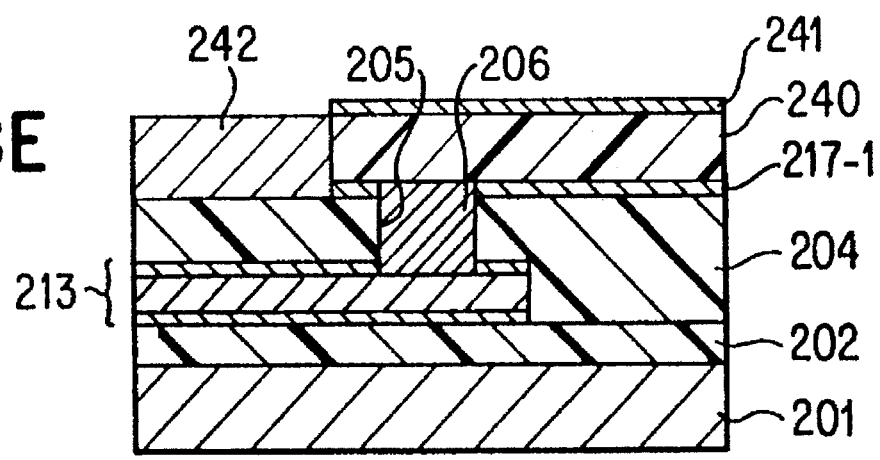
Figure 38F:
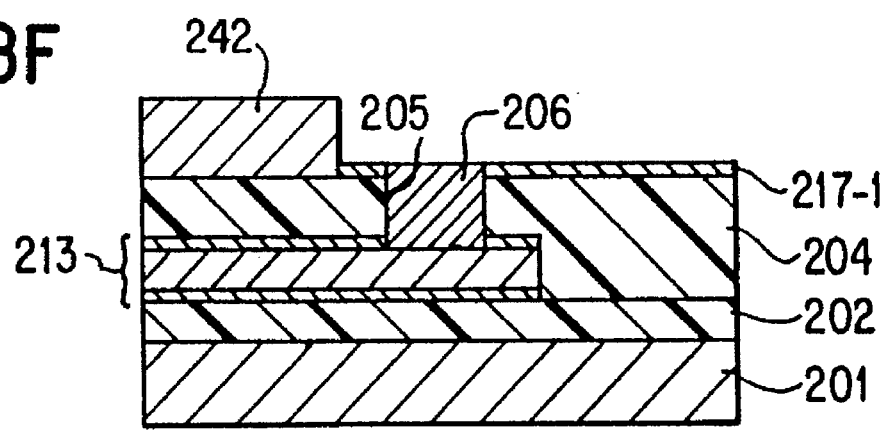

Next, a $SiO_2$ film 242 having a thickness of 0.5–2.0 μm is deposited on the surface by means of the plasma CVD using TEOS and oxygen and the atmospheric pressure CVD using TEOS and ozone as depicted in FIG. 38D. The thickness of the $SiO_2$ film 242 is preferably set to be equal to or thicker than a sum of the thicknesses of the polyimide film 240 and SiN film 241. Then, the $SiO_2$ film 242 is etched by the chemical mechanical polishing until the SiN film 241 is exposed. In this case, the $SiO_2$ film 242 on the SiN film 241 is predominantly etched, so that the $SiO_2$ film 242 is partially remained in a region outside the polyimide film 240 such that a thickness of the $SiO_2$ film 242 is substantially equal to a sum of thicknesses of the polyimide film 240 and TiN film 217-1 as illustrated in FIG. 38E. Then, the SiN film 241 is removed by the reactive ion etching using a fluorine containing gas and the polyimide film 240 is removed by the reactive ion etching using an oxygen gas as shown in FIG. 38F. In this manner, it is possible to obtain the structure in which the $SiO_2$ film 242 is locally formed in the region outside a region in which the upper metal wiring is to be formed later.

Figure 38G:
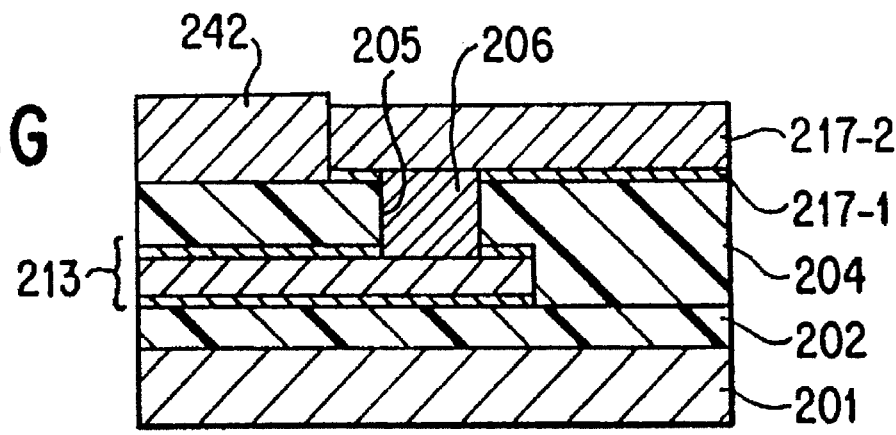

Finally, an aluminum alloy film 217-2 is formed on the surface of the TiN film 217-1 by the selective Al-CVD as shown in FIG. 38G to form the upper metal wiring 217.

As compared with the embodiment shown in FIG. 37, the present embodiment requires a larger number of steps and has a low processing efficiency, but this embodiment does not require the liquid phase deposition which has been scarcely used in the actual manufacturing.

FIGS. 39A to 39G are cross sectional views showing successive steps of an embodiment of the method according to the invention. The present embodiment is applied to the formation of the multilevel interconnect structure shown in FIG. 31, in which the lower end of the plug is directly brought into contact with the aluminum alloy film of the lower metal wiring and the upper end of the plug is connected to the aluminum alloy film by means of the TiN film.

Figure 39A:
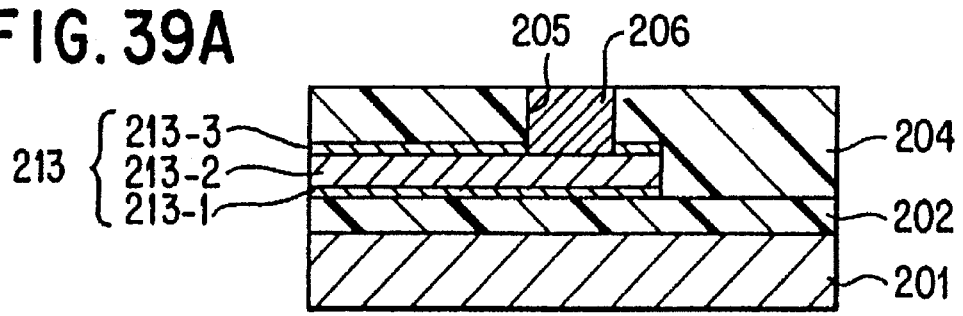
FIGS. 39A to 39G are cross sectional views showing successive steps of an embodiment of the method according to the invention for forming the structure illustrated in FIG. 31.
Figure 39B:
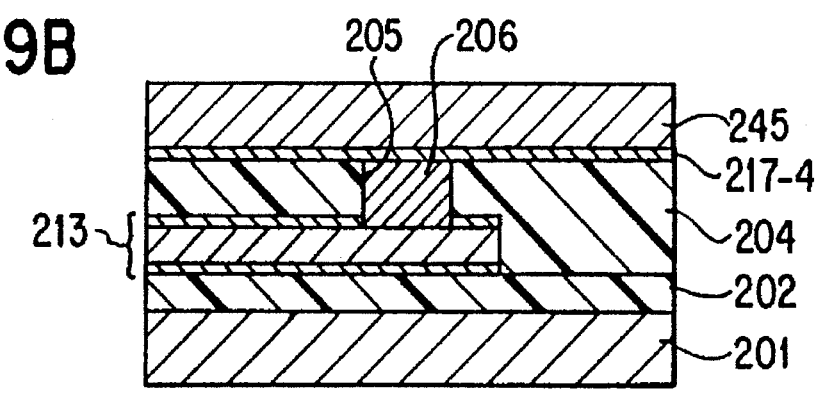
Figure 39C:
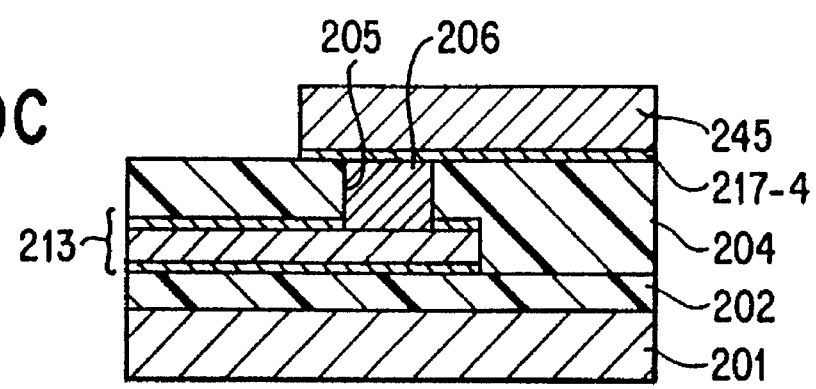

At first, lower metal wiring 213, interlayer insulating film 204 and via hole 205 are formed and then an aluminum plug 206 is formed such that the plug does not protrude from the surface of the interlayer insulating film as shown in FIG. 39A. Then, Ti and TiN films are successively deposited to form a TiN/Ti film 217-4 and then a $SiO_2$ film 245 is deposited successively as illustrated in FIG. 39B. Then, the TiN/Ti film 217-4 and $SiO_2$ film 245 are selectively removed by the usual photolithography and reactive ion etching such that these films are remained in a region in which the upper metal wiring is to be formed later as depicted in FIG. 39C.

Figure 39D:
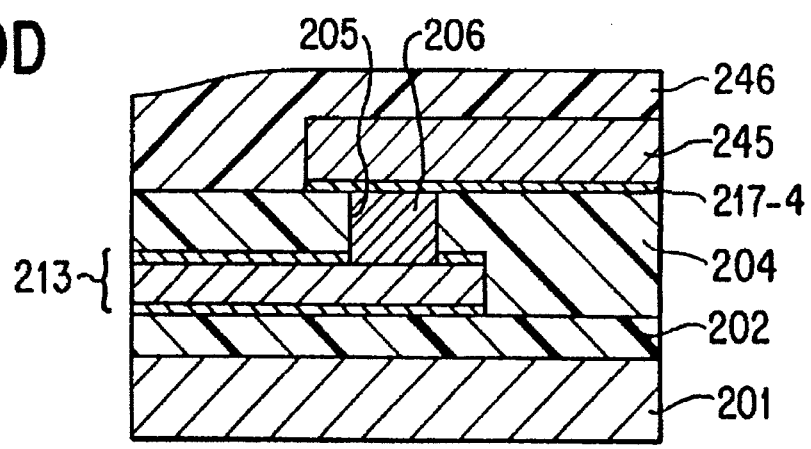
Figure 39E:
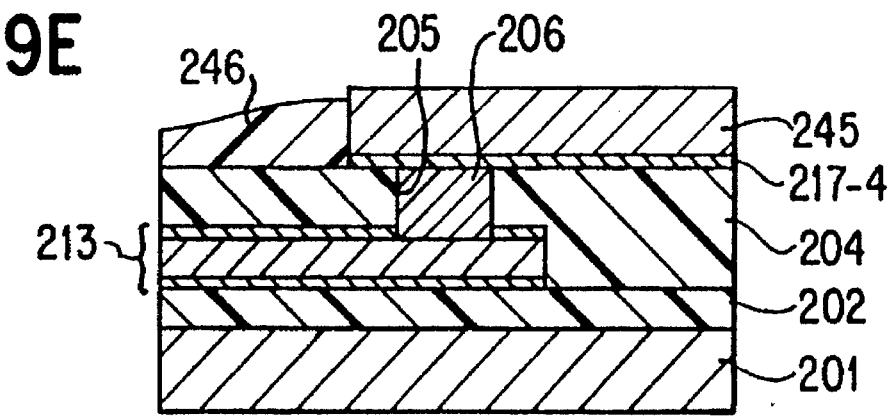

Next, a polyimide film 246 is applied on the surface and is polymerized by heating to obtain the structure shown in FIG. 39D. Then, the polyimide film 246 is etched back by the reactive ion etching using an oxygen gas until the SiO$_2$ film 245 is exposed as shown in FIG. 39E. By this process, the polyimide film 246 is remained in a region outside the upper metal wiring.

Figure 39F:
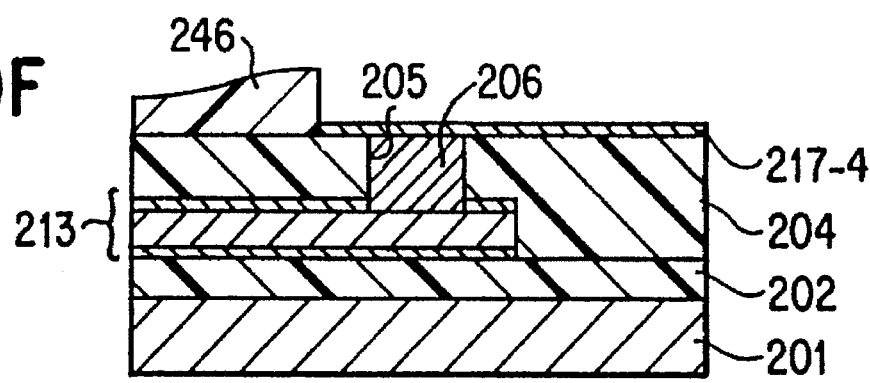
Figure 39G:
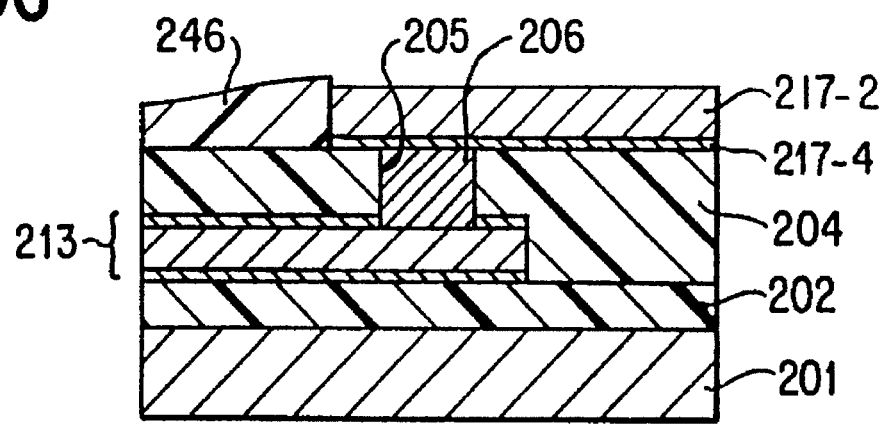

Next, the SiO$_2$ film 245 is removed by the reactive ion etching using a fluorine containing gas to expose the TiN/Ti film 217-4 as illustrated in FIG. 39F. Finally, an aluminum alloy film 217-2 is deposited on the TiN/Ti film 217-4 by the selective Al-CVD as shown in FIG. 39G.

In the present embodiment, the polyimide film 246 having a dielectric constant smaller than that of the silicon dioxide is provided between the upper metal wiring patterns, and thus the electrostatic capacitance between the metal wiring patterns can be reduced. Therefore, this method is advantageously used to manufacture LSI devices which require a high operation speed.

FIGS. 40A to 40G are cross sectional views showing successive steps of another embodiment of the method according to the invention, in which the multilevel interconnect structure illustrated in FIG. 32 is formed by utilizing the processes of the embodiment depicted in FIG. 38. In this structure, upper end of the plug is directly brought into contact with the aluminum alloy film of the upper metal wiring and the lower end is connected to the aluminum alloy film via the TiN film.

Figure 40A:
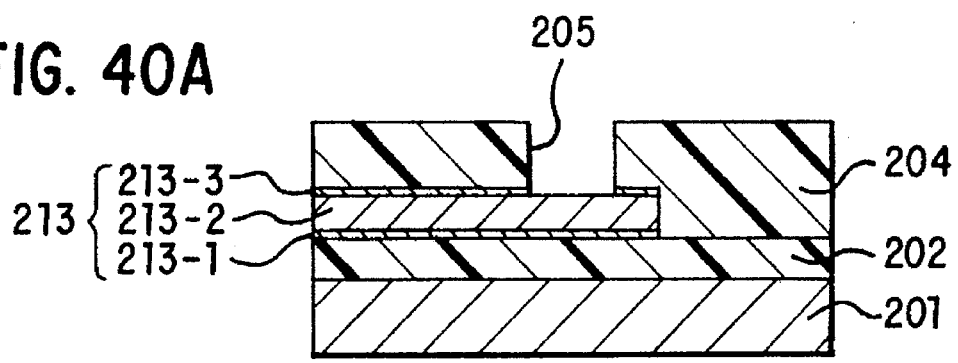
FIGS. 40A to 40D are cross sectional views depicting successive steps of another embodiment of the method according to the invention for forming the structure illustrated in FIG. 32.
Figure 40B:
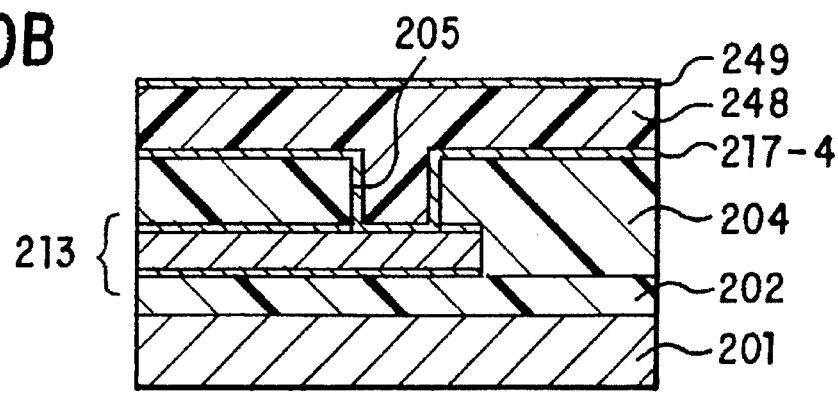
Figure 40C:
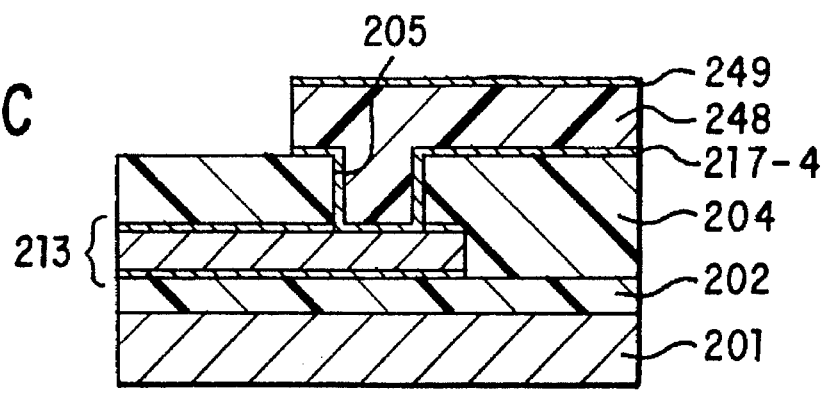

As shown in FIG. 40A, lower metal wiring 213 and interlayer insulating film 204 are formed and then a via hole 205 is formed in the insulating film 204. Prior to forming the plug, a TiN/Ti film 247 is deposited and then a polyimide film 248 is deposited and is polymerized by heating. Then, a SiN film 249 is deposited on the polyimide film as represented in FIG. 40B. Next, the TiN/Ti film 217-4, polyimide film 248 and SiN film 249 are selectively removed such that the these films are remained only in a region in which the upper metal wiring and the plug are to be formed later as shown in FIG. 40C.

Figure 40D:
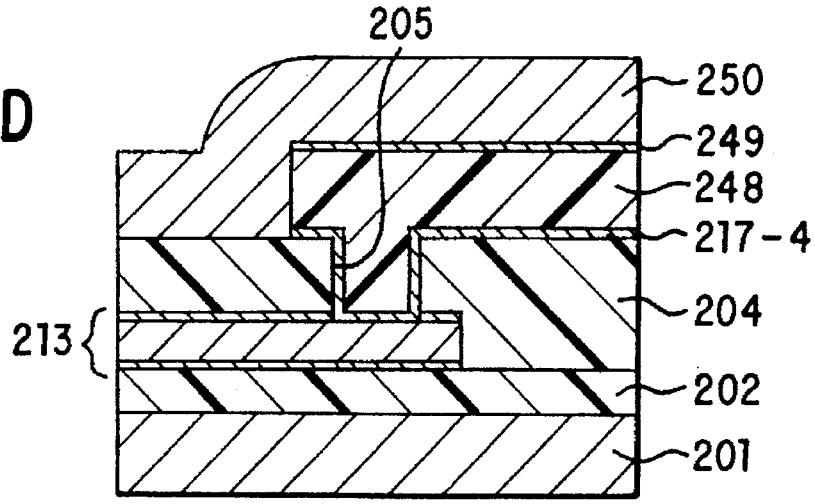
Figure 40E:
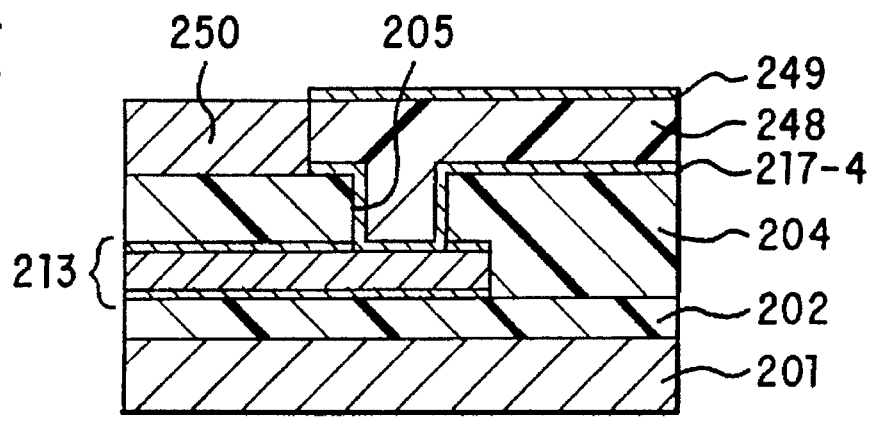
Figure 40F:
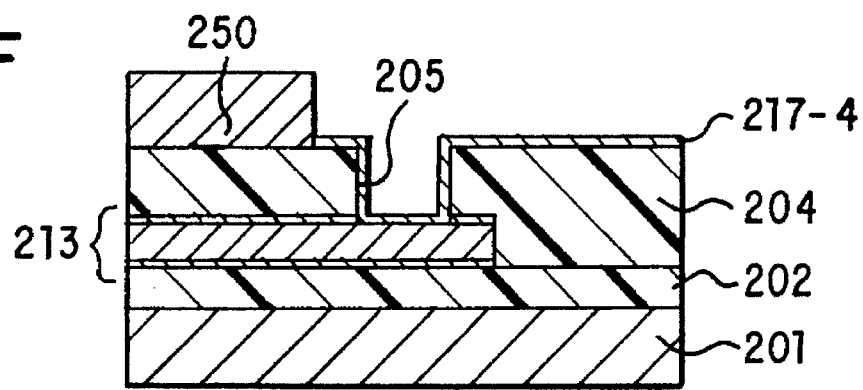

Next, a SiO$_2$ film 250 having a thickness of 0.5–2.0 μm is deposited as shown in FIG. 40D and then the SiO$_2$ film 250 is etched by the chemical mechanical polishing until the SiN film 249 is exposed as illustrated in FIG. 40E. Then, the SiN film 249 and polyimide film 248 are removed to obtain the structure shown in FIG. 40F, in which the SiO$_2$ film 250 is existent only in a region outside the upper metal wiring which will be formed later.

Figure 40G:
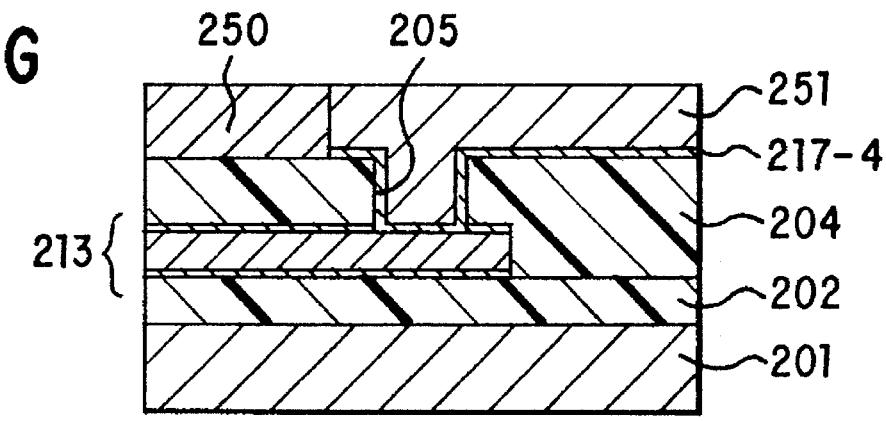

Finally, an aluminum alloy film 251 is formed on the TiN/Ti film 217-4 by the selective Al-CVD as shown in FIG. 40G, said aluminum alloy film forming the plug and the upper metal wiring.

In the present embodiment, both the plug and upper metal wiring are formed simultaneously, and therefore the manufacturing efficiency can be improved.

FIGS. 41A to 41D are cross sectional views showing successive steps of another embodiment of the method according to the invention. The present embodiment is applicable to manufacture a multilevel interconnect structure similar to that shown in FIG. 4, but in the present embodiment, the underlaying insulating film 202 is not flat, but has protrusions and depressions. In actual LSIs, field isolation oxide films and MOS-FET constructions are formed in a surface of silicon wafers, the surface of the underlaying insulating film is not flat.

At first, lower metal wiring 213 and interlayer insulating film 204 are formed by a process similar to that illustrated in FIG. 5. However, in the present embodiment, TiN film 213-1 is used instead of the TiW film 3-1. It should be noted that the top surface of the interlayer insulating film 204 becomes rather flat. This means that a thickness of the insulating film 204 varies depending upon positions. Such an interlayer insulating film 204 having the flat surface may be formed by the following process. At first, a first SiO$_2$ film having a thickness of 100 nm is deposited by the plasma CVD using TEOS and oxygen gas, and then a second SiO$_2$ film having a thickness of 1.0 μm is deposited by the atmospheric pressure CVD using TEOS and ozone gas. Next, a SOG film is deposited and thermally processed. Next, the etch back is performed using a fluorine containing plasma such that the SOG film and the TEOS-O$_3$ CVD film are etched back substantially the at same rate. The etch back is terminated when the thickness of the TEOS-O$_3$ SiO$_2$ film at the protrusion, i.e. the thickness at the thin portion becomes 0.2 μm. Finally, a SiO$_2$ film having a thickness of 0.8 μm is deposited by the plasma CVD using TEOS and oxygen gas. Alternatively, a first SiO$_2$ film having a thickness of 100 nm is deposited by the plasma CVD using TEOS and oxygen gas, a second SiO$_2$ film having a thickness of 1.0 μm is deposited by the atmospheric pressure CVD using TEOS and ozone gas, a third SiO$_2$ film having a thickness of 1.5 μm is deposited by the plasma CVD using TEOS and oxygen gas, and then the TEOS-O$_3$ SiO$_2$ film is etched back by the chemical mechanical polishing such that the SiO$_2$ film has a thickness of 1.0 μm at protrusions.

Figure 41A:
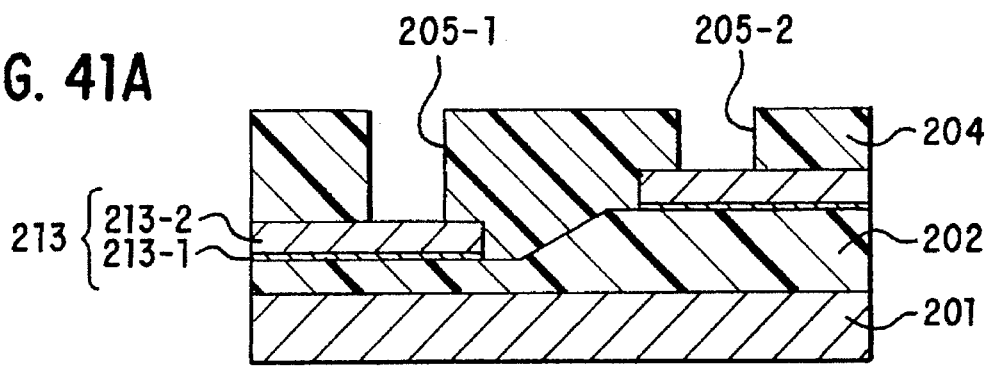
FIGS. 41A to 41D are cross sectional views illustrating an embodiment of the method according to the invention for manufacturing the structure of FIG. 4.
Figure 41B:
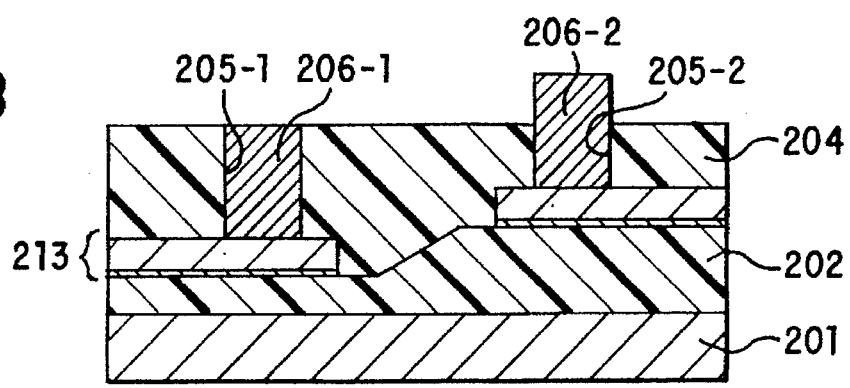

Next, via holes 205-1 and 205-2 are formed in the interlayer insulating film 204. It should be noted that a depth of the via holes also varies in accordance with a variation in a thickness of the interlayer insulating film 204. Then, aluminum plugs 206-1 and 206-2 are formed in the via holes by the selective Al-CVD method. In this case, the deposition is carried out such that the deeper via hole 205-1 is sufficiently embedded with the plug 206-1, so that the plug 206-2 in the shallow via hole 205-2 protrudes from the surface of the insulating film 204 as illustrated in FIG. 41B.

Figure 41C:
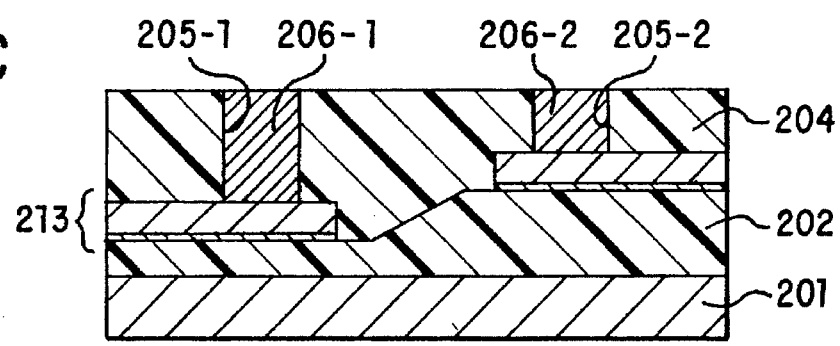

Next, a part of the plug 206-2 is removed by the chemical mechanical polishing such that the top surface of the plug 206-2 becomes flush with the surface of the interlayer insulating film 204 as depicted in FIG. 41C.

Figure 41D:
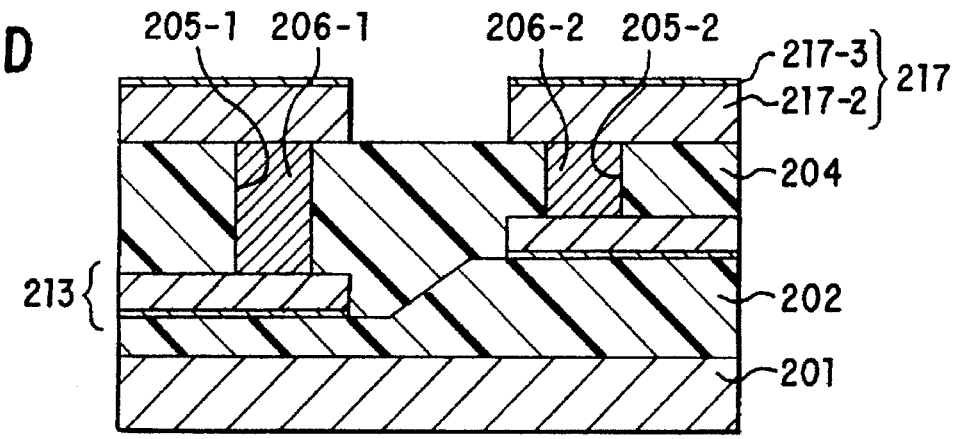

Finally, aluminum alloy film 217-2 and TiN film 217-3 are successively deposited, and then these films are etched into a desired pattern to form the upper metal wiring 217 as shown in FIG. 41D. In this manner, in the present embodiment, the plugs are formed such that top portions thereof are protruded from the surface of the interlayer insulating film and then the protruding portions of the plugs are removed. Therefore, the via holes having various depths can be sufficiently embedded with the plugs.

In an actual process, it would be rather difficult to establish an ideal condition for the selective Al-CVD method, and thus fine aluminum grains or particles might be deposited on the surface of the interlayer insulating film. If the upper metal wiring is formed on such aluminum particles, the patterning precision and yield might be reduced. During the chemical mechanical polishing for removing the protruded portions of the plugs, the aluminum grains on the surface of the interlayer insulating film are also removed, so that the patterning precision and yield can be improved.

It should be further noted that it would be practically impossible to make the deposition rate in the Al-CVD perfectly identical or constant over the whole surface of the wafer. Therefore, even though the fluctuation in the depth of the via holes is negligibly small, top portions of certain plugs might protrude when the Al-CVD time period is set such that all the via holes are fully embedded with the plugs. Even in such a case, the protruding portions of the plugs can be effectively removed by the CMP.

Figure 42A:
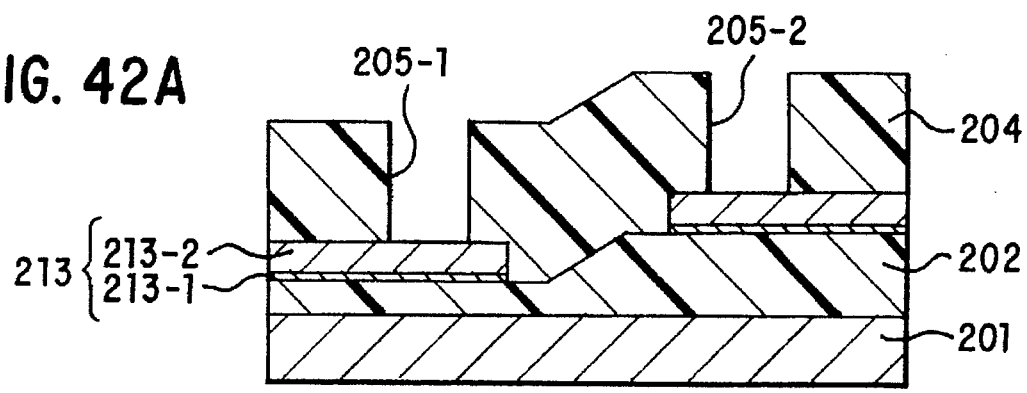
FIGS. 42A to 42D are cross sectional views showing another embodiment of the method according to the invention for manufacturing the structure of FIG. 4.
Figure 42B:
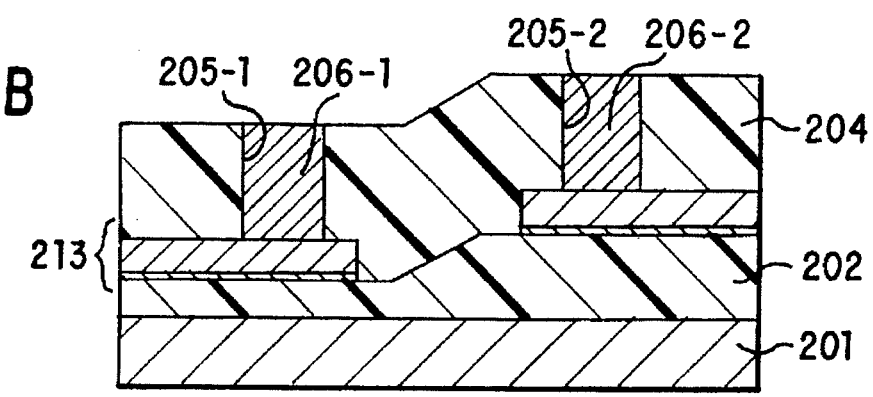

FIGS. 42A to 42D are cross sections showing successive steps of another embodiment of the method according to the invention for manufacturing the semiconductor device having the structure illustrated in FIG. 4. In the present embodiment, after depositing the interlayer insulating film 204, there are formed via holes 205-1 and 205-2 as shown in FIG. 42A. In the present embodiment, the interlayer insulating film 204 has a substantially uniform thickness over the whole surface, so that a depth of the via holes 205-1 and 205-2 are also uniform. Then, the aluminum plugs 206-1 and 206-2 are selectively formed within the via holes 205-1 and 205-2 by the selective Al-CVD as illustrated in FIG. 42B. Since the depths of the via holes 205-1 and 205-2 are substantially identical with each other, the via holes can be sufficiently embedded with the plugs 206-1 and 206-2.

Figure 42C:
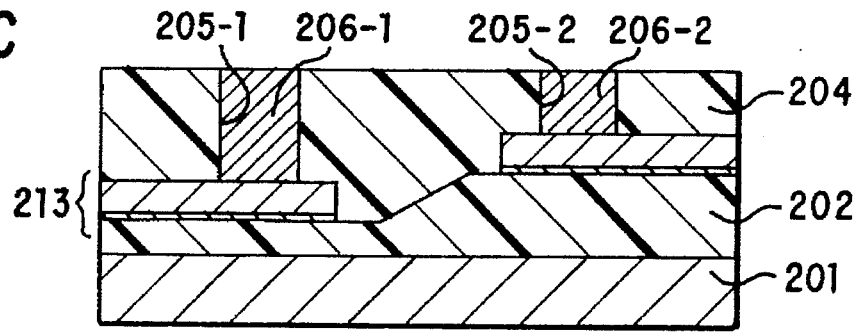

Next, the surface of the interlayer insulating film 204 as well as a part of the plug 206-2 are removed by the chemical mechanical polishing to obtain a flat surface as depicted in FIG. 42C. This chemical mechanical polishing may be performed by using a slurry containing acetic acid, and thus the surface of the interlayer insulating film 204 can be sufficiently made flat and at the same time all the via holes 205-1 and 205-2 can be sufficiently embedded with the aluminum plugs 206-1 and 206-2. In a modified embodiment, after applying a resist over the whole surface, the etching back is carried out by the reactive ion etching using a fluorine containing gas to remove protrusions of the interlayer insulating film 204, while the plug 206-2 protrudes from the surface of the interlayer insulating film similar to the configuration shown in FIG. 41B, and then the top protruding portion of the plug 206-2 is removed by the chemical mechanical polishing.

Figure 42D:
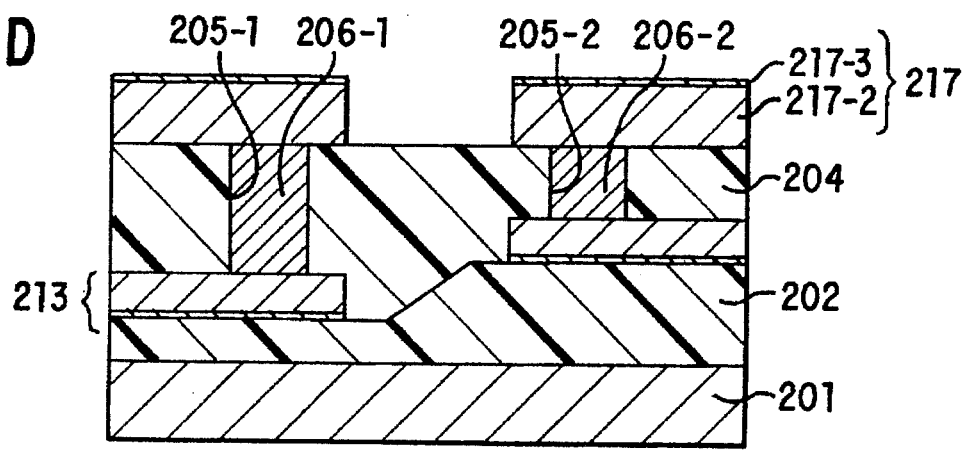

Finally, aluminum alloy film 217-2 and TiN film 217-3 are successively deposited, and then these films are etched into a desired pattern to form the upper metal wiring 217 as shown in FIG. 42D. In this manner, in the present embodiment, the via holes having various depths can be sufficiently embedded with the plugs, while the surface of the interlayer insulating film 204 can be made sufficiently flat. Further, as compared with the embodiment depicted in FIG. 41, during the formation of the via holes, the interlayer insulating film has a substantially uniform thickness, and therefore the over etching of the reactive ion etching for forming the via holes can be reduced and the contamination of lower metal wiring 213 exposed in the bottoms of the via holes.

Figure 43A:
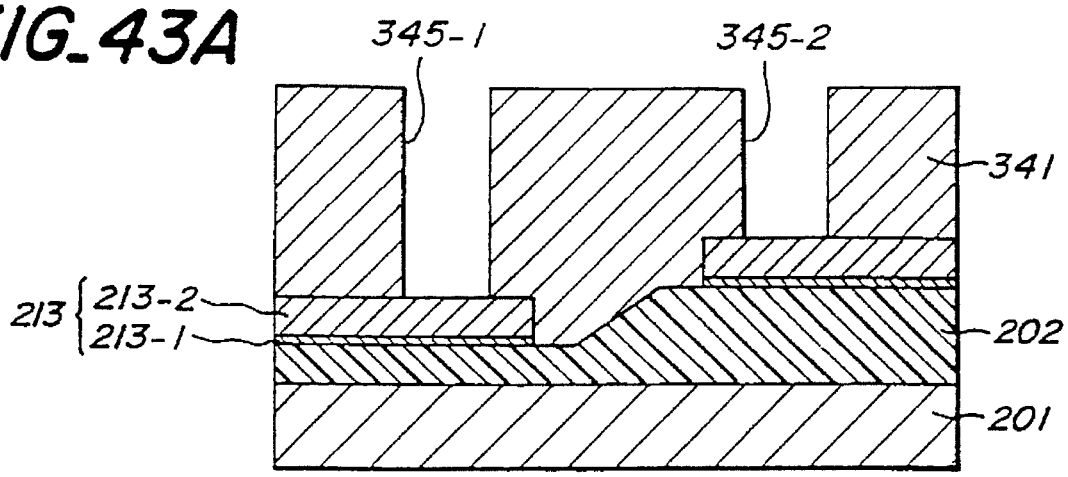
Figure 43B:
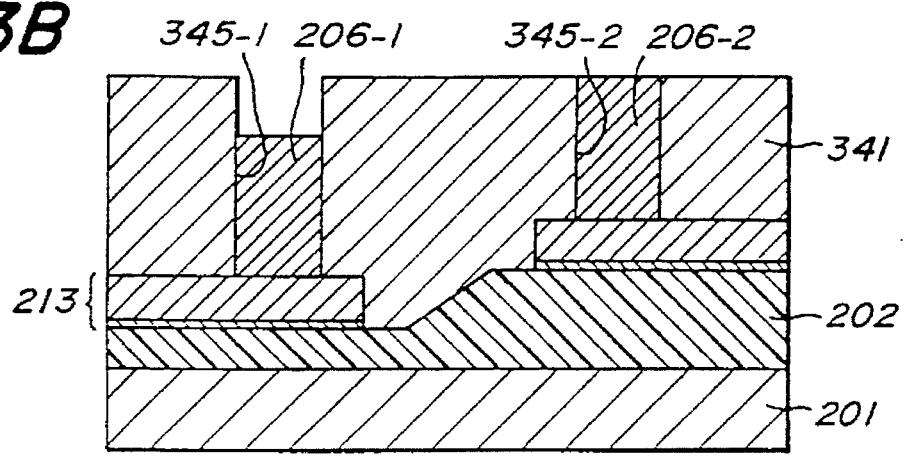

FIGS. 43A to 43E are cross sectional views representing successive steps of still another embodiment of the method according to the invention for manufacturing the semiconductor device shown in FIG. 4. At first, the lower metal wiring 213 is formed by the steps shown in FIG. 5 and then the resist 341 is applied on the surface and holes 345-1 and 345-2 are formed in the resist as shown in FIG. 43A by similar processes to those shown in FIGS. 12B and 12C. Then, aluminum plugs 206-1 and 206-2 are formed within the holes 345-1 and 345-2 by the selective Al-CVD method as illustrated in FIG. 43B such that the shallow hole 345-2 is sufficiently embedded with the plug 206-2.

Figure 43C:
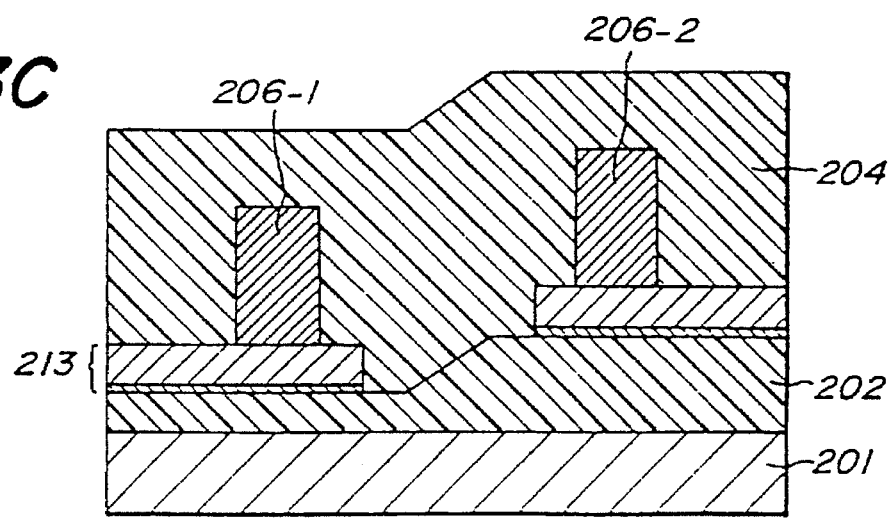

Then, the resist 341 is removed and the interlayer insulating film 204 is deposited such that the plugs 206-1 and 206-2 are fully or sufficiently covered with the interlayer insulating film as shown in FIG. 43C. The interlayer insulating film 204 is formed as follows. At first, a SiO$_2$ film having a thickness of 100 nm is deposited by the plasma CVD using TEOS and oxygen gas and then a SiO$_2$ film having a thickness of 900 nm is formed by the atmospheric pressure CVD using TEOS and ozone gas. It should be noted that at this time the flattening of the interlayer insulating film is not performed.

Next, the protrusions of the interlayer insulating film 204 are removed by the chemical mechanical polishing. During this process, a top portion of the plug 206-2 is also removed and the top surface of the interlayer insulating film 204 becomes flat as shown in FIG. 43D.

Finally, the upper metal wiring 217 is formed as illustrated in FIG. 43E by the same process as that of the previous embodiment depicted in FIG. 42. In this manner, the multilevel interconnect structure shown in FIG. 4 can be obtained.

In the present embodiment, like as the embodiment illustrated in FIG. 42, the surface of the interlayer insulating film 204 can be planarized and the via holes 205-1 and 205-2 can be sufficiently embedded with the aluminum plugs 206-1 and 206-2. Furthermore, similar to the embodiment of FIG. 12, it is possible to form the interlayer insulating film 204 by a very simple process and the via holes 205-1 and 205-2 can be formed simply without using the reactive ion etching.

FIGS. 44A to 44E are cross sectional views showing successive steps of an embodiment of the method of manufacturing the multilevel interconnect structure shown in FIG. 32. This method is quite similar to that shown in FIGS. 33A to 33F. However, in the present embodiment, a TiN film 213-3 of a lower metal wiring 213 exposed in the bottom of a via hole 205 is not removed as illustrated in FIG. 44A. Then, after performing a surface cleaning process, an aluminum plug 206 is formed in the via hole 205 by the selective Al-CVD using DMAH such that an upper portion of the aluminum plug protrudes from the via hole as illustrated in FIG. 44B.

Next, a TiN film 217-1 having a thickness of 30 to 200 nm is deposited as shown in FIG. 44C by the sputtering. Then, the chemical mechanical polishing is performed to remove the protruding portion of the aluminum plug 206 and the TiN film 217-1 deposited on the protruding portion of the plug as depicted in FIG. 44D to expose the upper end surface of the aluminum plug. Then, an aluminum alloy film 217-2 having a thickness of 400 to 1000 nm is deposited by the sputtering and the TiN film 217-3 having a thickness of 20 to 100 nm is deposited by the reactive sputtering. Finally the TiN film 217-1, aluminum alloy film 217-2 and TiN film 217-3 are selectively etched in accordance with a desired pattern to form the upper metal wiring 217 as shown in FIG. 44E.

In the present embodiment, during the formation of the via hole 205 by the reactive ion etching process, the surface of the aluminum alloy film 213-2 is not exposed to charged particles and thus the inner wall of the via hole can be free from stain. Therefore, the cleaning process prior to the selective CVD of aluminum for forming the plug 206 can be performed simply as compared with the embodiment shown in FIG. 33. In practice, in order to carry out the selective Al-CVD, after the cleaning process using the chlorine containing gas, the silicon wafer is placed in the CVD chamber without being exposed to the atmosphere by using the apparatus shown in FIG. 6. However, a range of conditions of the cleaning for attaining acceptable results have been confirmed to be wider than that of the embodiment of FIG. 33 in which the aluminum alloy film 213-2 is exposed in the bottom of the via hole 205. Moreover, in the present embodiment, the aluminum alloy film 213-2 is not subjected to a resist removing agent and pure water during the removal of the resist. This is particularly important when the aluminum alloy film 213-2 contains Cu, because such an aluminum alloy is liable to be corroded by the resist removing agent and pure water.

It should be noted that the multilevel interconnect structure shown in FIG. 32 may be formed by methods which are similar to those illustrated in FIGS. 35, 36 and 37.

As explained above in detail, according to the present invention, at least one of the lower and upper metal wirings comprises at least one aluminum or aluminum alloy film and at least one high melting point metal or high melting point metal alloy film, so that the stressmigration reliability can be improved to a large extent.

Further, the via hole is filled with the aluminum or aluminum alloy plug and at least one of the lower and upper ends of the plug is brought into contact with the aluminum or aluminum alloy film, and thus a possibility that the plug and the lower and upper metal wirings are connected with each other by means of an undesired interface between different kinds of metals can be decreased. Therefore, the via resistance can be decreased and the operating speed is increased and hillock and void are hardly produced near the via hole due to the electromigration. In this manner, the reliability of the semiconductor device having the multilevel interconnect structure according to the invention can be improved.

Moreover, in the method according to the invention, the via holes can be sufficiently filled with the plug and the surface of the interlayer insulating film can be highly planarized. Furthermore, when the cleaning step, plug forming step and metal film forming step are carried out successively without subjecting the wafer to the atmosphere, the connection between the plug and the lower and upper metal wirings can be improved.

What is claimed is:

1. A multilevel interconnect structure formed on a surface of a substrate of a semiconductor device comprising:

a lower metal wiring including one of an aluminum and an aluminum alloy film;

an upper metal wiring including one of an aluminum and an aluminum alloy film;

an interlayer insulating film formed between said lower and upper metal wirings such that the lower and upper metal wirings are electrically isolated from each other by said interlayer insulating film;

a via hole formed in said interlayer insulating film such that the lower and upper metal wirings are communicated with each other by said via hole; and a plug made of one of aluminum and an aluminum alloy and formed in said via hole such that upper and lower ends of the plug contact the upper and lower metal wirings, respectively; wherein at least one of said lower and upper metal wirings further comprises one of a high melting point metal and a high melting point metal alloy film; and said plug contacts said at least one of the lower and upper metal wirings which comprises one of the high melting point metal and the high melting point metal alloy film by means of an interface including one of aluminum-aluminum, aluminum-aluminum alloy, and aluminum alloy-aluminum alloy.

2. A structure according to claim 1, wherein said upper and lower ends of the plug contact the lower and upper metal wirings, respectively, by means of the interface including one of aluminum-aluminum, aluminum-aluminum alloy, and aluminum alloy-aluminum alloy.

3. A structure according to claim 2, wherein said lower metal wiring comprises one of the high melting point metal and the high melting metal alloy film.

4. A structure according to claim 3, wherein said lower metal wiring comprises one of the high melting point metal and the high melting point metal alloy film formed adjacent to the interlayer insulating film; and said lower end of the plug directly contacts one of the aluminum and the aluminum alloy film of the lower metal wiring.

5. A structure according to claim 1, wherein one of said high melting point metal and high melting point metal alloy film is formed adjacent to the interlayer insulating film.

6. A structure according to claim 5, wherein said lower metal wiring comprises one of the high melting point metal and the high melting point metal alloy film; and said lower end of the plug directly contacts one of the aluminum and the aluminum alloy film of the lower metal wiring.

7. A structure according to claim 5, wherein said upper metal wiring comprises one of the high melting point metal and the high melting point metal alloy film formed adjacent to the interlayer insulating film; and said upper end of the plug directly contacts one of the aluminum and the aluminum alloy film of the upper metal wiring.

8. A structure according to claim 5, wherein said plug contacts both of the lower and upper metal wirings by means of the interface one of aluminum-aluminum, aluminum-aluminum alloy, and aluminum alloy-aluminum alloy.

9. A structure according to claim 8, wherein said lower metal wiring comprises one of the high melting point metal and the high melting point metal alloy film formed adjacent to the interlayer insulating film;

said lower end of the plug directly contacts one of the aluminum and the aluminum alloy film of the lower metal wiring;

said upper metal wiring comprises one of the high melting point metal and the high melting point metal alloy film formed adjacent to the interlayer insulating film; and said upper end of the plug directly contacts one of the aluminum and the aluminum alloy film of the lower metal wiring.

10. A structure according to claim 1, wherein an inner wall of the via hole is covered with one of a high melting point metal and a high melting point metal alloy film.

11. A structure according to claim 1, further comprising an intralayer insulating film formed on the interlayer insulating film, wherein said intralayer insulating film has formed therein a recess and said upper metal wiring is provided in the recess.

12. A structure according to claim 1, wherein said upper metal wiring comprises one of the high melting point metal and the high melting point metal alloy film formed adjacent to the interlayer insulating film, and the upper end of the plug indirectly contacts one of the aluminum and the aluminum alloy film of the upper metal wiring; and said lower metal wiring comprises one of the high melting point metal and the high melting point metal alloy film, and the lower end of the plug directly contacts one of the aluminum and the aluminum alloy film of the lower metal wiring.

13. A structure according to claim 1, wherein said upper metal wiring comprises one of the high melting point metal and the high melting point metal alloy film formed adjacent to the interlayer insulating film;

said lower end of the plug directly contacts one of the aluminum and the aluminum alloy film of the lower metal wiring; and said plug directly contact the interlayer insulating film at an inner will of the via hole.

14. A structure according to claim 13, wherein a diameter of the vial hole is not larger than about 0.5 μm.

15. A structure according to claim 14, wherein the inner wall of the via hole is formed substantially at a right angle with respect to the surface of the substrate.

16. A structure according to claim 1, wherein said upper metal wiring comprises one of the high melting point metal and the high melting point metal alloy film formed adjacent to the interlayer insulating film;

said upper metal wiring comprises at least two adjacent lines;

said interlayer insulating film comprises at least one silicon dioxide film, and the via hole is formed exclusively through said at least one silicon dioxide film; and said structure further comprising an intralayer insulating film formed between said at least two adjacent lines of the upper metal wiring, said intralayer insulating film comprising a low dielectric constant insulating film having a dielectric constant smaller than that of a silicon dioxide film.

17. A structure according to claim 16, wherein said upper end of the plug directly contacts one of the aluminum and the aluminum alloy film of the upper metal wiring.

18. A structure according to claim 16, wherein a portion of an upper surface of the upper metal wiring above the via hole is substantially flat.

19. A structure according to claim 16, wherein said intralayer insulating film has formed therein a recess and said upper metal wiring is provided in the recess.

20. A structure according to claim 16, wherein side walls of the adjacent lines of the upper metal wiring directly contact the low dielectric constant insulating film of the intralayer insulating film.

21. A structure according to claim 20, wherein a portion of an upper surface of the upper metal wiring above the via hole is substantially flat.

22. A structure according to claim 20, wherein said intralayer insulating film has formed therein a recess and said upper metal wiring is provided in the recess.

23. A structure according to claim 20, wherein said low dielectric constant insulating film is a polyimide film.

24. A structure according to claim 23, wherein a portion of an upper surface of the upper metal wiring above the via hole is substantially flat.

25. A structure according to claim 2, wherein said plug directly contacts the interlayer insulating film at an inner wall of the via hole.

26. A structure according to claim 25, wherein a diameter of the via hole is not larger than about 0.5 μm.

27. A structure according to claim 26, wherein the inner wall of the via hole is formed substantially at a right angle with respect to the surface of the substrate.

28. A structure according to claim 2, wherein an inner wall of the via hole is covered with one of a high melting point metal and the high melting point metal alloy film.

29. A structure according to claim 28, wherein said interlayer insulating film comprises a low dielectric constant insulating film having a dielectric constant lower than that of a silicon dioxide film; and said via hole is formed through said low dielectric constant insulating film, and said one of high melting point metal and high melting point metal alloy film on the inner wall of the via hole directly contacts the low dielectric constant insulating film.

30. A structure according to claim 29, wherein a portion of an upper surface of the upper metal wiring above the via hole is substantially flat.

31. A structure according to claim 2, wherein said interlayer insulating film has formed therein a recess and said upper metal wiring is provided in the recess.

32. A structure according to claim 31, wherein said upper metal wiring comprises one of the high melting point metal and the high melting point metal alloy film on side walls of one of the aluminum and the aluminum alloy film of the upper metal wiring.

33. A structure according to claim 3, wherein said interlayer insulating film has formed therein a recess and said upper metal wiring is provided in the recess.

34. A structure according to claim 33, wherein said upper metal wiring comprises one of the high melting point metal and the high melting point metal alloy film on side walls of one of the aluminum and the aluminum alloy film of the upper metal wiring.

35. A structure according to claim 4, wherein said plug directly contacts the interlayer insulating film at an inner wall of the via hole.

36. A structure according to claim 35, wherein a diameter of the via hole is not larger than about 0.5 μm.

37. A structure according to claim 36, wherein the inner wall of the via hole is formed substantially at a right angle with respect to the surface of the substrate.

38. A structure according to claim 4, wherein said lower metal wiring further comprises one of a high melting pint metal and a high melting point metal alloy film formed on side walls of one of the aluminum and the aluminum alloy film of the lower metal wiring.

39. A structure according to claim 38, wherein an inner wall of the via hole is covered with one of a high melting point metal and a high melting point metal alloy film.

40. A structure according to claim 39, wherein said one of high melting point metal and high melting point metal alloy film of the lower metal wiring formed adjacent to the interlayer insulating film, said one of high melting point metal and high melting point metal alloy film formed on the side walls of one of the aluminum and the aluminum alloy film of the lower metal wiring, and said one of high melting point metal and high melting point metal alloy film on the inner wall of the via hole constitute a single film.

41. A structure according to claim 4, wherein an inner wall of the via hole is covered with one of a high melting point metal and a high melting point metal alloy film.

42. A structure according to claim 41, wherein a portion of an upper surface of the upper metal wiring above the via hole is substantially flat.

43. A structure according to claim 41, wherein said interlayer insulating film comprises a low dielectric constant insulating film having a dielectric constant lower than that of a silicon dioxide film; and said via hole is formed through said low dielectric constant insulating film, and said one of high melting point metal and high melting point metal alloy film on the inner wall of the via hole directly contacts the low dielectric constant insulating film.

44. A structure according to claim 43, wherein a portion of an upper surface of the upper metal wiring above the via hole is substantially flat.

45. A structure according to claim 6, wherein
said interlayer insulating film comprises a low dielectric constant insulating film having a dielectric constant lower than that of a silicon dioxide film; and
said via hole is formed through said low dielectric constant insulating film.

46. A structure according to claim 45, wherein a portion of an upper surface of the upper metal wiring above the via hole is substantially flat.

47. A structure according to claim 45, wherein said plug directly contacts the low dielectric constant insulating film at an inner wall of the via hole.

48. A structure according to claim 6, wherein
said upper metal wiring comprises one of the high melting point metal and the high melting point metal alloy film formed adjacent to the interlayer insulating film; and
said upper end of the plug contacts the upper metal wiring partly by means of the interface of one of aluminum-aluminum, aluminum-aluminum alloy, and aluminum alloy-aluminum alloy.

49. A structure according to claim 48, wherein said plug directly contacts the interlayer insulating film at an inner wall of the via hole.

50. A structure according to claim 6, wherein
said upper metal wiring comprises one of the high melting point metal and the high melting point metal alloy film formed adjacent to the interlayer insulating film; and
said upper end of the plug indirectly contacts one of the aluminum and the aluminum alloy film of the upper metal wiring.

51. A structure according to claim 50, wherein said plug directly contacts the interlayer insulating film at an inner wall of the via hole.

52. A structure according to claim 7, wherein
said lower metal wiring comprises one of the high melting point metal and the high melting point metal alloy film formed adjacent to the interlayer insulating film; and
said lower end of the plug indirectly contacts one of aluminum and the aluminum alloy film of the lower metal wiring.

53. A structure according to claim 52, wherein said plug directly contacts the interlayer insulating film at an inner wall of the via hole.

54. A structure according to claim 7, wherein said upper end of the plug contacts the upper metal wiring partly by means of the interface of one of aluminum-aluminum, aluminum-aluminum alloy, and aluminum alloy-aluminum-alloy.

55. A structure according to claim 54, wherein said plug directly contacts the interlayer insulating film at an inner wall of the via hole.

56. A structure according to claim 7, wherein said plug directly contacts the interlayer insulating film at an inner wall of the via hole.

57. A structure according to claim 56, wherein a diameter of the via hole is not larger than about 0.5 μm.

58. A structure according to claim 57, wherein the inner wall of the via hole is formed substantially at a right angle with respect to the surface of the substrate.

59. A structure according to claim 7, wherein an inner wall of the via hole is covered with a plasma chemical vapor deposited silicon dioxide film.

60. A structure according to claim 59, wherein a portion of the upper metal wiring above the via hole is substantially flat.

61. A structure according to claim 60, wherein said inner wall of the via hole is formed substantially at a right angle with respect to the surface of the substrate.

62. A structure according to claim 8, wherein
said upper metal wiring comprises one of the high melting point metal and the high melting point metal alloy film formed adjacent to the interlayer insulating film; and
said upper end of the plug contacts the upper metal wiring partly by means of the interface of one of aluminum-aluminum, aluminum-aluminum alloy, and aluminum alloy-aluminum alloy.

63. A structure according to claim 62, wherein said plug directly contacts the interlayer insulating film at an inner wall of the via hole.

64. A structure according to claim 9, wherein said lower end of the plug contacts the lower metal wiring exclusively by means of the interface of one of aluminum-aluminum, aluminum-aluminum alloy, and aluminum alloy-aluminum alloy.

65. A structure according to claim 64, wherein a diameter of the via hole is not larger than about 0.5 μm.

66. A structure according to claim 65, wherein the inner wall of the via hole is formed substantially at a right angle with respect to the surface of the substrate.

67. A structure according to claim 64, wherein said upper end of the plug contacts the upper metal wiring partly by means of the interface of one of aluminum-aluminum, aluminum-aluminum alloy, and aluminum alloy-aluminum alloy.

68. A structure according to claim 67, wherein said plug directly contacts the interlayer insulating film at an inner wall of the via hole.

69. A structure according to claim 9, wherein said plug directly contacts the interlayer insulating film at an inner wall of the via hole.

70. A structure according to claim 69, wherein a diameter of the via hole is not larger than about 0.5 μm.

71. A structure according to claim 70, wherein the inner wall of the via hole is formed substantially at a right angle with respect to the surface of the substrate.

72. A structure according to claim 10, wherein said interlayer insulating film comprises a low dielectric constant insulating film having a dielectric constant lower than that of a silicon dioxide film, and said via hole is formed through said low dielectric constant insulating film.

73. A structure according to claim 72, wherein a portion of an upper surface of the upper metal wiring above the via hole is substantially flat.

74. A structure according to claim 72, wherein said one of high melting point metal and high melting point metal alloy film on the inner wall of the via hole directly contacts the low dielectric constant insulating film.

75. A structure according to claim 74, wherein a portion of an upper surface of the upper metal wiring above the via hole is substantially flat.

76. A structure according to claim 75, wherein the inner wall of the via hole is formed substantially at a right angle with respect to the surface of the substrate.

77. A structure according to claim 74, wherein said low dielectric constant insulating film is a polyimide film.

78. A structure according to claim 77, wherein a portion of an upper surface of the upper metal wiring above the via hole is substantially flat.

79. A structure according to claim 78, wherein the inner wall of the via hole is formed substantially at a right angle with respect to the surface of the substrate.

80. A structure according to claim 77, wherein said lower metal wiring comprises one of the high melting point metal and the high melting point metal alloy film formed adjacent to the interlayer insulating film, and further comprising one of a high-melting point metal and a high melting point metal alloy film formed on side walls of one of the aluminum film and the aluminum alloy film of the lower metal wiring.

81. A structure according to claim 80, wherein said one of high melting point metal and high melting point metal alloy film on the inner wall of the via hole, said one of high melting point metal and high melting point metal alloy film of the lower metal wiring formed adjacent to the interlayer insulating film, and said one of high melting point metal and high melting point metal alloy film formed on side walls of one of the aluminum and the aluminum alloy film of the lower metal wiring directly contact the low dielectric constant insulating film.

82. A structure according to claim 80, wherein said one of high melting point metal and high melting point metal alloy film on the inner wall of the via hole, said one of high melting point metal and high melting point metal alloy film of the lower metal wiring formed adjacent to the interlayer insulating film, and said one of high melting point metal and high melting point metal alloy film formed on side walls of one of the aluminum and the aluminum alloy film of the lower metal wiring constitute a single film.

83. A structure according to claim 80, wherein said lower end of the plug directly contacts one of the aluminum and aluminum alloy film of the lower metal wiring.

84. A structure according to claim 11, wherein said intralayer insulating film is formed as a part of the interlayer insulating film.

85. A structure according to claim 11, wherein said intralayer insulating film is formed as a different film from the interlayer insulating film.

86. A structure according to claim 84, wherein said plug directly contacts the interlayer insulating film at an inner wall of the via hole.

87. A structure according to claim 86, wherein a diameter of the via hole is not larger than about 0.5 µm.

88. A structure according to claim 87, wherein the inner wall of the via hole is formed substantially at a right angle with respect to the surface of the substrate.

89. A structure according to claim 84, wherein said plug directly contacts the interlayer insulating film at an inner wall of the via hole; and said upper metal wiring comprises one of the high melting point metal and the high melting point metal alloy film formed on side walls of one of the aluminum and the aluminum alloy film of the upper metal wiring.

90. A structure according to claim 85, wherein said upper metal wiring comprises one of the high melting point metal and the high melting point metal alloy film formed adjacent to the interlayer insulating film; and said upper end of the plug indirectly contacts one of the aluminum and the aluminum alloy film of the upper metal wiring.

91. A structure according to claim 85, wherein said upper metal wiring comprises one of the high melting point metal and the high melting point metal alloy film formed adjacent to the interlayer insulating film; and said upper end of the plug directly contacts one of the aluminum and the aluminum alloy film of the upper metal wiring.

92. A structure according to claim 91, wherein said upper end of the plug contacts the upper metal wiring partly by means of the interface of one of aluminum-aluminum, aluminum-aluminum alloy, and aluminum alloy-aluminum alloy.

* * * * *